(12) United States Patent
Tsutsumi

(10) Patent No.: US 6,281,051 B1
(45) Date of Patent: Aug. 28, 2001

(54) SEMICONDUCTOR DEVICE AND MANUFACTURING METHOD THEREOF

(75) Inventor: Toshiaki Tsutsumi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/541,629

(22) Filed: Apr. 3, 2000

Related U.S. Application Data

(62) Division of application No. 08/683,537, filed on Jul. 15, 1996, now Pat. No. 6,087,727.

(30) Foreign Application Priority Data

Dec. 1, 1995 (JP) .................................................. 7-314102

(51) Int. Cl.$^7$ .................................................. H01L 21/8232
(52) U.S. Cl. .......................................... 438/142; 438/197
(58) Field of Search ..................................... 438/142, 145, 438/167, 169, 188, 195, 197, 199, 587, 595, 618

(56) References Cited

U.S. PATENT DOCUMENTS

| | | | |
|---|---|---|---|
| 5,291,058 | 3/1994 | Samata et al. | 257/641 |
| 5,596,212 | 1/1997 | Kuriyama | 257/298 |
| 5,844,274 * | 12/1998 | Tsutsumi | 257/333 |

FOREIGN PATENT DOCUMENTS

| | | |
|---|---|---|
| 1-106469 | 4/1989 | (JP) . |
| 2-14532 | 1/1990 | (JP) . |
| 03-225953 | 10/1991 | (JP) . |
| 4-162774 | 6/1992 | (JP) . |
| 5-235304 | 9/1993 | (JP) . |
| 6-077435 | 3/1994 | (JP) . |
| 6-196496 | 7/1994 | (JP) . |
| 7-60899 | 6/1995 | (JP) . |

* cited by examiner

*Primary Examiner*—David Nelms
*Assistant Examiner*—Quoc Hoang
(74) *Attorney, Agent, or Firm*—McDermott, Will & Emery

(57) ABSTRACT

An object is to provide a structure of a semiconductor device which allows higher degree of integration both in vertical and horizontal directions, and to provide manufacturing method therefor. The semiconductor device includes source-drain electrodes connected to $n^-$ and $n^+$ source-drain regions of an MISFET and has a function as a part of a bit line, and a gate electrode connected to a first interconnection as a word line. Electrodes are insulated from each other by a sidewall insulating film, silicon oxide film or a silicon nitride film provided inbetween. Since the word line and the bit line do not cross in the same plane, the difference in level in the vertical direction can be reduced.

8 Claims, 50 Drawing Sheets

US 6,281,051 B1

SEMICONDUCTOR DEVICE AND MANUFACTURING METHOD THEREOF

This application is a Divisional of U.S. application Ser. No. 08/683,537 filed Jul. 15, 1996 now U.S. Pat. No. 6,087,727.

BACKGROUND OF THE INVENTION

1. Field of the Invention

The present invention relates to a semiconductor device and manufacturing method thereof. More specifically, the present invention relates to a structure of electrodes and interconnections connected to a metal insulator semiconductor field effect transistor (hereinafter referred to as MISFET) and to manufacturing method thereof.

2. Description of the Background Art

As the degree of integration of ULSIs has become higher and higher, reduction in size both in the vertical and horizontal directions of the device has been desired. In the horizontal direction, sufficient margin must be ensured taking into account an error in accuracy in alignment during lithography in various manufacturing steps. In the vertical direction, level difference should be minimized so as to enable precise patterning for lithography.

An MISFET used in a DRAM (Dynamic Random Access Memory) as an example of a conventional semiconductor device will be described with reference to the figures.

Referring to FIGS. 89 and 90, the MISFET includes a gate electrode 105 formed on a semiconductor substrate 101 with a gate insulating film 104 interposed. There are impurity diffusion regions in semiconductor substrate 101 on both sides of the gate electrode, which provide source-drain regions 103 of the MISFET. Such MISFETs are electrically separated from each other by en element isolating insulating film 102 and a channel stop layer 111. Gate electrode 105 is formed of a conductive film such as a polycrystalline silicon film or a metal silicide film, and it constitutes a part of a word line 105. There is a bit line 108 crossing word line 105. Bit line 108 is electrically isolated from word line 105 by an interlayer insulating film 107 so as to prevent short circuit therebetween. Bit line 108 is electrically connected to one of source/drain regions 103 of the MISFET through a contact hole. The contact hole for the bit line 108 is formed for each memory cell which is constituted by one or two MISFETs. In a DRAM, a capacitor (not shown) storing charges as information is connected to the other one of source-drain regions 103 of the MISFET.

FIG. 91 is a plan view showing an example of positional relation between each of source-drain regions 103, bit line 108 and word line 105. FIGS. 89 and 90 are cross sections taken along the lines A—A and B—B of FIG. 91, respectively. Referring to FIG. 91, the conventional semiconductor device has such a structure in that word line 105 is formed and bit line 108 is formed further thereon. Therefore, there is much level difference in the vertical direction because of a step at the crossing portion, for example. Meanwhile, the contact hole must be formed such that it does not contact word line 105 and that it is surely connected to one of the source-drain regions 103. Further, short circuit between the contact hole and a channel stop layer 111 through element isolating insulating film 102 shown in FIG. 90 must be prevented. Therefore, in arranging the contact hole, accuracy in alignment in the horizontal direction at the time of lithography of the contact hole must be taken into account. For example, the distance between an end of the contact hole and an end of the source-drain region and the distance from an end of the contact hole to an end of the word line must be made wider actually by about 0.3 μm than the distance in design.

Another example of a conventional semiconductor device will be described with reference to the figures. FIG. 92 is a cross section taken along the line B—B of FIG. 93. In FIG. 92, part of the gate electrode 105 rests on element isolating insulating film 102. There is a word line 109 connected to this portion resting on the element insulating isolating film through a conductive layer filled in contact hole 110. Word line 109 is formed to extend in a direction crossing gate electrode 105. Word line 109 and gate electrode 105 are isolated by an interlayer insulating film 107. Referring to FIG. 93, impurity diffusion layer forming source-drain regions 103 constitutes a bit line. In this structure, in order to connect word line 109 and gate electrode 105, it is necessary to extend a portion of gate electrode 105 in the horizontal direction, which prevents improvement in the degree of integration in the horizontal direction. Further, an interlayer insulating film through which the contact hole is formed is necessary, which results in large level difference in the vertical direction.

Japanese Patent Laying-Open No. 1-106469 discloses, as a structure for relaxing level difference between electrodes and interconnections connected to the MISFET, an example in which various electrodes are embedded in an insulating film, and a part of each of the electrode is exposed at a plane approximately flush with the surface of the insulating film. This example will be described with reference to FIGS. 94 and 95. FIG. 94 is a cross section taken along the line A—A of FIG. 95. As shown in FIG. 94 or 95, the semiconductor device includes an MOS transistor having contact electrodes 141 connected to a pair of source-drain regions 137 and a gate electrode 139 formed on a region (channel region) between the source-drain regions, with a gate insulating film 135 interposed. The MOS transistor is electrically isolated from other MOS transistors by an element isolating insulating film 133. Two contact electrodes 141 and gate electrode 139 of the transistor are electrically isolated from each other by an insulating film 143. Here, insulating film 143 and electrodes 141 and 139 are formed such that the surface of the insulating film 143 is approximately flush with the top surfaces of the electrodes. Therefore, interconnections connected to respective electrodes are approximately at the same level, thus difference in level can be reduced. However, interconnection 145 connected to gate electrode 139 cannot be formed but along the gate electrode 139 because of restriction in the method of forming. Therefore, in the MOS transistor constituting a memory cell of a memory device, for example, it is necessary that interconnection 145 connected to the contact electrode crosses interconnection 145 connected to gate electrode 139, and at that time, the interconnections must cross each other with a difference in level to prevent short-circuit. Further, it may be sometimes necessary to detour the interconnection 145 in order to prevent short-circuit. Therefore, there is inevitably a difference in level between the interconnections, which may result in difficulty in processing or lithography in the succeeding steps, or enlargement of the region for forming interconnections in the horizontal direction.

As described above, in the conventional semiconductor device, in order to connect a gate electrode and a word line of an MISFET as an example of a semiconductor device, it is necessary to extend part of the gate electrode in the horizontal direction. This hinders improvement in the degree of integration in the horizontal direction of the device. Further, there is generated a difference in level when interconnections to be connected to the electrodes of the MISFET cross each other, or there is a necessity that interconnections are detoured, resulting in difficulty in processing or photolithography in the succeeding steps and region for forming the interconnection layers in the horizontal direction tends to be widened.

SUMMARY OF THE INVENTION

The present invention was made in view of the foregoing, and its object is to provide a structure of a semiconductor device which relieves difference in level in the vertical direction by eliminating level difference between interconnections connected to the semiconductor device and which facilitates increase in the degree of integration by minimizing the region for forming interconnections in the horizontal direction.

Another object of the present invention is to provide a method of manufacturing such a semiconductor device.

According to one aspect of the present invention, the semiconductor device includes a semiconductor substrate, first to third electrodes formed on the semiconductor substrate, first and second interconnection layers connected to at least two of the first to third electrodes, and an insulating film provided between and insulating the first to third electrodes from each other. Further, of the first and second interconnection layers, one crosses the other near the first to third electrodes. Of the first to third electrodes, one has its upper surface positioned differently from the positions of the upper surfaces of the remaining electrodes.

In this structure, interconnections connected to various electrodes belong to different layers, and insulating film is formed therebetween. Therefore, even when interconnections cross each other, there is not a step or difference in level at the crossing portion, and hence level difference in the vertical direction can be reduced, which enables fine processing. Accordingly, improvement in the degree of integration of the semiconductor is facilitated.

Preferably, the semiconductor device of the present invention may include a gate insulating film between the first electrode and the semiconductor substrate, and an impurity diffusion layers of a prescribed conductivity type in the semiconductor substrate near and below the second and third electrodes.

In that case, a current flow can be generated by a prescribed voltage applied to the first electrode, between the second and third electrodes connected to the impurity diffusion layers of the prescribed conductivity type. Therefore, a semiconductor device having electrodes connected to an MISFET can be obtained.

Preferably, the second and third electrodes may be the impurity diffusion layers themselves of the prescribed conductivity type. In that case, electrodes to be connected to the impurity diffusion layers need not be formed, and hence the number of manufacturing steps can be reduced.

Preferably, in the structure of the present invention, the position of the upper surface of the first electrode is higher than the upper surfaces of the second and third electrodes, the upper surfaces of the second and third electrodes are approximately flush with each other, and the surface of the insulating film is approximately flush with the upper surface of the first electrode. Alternatively, the position of the upper surface of the first electrode may be lower than the positions of the upper surfaces of the second and third electrodes, the upper surfaces of the second and third electrodes may be approximately flush with each other and the surface of the insulating film may be approximately flush with the upper surfaces of the second and third electrodes. Alternately, the position of the upper surface of the first electrode may be higher than the upper surface of the second electrode and lower than the upper surface of the third electrode, and the surface of the insulating film may be approximately flush with the upper surface of the third electrode.

In these structures, the interconnection layer connected to the first electrode and the interconnection layer connected to the second or third electrode are positioned at different layers, with an insulating film in between. Therefore, there is not a step or level difference generated at the crossing between the second interconnection extending in one direction and the first interconnection layer formed crossing therewith, and level difference in the vertical direction can be reduced. Accordingly, fine processing becomes possible and improvement in the degree of integration of the semiconductor device can be facilitated.

The first and second interconnection layers may constitute a word line or a bit line.

According to another aspect, the method of manufacturing a semiconductor device includes the steps of: forming a first insulating film on a semiconductor substrate; forming a first opening in the first insulating film to expose the surface of the semiconductor substrate; forming first to third electrodes in the first opening, insulated from each other by a sidewall insulating film; setting position of an upper surface of any of the first to third electrodes to be different from the positions of the upper surfaces of the remaining electrodes; and forming an interconnection layer connected to the upper surface of any of the first to third electrodes.

According to this method of manufacturing, the interconnection layer connected to the first electrode is formed not to be directly connected to other electrodes, no matter which direction the interconnection extends. Therefore, it is not necessary to provide a step or to detour in order to prevent short-circuit with other electrode. Accordingly, level difference in the vertical direction can be reduced, area occupied by the interconnections in the horizontal direction can be reduced, and a semiconductor device with high degree of integration can easily be formed.

Preferably, the manufacturing method in accordance with the present invention may include the steps of forming a second insulating film below the first electrode, and forming impurity diffusion layers of a prescribed conductivity type in the semiconductor substrate near and below the second and third electrodes.

By such a manufacturing method, a semiconductor device including an MISFET can be formed easily.

Preferably, the method of manufacturing in accordance with the present invention may include the step of making the position of the upper surface of the first electrode higher than the upper surfaces of the second and third electrodes and making approximately flush the upper surfaces of the second and third electrodes.

Alternatively, the manufacturing method may include the step of making the position of the upper surface of the first electrode lower than the upper surfaces of the second and third electrodes and making approximately flush the upper surfaces of the second and third electrodes.

Alternatively, the manufacturing method may include the step of positioning the upper surface of the first electrode between the upper surfaces of the second and third electrodes.

According to the manufacturing method described above, the interconnection layer connected to the first electrode is formed not to be directly connected to the second and third electrodes. Further, even when an interconnection connected to the second or third electrode extending in one direction is formed, the interconnection layer connected to the first electrode never crosses the said interconnection layer in the same plane.

Accordingly, it is not necessary to provide a step or level difference at crossings between interconnections or to detour the interconnection layer to avoid short-circuit with other electrodes.

Therefore, level difference in the vertical direction can be reduced, a region for forming interconnections in the horizontal direction can be reduced, and hence a semiconductor device having high degree of integration can be formed easily.

Preferably, the manufacturing method may include the steps of forming a second insulating film on the semiconductor substrate after the first opening is formed; forming a first conductive film only at the first opening on the second insulating film; etching the first conductive film to form second and third openings to expose the surface of the semiconductor substrate and to form a first electrode; forming a side surface insulating film on the side surface of the first electrode, and forming a second conductive film only at the second and third openings.

According to such a manufacturing method, no matter which direction the interconnection layer connected to the first electrode connected to the MISFET extends, it is formed not to be directly connected to the remaining two, second and third electrodes connected to the impurity diffusion layers of the MISFET.

Therefore, it is not necessary to provide a step or level difference or to detour in order to avoid short-circuit between the interconnection layer and other electrodes.

Therefore, a semiconductor device having high degree of integration including an MISFET can be formed easily.

Preferably, the manufacturing method may include the steps of: after forming the first opening, forming a third insulating film only in the first opening; forming a fourth opening at a prescribed region of the third insulating film to expose the surface of the semiconductor substrate; forming a second insulating film on the exposed surface of the semiconductor substrate; forming a first conductive film only in the fourth opening to form a first electrode; after forming the first electrode, removing the third insulating film left in the first opening and forming second and third openings; forming a side surface insulating film on the side surface of the first electrode; and forming a second conductive film only in the second and third openings to form the second and third electrodes.

According to the manufacturing method, it is not necessary to etch using the gate insulating film as a stopper when the first electrode is formed. Further, there is not a step or level difference generated in the interconnection layer connected to the first electrode. Therefore, a semiconductor device including an MISFET having a thin gate insulating film, in which level difference of interconnections is reduced, can be formed easily.

Preferably, the manufacturing method may include the steps of: after forming the first opening, forming a third insulating film only in the first opening; forming second and third openings to expose the surface of the semiconductor substrate at prescribed regions on the third insulating film; forming a first conductive film only at the second and third openings to form second and third electrodes; after forming the second and third electrodes, removing the third insulating film left in the first opening, and forming a fourth opening; thereafter forming side surface insulating films on the side surfaces of the second and third electrodes; and forming a second conductive film only at the fourth opening to form the first electrode.

According to this manufacturing method, the gate insulating film is formed after the second and third electrodes are formed. Therefore, damage to the gate insulating film caused by etching can be prevented. Further, there is not a step or level difference in the interconnection layer connected to the first electrode. Accordingly, a semiconductor device including an MISFET having highly reliable gate insulating film with difference in level of the interconnections reduced can be formed easily.

The method of manufacturing a semiconductor device in accordance with a still further aspect of the present invention includes the following steps of: forming a first conductive film on a semiconductor substrate; removing the first conductive film except a prescribed region, to form a stacked structure; forming a first insulating film on the semiconductor substrate to fill the periphery of the stacked structure; removing a prescribed region of the stacked structure to form first and second openings and a first electrode; forming second and third electrodes provided with side surface insulating films, at the first and second openings; positioning an upper surface of any of the first to third electrodes at a position different from the positions of the upper surfaces of the remaining electrodes; and forming an interconnection layer connected to the upper surface of any of the first to third electrodes.

According to the manufacturing method, the first to third electrode forming regions are formed first, and thereafter an insulating film surrounding the electrodes is formed. Therefore, when the first and second openings are formed, impurities such as carbon or fluorine do not adhere to the semiconductor substrate below the first electrode during dry etching or the like. Further, there is not a step or level difference in the interconnection layers connected to the electrodes. Therefore, a semiconductor device in which level difference is reduced and which is free from degradation by impurities can be formed easily.

Preferably, the manufacturing method may include the step of forming a second insulating film below the first electrode, and forming impurity diffusion layers of a prescribed conductivity type in the semiconductor substrate near and below the second and third electrodes.

According to such a manufacturing method, a semiconductor device including an MISFET can be formed easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
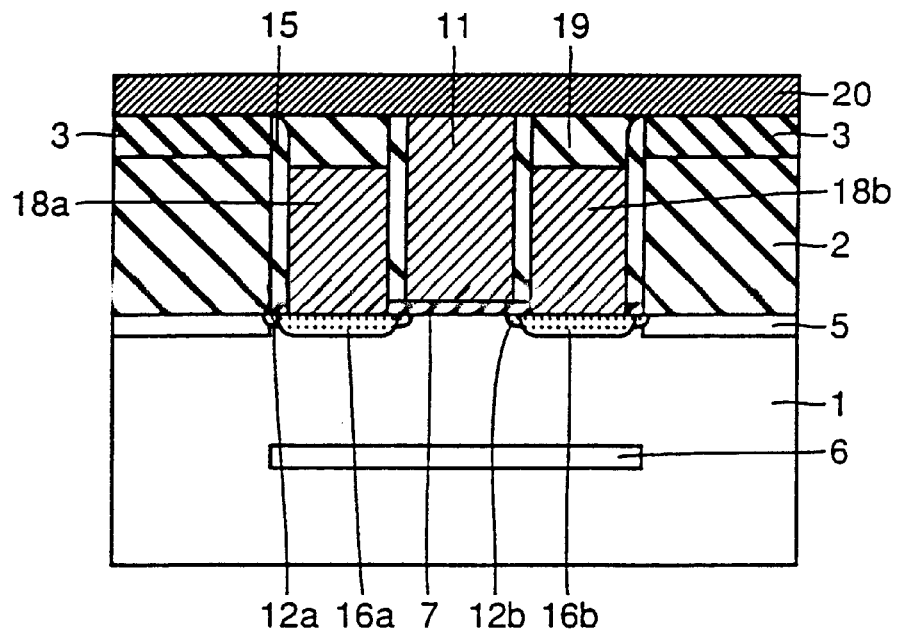
FIG. 1 is a cross section showing a semiconductor device in accordance with a first embodiment of the present invention.
Figure 2:
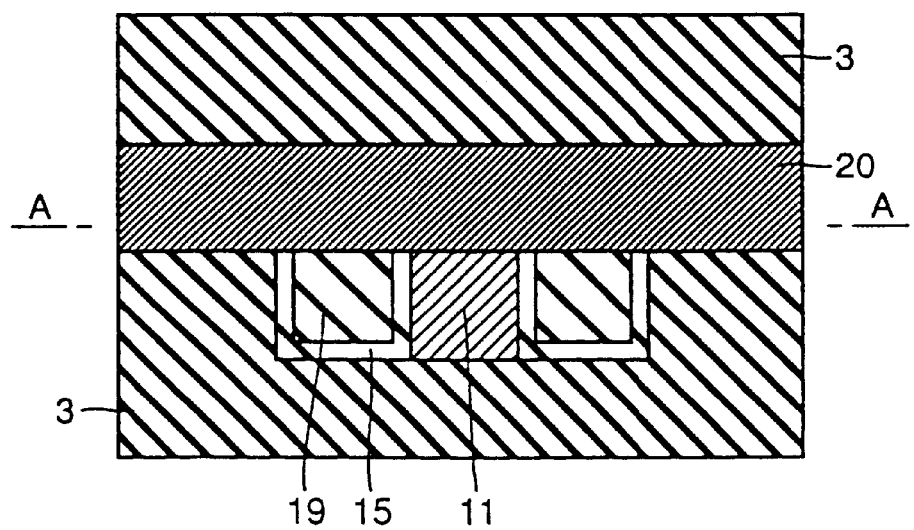
FIG. 2 is a plan view showing the semiconductor device in accordance with the first embodiment of the present invention.

The semiconductor device in accordance with the first embodiment of the present invention will be described with reference to FIGS. 1 and 2. FIG. 1 is a cross section taken along the line A—A of FIG. 2. As shown in FIGS. 1 and 2, the semiconductor device includes source-drain electrodes 18a, 18b connected to a pair of n⁻ source-drain regions 12a, 12b and to n⁺ source-drain regions 16a, 16b, and a gate electrode 11 on a gate insulating film 7, of an MISFET formed on a semiconductor substrate. The upper surface of gate electrode 11 is positioned higher than the upper surfaces of source-drain electrodes 18a, 18b. The electrodes are insulated from each other by sidewall insulating films 15. Further, each electrode is covered by a silicon oxide film 2, a silicon nitride film 3 and silicon oxide film 19 so as to be electrically insulated from other MISFETs (not shown). A first interconnection 20 is connected to the upper surface of gate electrode 11. The first interconnection 20 constitutes a word line of the MISFET. If extended in the direction vertical to the sheet, source-drain electrodes 18a and 18b may serve as a bit line.

Figure 92:
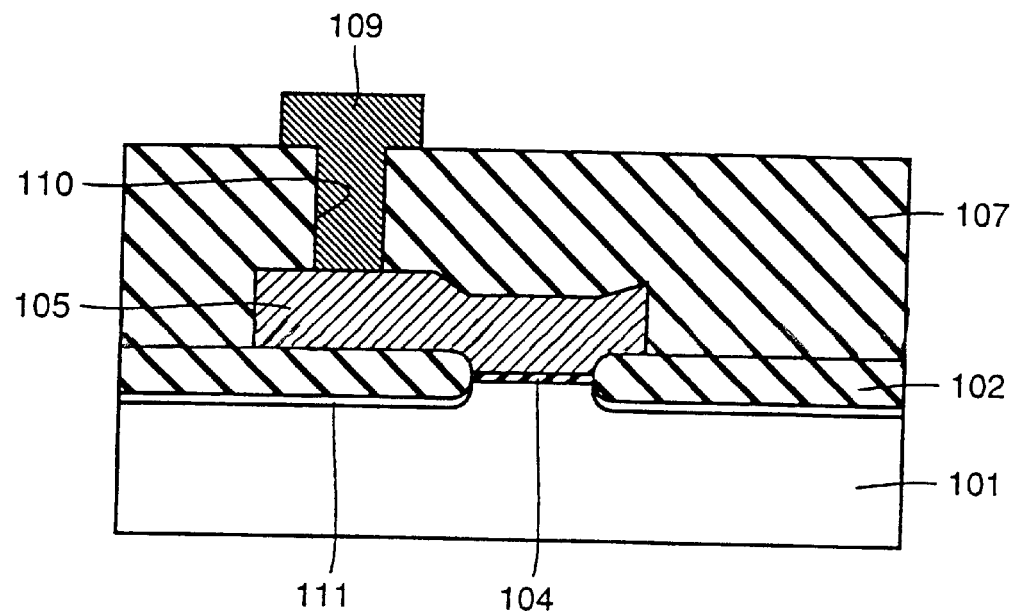
FIG. 92 is a cross section showing another example of a conventional semiconductor device.
Figure 93:
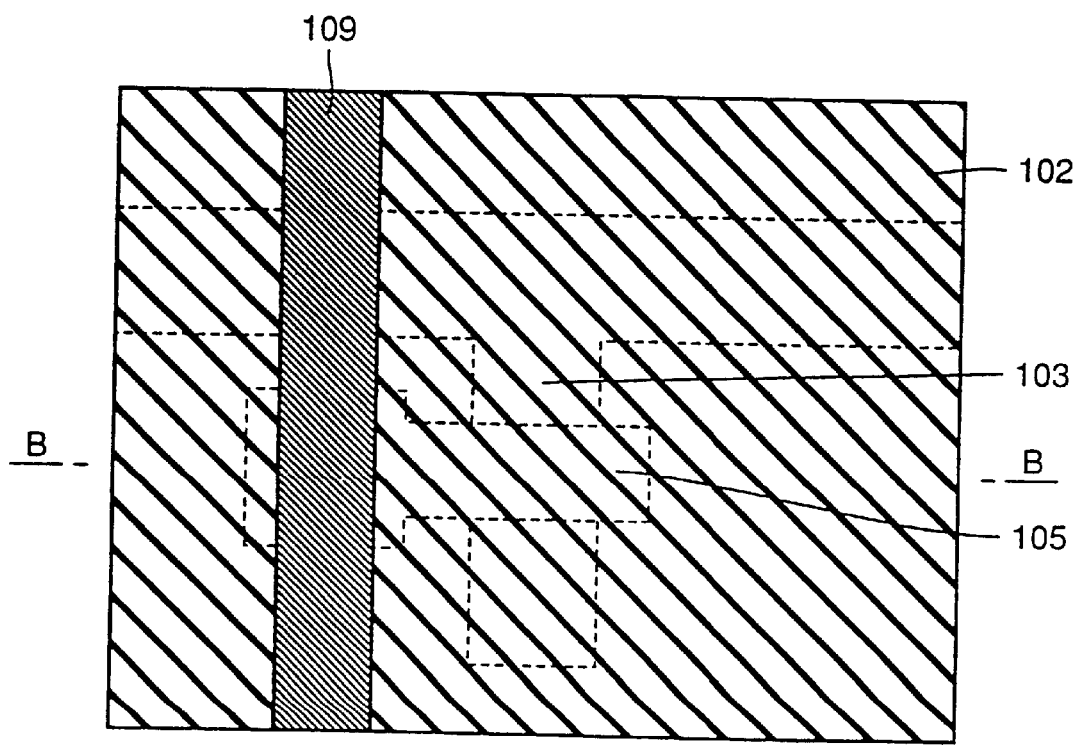
FIG. 93 is a plan view showing another example of the conventional semiconductor device.
Figure 94:
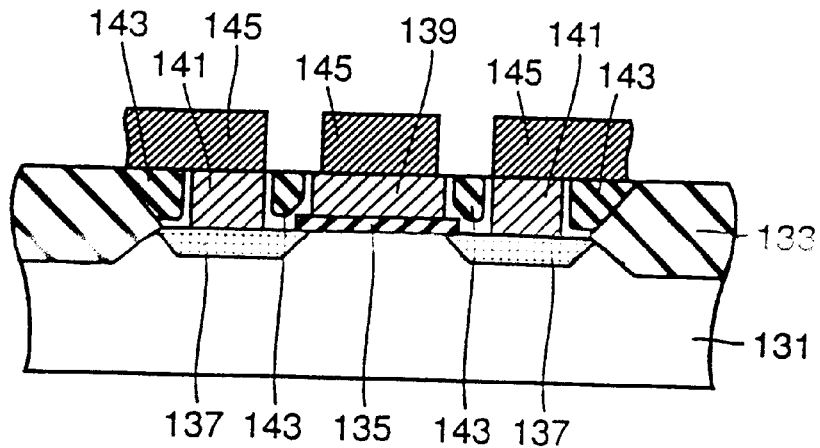
FIG. 94 is a cross section showing a still further example of the conventional semiconductor device.
Figure 95:
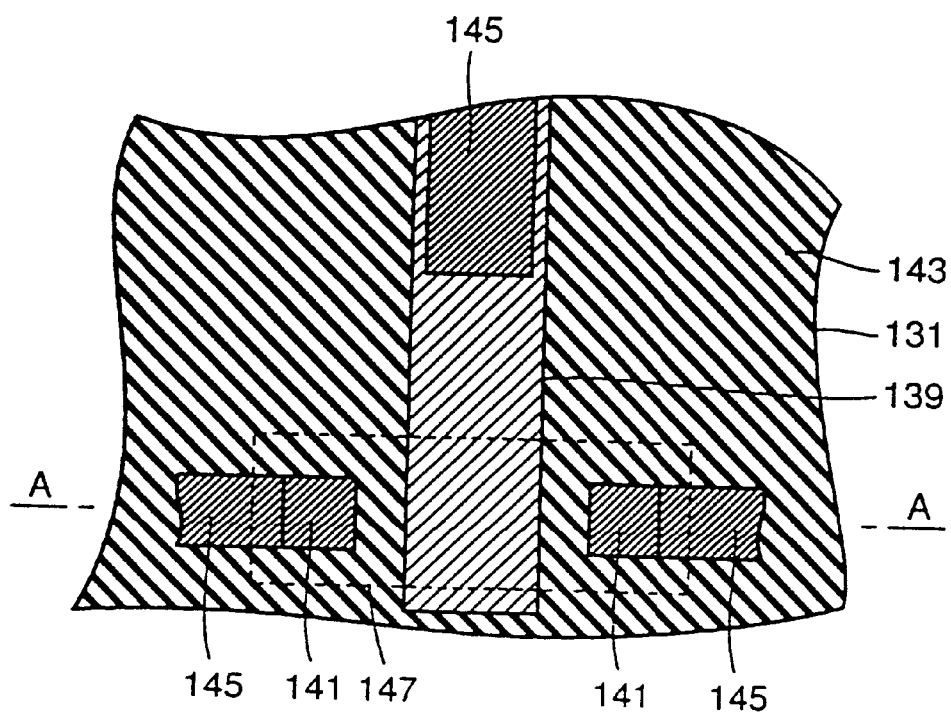
FIG. 95 is a plan view showing a still further example of the conventional semiconductor device.

In such a structure, unlike the prior art, it is not necessary to ensure a margin for the region providing connection between the word line and gate electrode 11, that is, the region for forming the contact hole, on the element isolating insulating film as described with reference to FIGS. 92 and 93. The word line may be extended in an arbitrary direction with resnect to the gate electrode 11. Further, silicon oxide film 19 is formed on the source-drain electrodes 18a, 18b or on the bit line, so that the first interconnection 20 serving as a word line never short-circuits with these electrodes. Further, there is not an insulating film between gate electrode 11 and the first interconnection 20, and the bit line extending in a direction crossing the first interconnection 20 is formed below the upper surface of gate electrode 11 with silicon oxide film 19 posed below the first interconnection 20. Therefore, level difference in the vertical direction is reduced.

Second Embodiment

Figure 3:
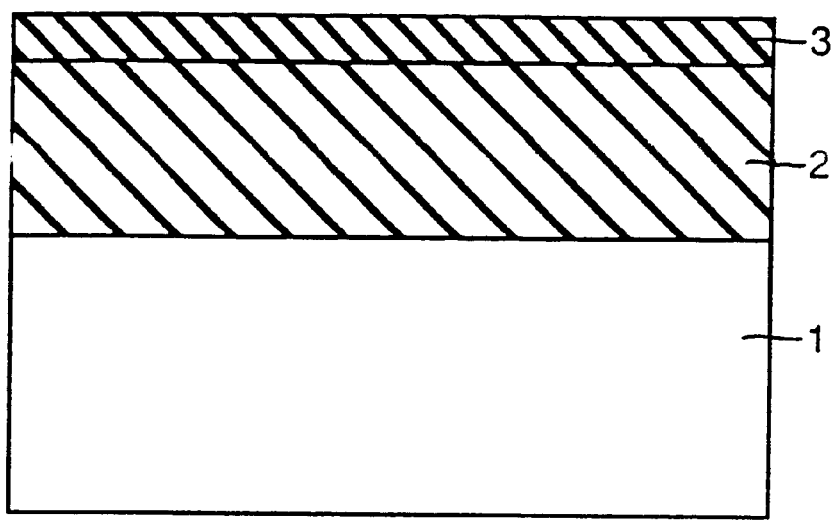
FIG. 3 is a cross section showing a step of manufacturing a semiconductor device in accordance with a second embodiment of the present invention.
Figure 4:
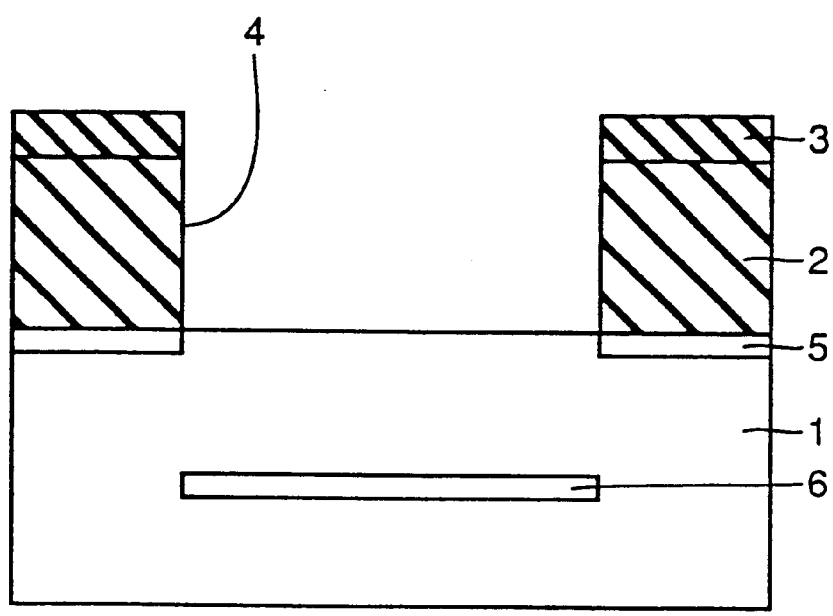
FIGS. 4 to 13 are cross sections and a plan view showing successive steps in the method of manufacturing a semiconductor device in accordance with the second embodiment of the present invention.
Figure 5:
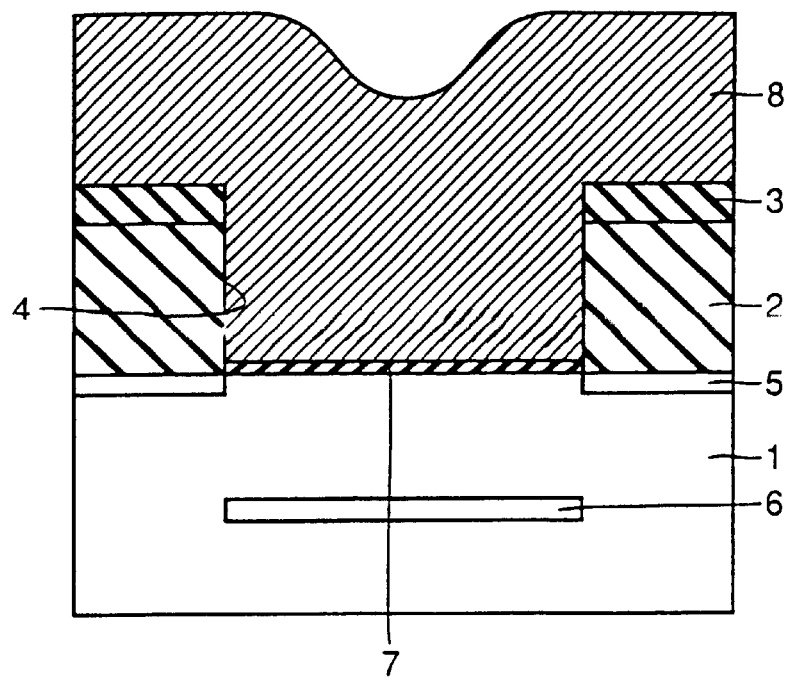
Figure 6:
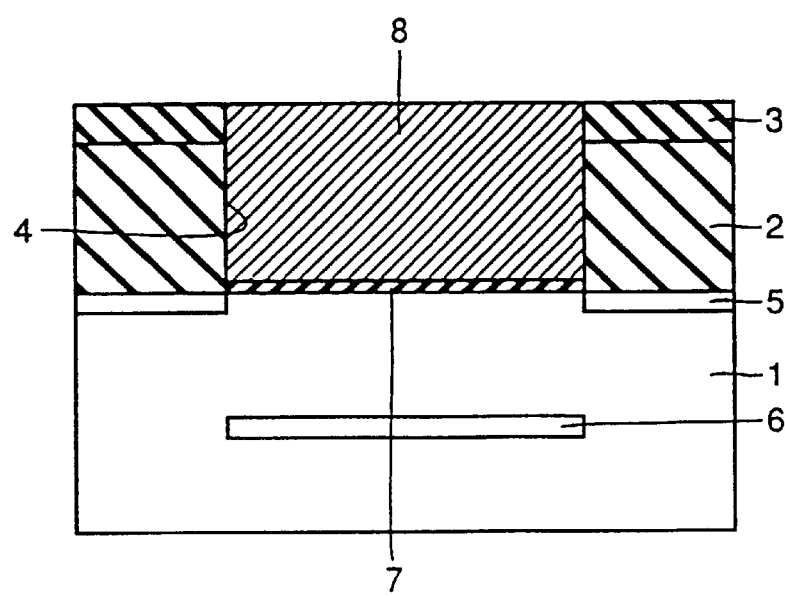
Figure 7:
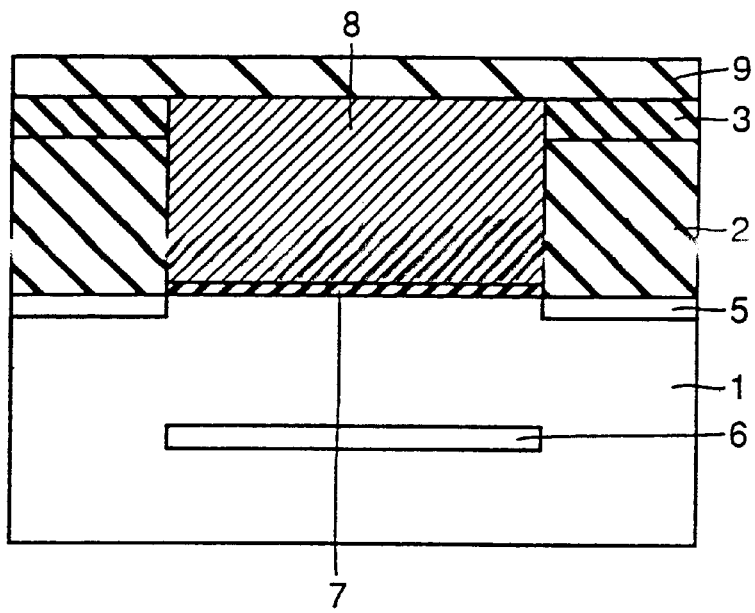
Figure 8:
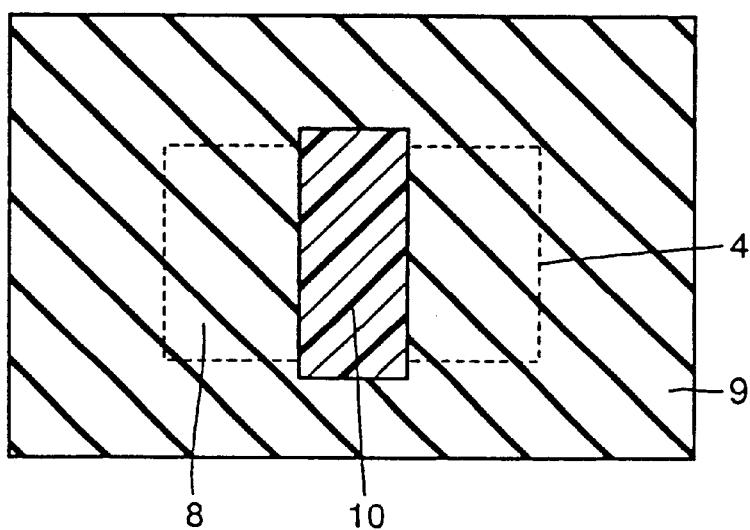
Figure 9:
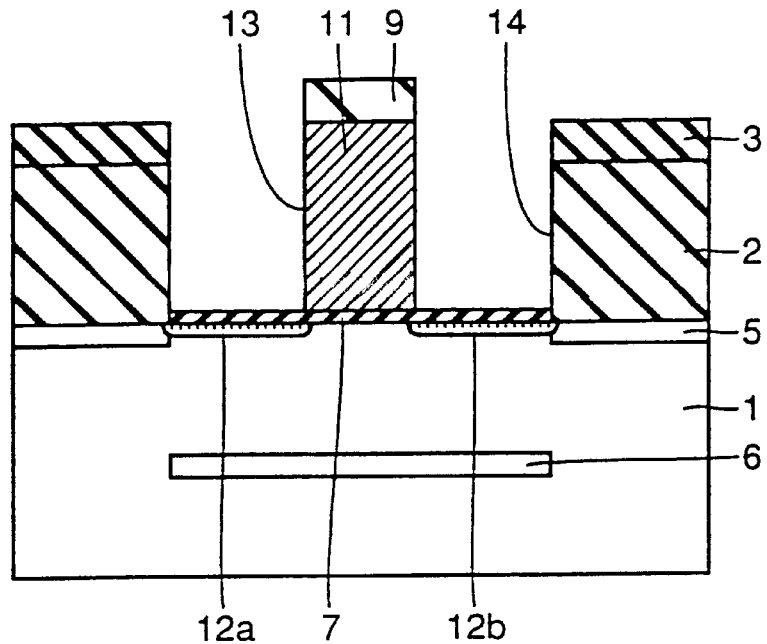
Figure 10:
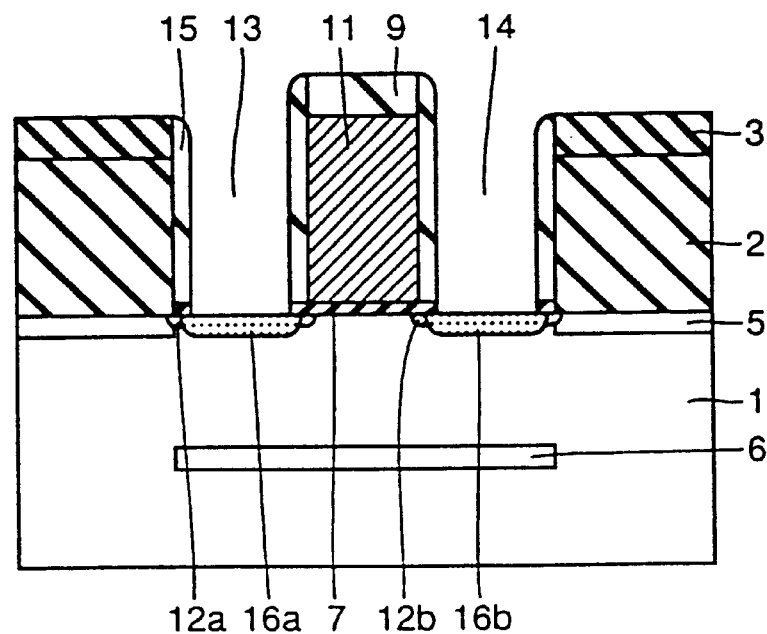
Figure 11:
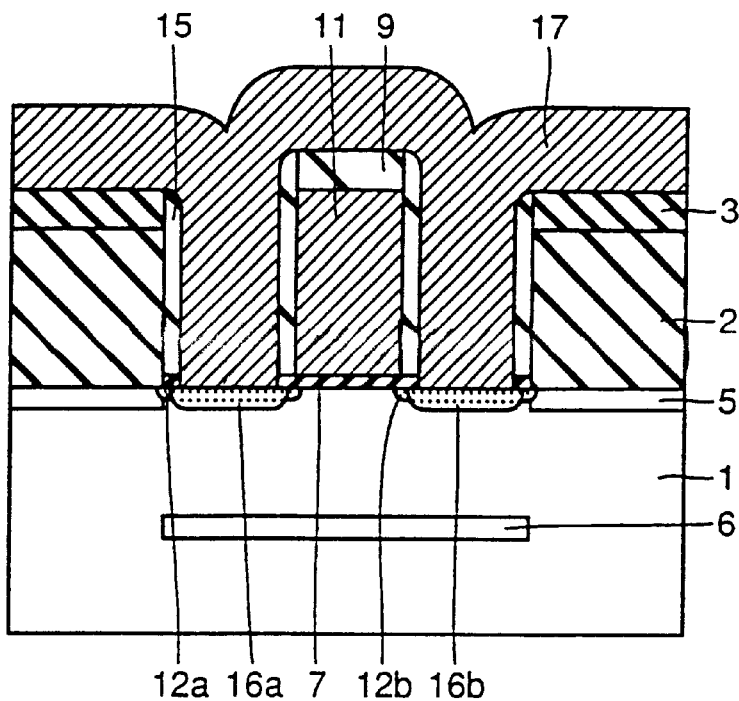
Figure 13:
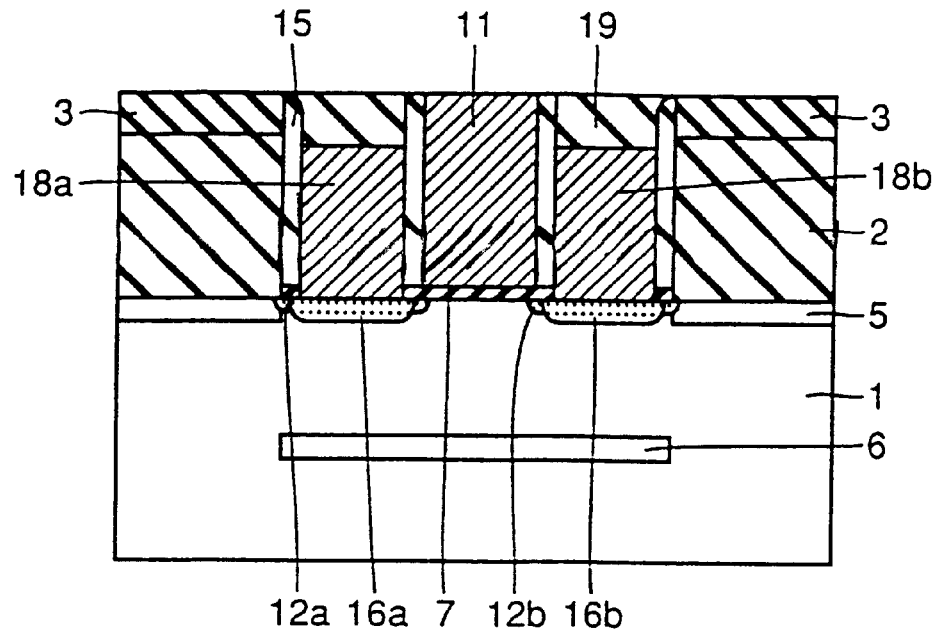
Figure 14:
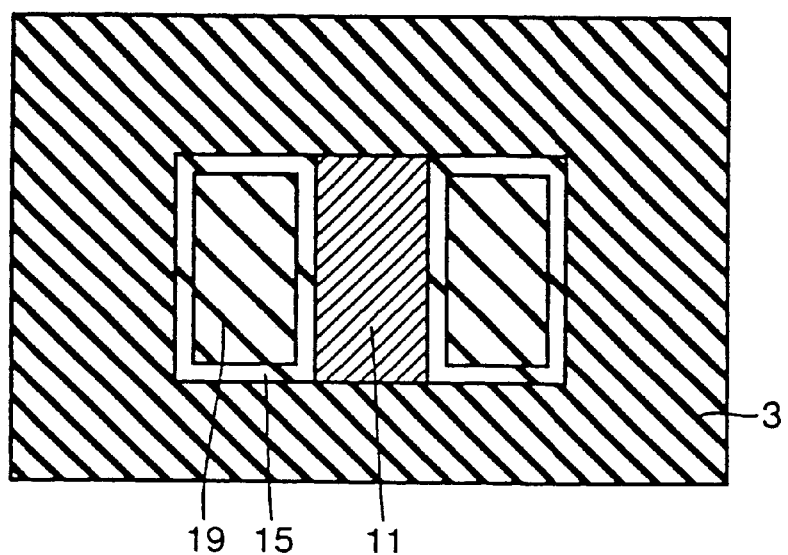
FIG. 14 is a plan view of the semiconductor device in the step shown in FIG. 13 in accordance with the second embodiment of the present invention.

An example of a method of manufacturing the semiconductor device of the first embodiment will be described with reference to the figures. First, as shown in FIG. 3, a silicon oxide film 2 is formed to the thickness of 5000 Å by CVD (Chemical Vapor Deposition) method or by thermal oxidation on a semiconductor substrate 1. A silicon nitride film 3 is formed to the thickness of 1000 Å on silicon oxide film 2 by the CVD method. Thereafter, referring to FIG. 4, a first opening 4 for forming a transistor is formed by common lithography and etching. Thereafter, when an NMOS transistor is to be formed, for example, by ion implantation, boron is introduced with the energy of several tens KeV to 100 KeV with the dosage of $10^{13}$ to $10^{14}/cm^2$, and a channel stop layer 5 and an impurity implanted layer 6 are formed. Elements are isolated from each other by the silicon oxide film 2, the silicon nitride film 3 and the channel stopper layer 5. Impurity layer 6 is formed several thousands Å below the surface of the substrate, and hence it does not have any significant influence on the device properties. Since the first opening 4 is formed by common dry etching, the side surface thereof is almost vertical, presenting a steep step. Thereafter, as shown in FIG. 5, a gate insulating film 7 of silicon oxide film having the thickness of 100 Å is formed by thermal oxidation or the CVD method. Then, a polysilicon film 8 is formed by the CVD method to cover the first opening 4. Thereafter, as shown in FIG. 6, the surface of polysilicon film 8 is etched by etchback method or polishing method, so that the polysilicon film on silicon nitride film 3 is removed and polysilicon film 8 is left only in the first opening 4. Then, referring to FIG. 7, a silicon oxide film 9 is formed to the thickness of 1000 Å by the CVD method. Then, as shown in FIG. 8, an etching mask of a photoresist 10 is formed by lithography across the first opening 4. Thereafter, as shown in FIG. 9, silicon oxide film 9 is etched, using photoresist 10 as a mask. Further, polysilicon film 8 is etched using gate insulating film 7 as an etching stopper, to form gate electrode 11. By silicon oxide film 2 and silicon nitride film 3 as element isolating insulating film, gate width is defined. Since the side surface of the element isolating insulating film is steep, it is advantageous in that there is not a narrow channel effect which is experienced in the LOCOS isolation. Thereafter, by ion implantation, arsenic is introduced with the energy of several tens KeV at the dosage of $10^{14}$ to $10^{15}/cm^2$, so that n⁻ source-drain regions 12a, 12b are formed. Then, referring to FIG. 10, a silicon oxide film is formed to the thickness of 1000 Å by the CVD method. Sidewall insulating film 15 is formed by anisotropic etching. Then, arsenic is introduced with the energy of several tens KeV at the dosage of $10^{15}$ to $10^{16}/cm^2$ by ion implantation, to form n⁺ source-drain regions 16a, 16b. Thereafter, referring to FIG. 11, a polysilicon film 17 is formed by the CVD method. It may an amorphous silicon film or metal silicide film, instead of polysilicon film 17. Thereafter, referring to FIG. 12, by etchback or polishing, the polysilicon film 17 is left only in the p portion of the first opening 4 other than the gate electrode 11. Further, by etchback, the surface of the polysilicon layer 17 is made lower by about 2000 Å than the surface of silicon nitride film 3, whereby source-drain electrodes 18a, 18b are formed. At this time, since the surface of gate electrode 11 is covered by silicon oxide film 9, it is not etched. The thickness of the polysilicon film necessary for filling the opening have only to be at least a half of the width of the trench to be filled. As miniaturization proceeds, the opening can be filled efficiently with a thin film. Accordingly, the amount of etchback necessary for subsequent planarization can be made small. Therefore, the present invention is specifically effective when the width of the trench is at most half a micron. In this embodiment, the fact that the side surface portions of silicon oxide film 2 and silicon nitride film 3 as element isolating insulating films are approximately aligned vertically is utilized, so that filling of gate electrode 11 and source-drain electrodes 18a and 18b is facilitated. Thereafter, as shown in FIG. 13, a silicon oxide film is formed to the thickness of 2000 Å by the CVD method. Thereafter, it is planarized by etchback or polishing, thereby silicon oxide film 19 is left only on the source-drain electrodes 18a, 18b. At this time, silicon oxide film on gate e electrode 11 is removed. FIG. 14 is a plan view showing this step.

Thus, a completely flat MISFET is completed, in which gate electrode 11 and source-drain electrodes 18a and 18b of a transistor and a silicon oxide film 19 formed only on source-drain electrodes 18a, 18b are provided through the above described steps. The source-drain electrodes 18a, 18b and silicon oxide film 19 formed thereon are in self-alignment.

Thereafter, interconnections to be connected to the transistor are formed. First, an aluminum film is formed to the thickness of 1000 to 5000 Å by the CVD method or by sputtering. Other than aluminum film, metal such as tungsten, a metal silicide film such as $TiSi_2$, or $WSi_2$, or a metal nitride film such as WN or TiN may be used. Thereafter, as shown in FIG. 1, a first interconnection 20 is formed by lithography and etching. At this time, since source-drain electrodes 18a, 18b are covered by silicon oxide film 19, these are electrically insulated from the first interconnection 20. However, the first interconnection 20 is in direct contact with gate electrode 11. Here, direct contact means that gate electrode 11 and the first interconnection 20 are not electrically connected through an interlayer insulating film and a contact hole formed therethrough.

Source-drain electrodes 18a, 18b may be extended as they are, to be used as an interconnection layer on the semiconductor substrate, for example, as a bit line. In the following, an example of a method of forming an interconnection layer connected to the source-drain electrodes 18a, 18b will be described.

Figure 15:
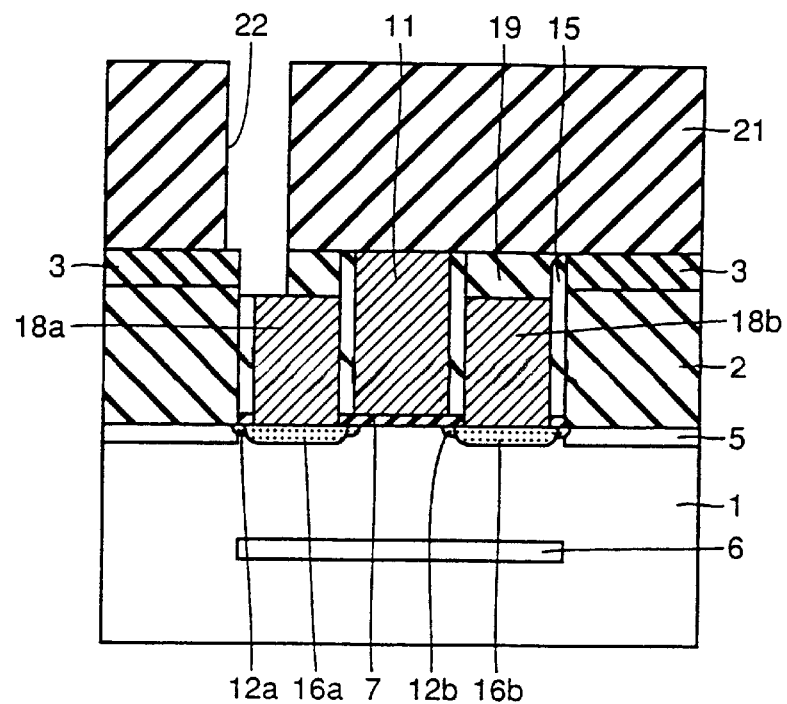
FIG. 15 is a cross section showing the step following the step of FIG. 13 in accordance with the second embodiment of the present invention.

Referring to FIG. 15, a silicon oxide film 21 is formed to the thickness of 10000 Å by the CVD method. Thereafter, by lithography and etching, a contact hole 22 is formed. In this case, source-drain electrodes 18a, 18b and silicon nitride film 3 serve as an etching stopper. The bottom of the contact hole 22 have only to reach the surface of source or drain electrode 18a. Therefore, the bottom of contact hole 22 does not reach the surface of semiconductor substrate 1 even by overetching generally carried out at the time of etching contact hole 22. Accordingly, even when the bottom of contact hole 22 is partially out of the region of the source or drain electrode 18a, there will never be a junction leak, as it is in contact with the lower portion of the region of silicon nitride film 3 and silicon oxide film 2 as element isolating insulating films. Accordingly, it becomes unnecessary to set the region of source or drain electrode 18a larger to provide margin taking into account accuracy of alignment for lithography, and hence degree of integration in the horizontal direction can be improved.

Figure 16:
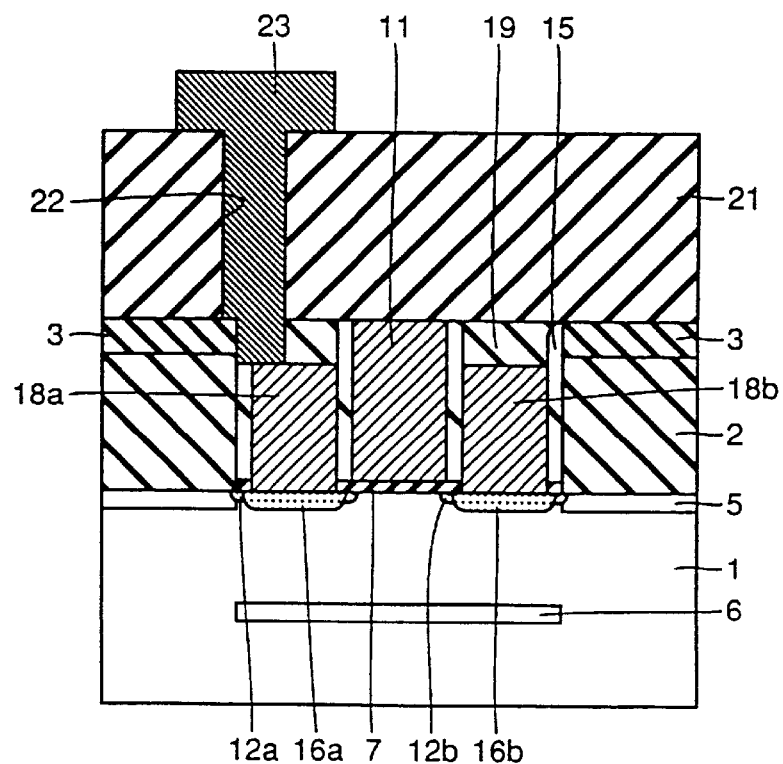
FIG. 16 is a cross section showing the step following the step of FIG. 15 in accordance with the second embodiment of the present invention.

Thereafter, referring to FIG. 16, a multilayered films including TiN and an aluminum alloy is formed by sputtering or the CVD method and patterned by lithography or etching, so that a second interconnection 23 is formed.

In this first embodiment, gate electrode 11 and the first interconnection 20, that is, the word line are formed separately. Therefore, the word line can be formed after heat treatment for forming regions for source-drain regions 12a, 12b, 16a, 16b at a temperature of about 800 to 900° C. Accordingly, a metal having low melting point such as aluminum may be used as the word line.

Though an example in which both n$^+$ source-drain regions 12a, 12b and n$^+$ source-drain regions 16a and 16b are formed has been described in the present embodiment, only the n$^-$ source-drain regions 12a, 12b or n$^+$ source-drain regions 16a, 16b may be formed. Though an MISFET has been described as an example, it goes without saying that the embodiment can be applied to a PMISFET. In case of a PMISFET, a channel stop layer is not always necessary. Further, an SOI substrate may be used as a semiconductor substrate.

Further, in this embodiment, as shown in FIG. 1, the first interconnection 20 connected to gate electrode 11 extends in the direction of the gate length, that is, the direction connecting source-gate-drain. In this case, as already described, gate electrode 11 exists in that region which is surrounded by silicon nitride film 3 and silicon oxide film 2 as element isolating insulating films. More specifically, gate electrode 11 exist only on the channel region, the first interconnection 20 and gate electrode 11 cross above the channel region of the transistor, and the interconnection and the gate electrode are in contact with each other only at this crossing portion. Therefore, unlike the prior art shown in FIG. 92 or 93, it is not necessary to provide a region for providing connection between the word line and the gate electrode, that is, the region for forming a contact hole, with a margin on the element isolating insulating film. Therefore, improvement in the degree of integration is not hindered. Unlike the example shown in FIG. 92 or 93, the step for forming contact hole 110 is not necessary, which simplifies the manufacturing process and reduces the time necessary for manufacture.

Third Embodiment

As a third embodiment, a semiconductor device in which the first interconnection serving as a word line extends in the gate length direction will be described, taking a transistor for a memory cell of a memory device as an example, with reference to the figures.

Figure 12:
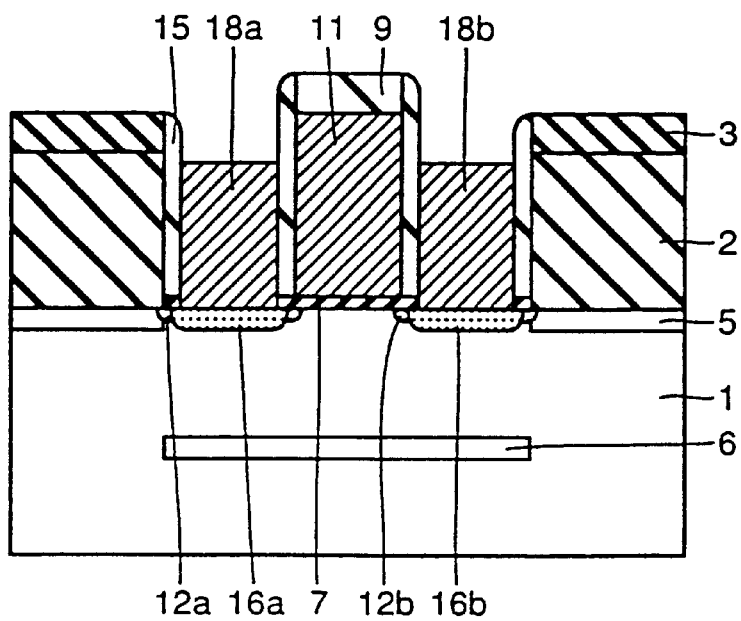
Figure 17:
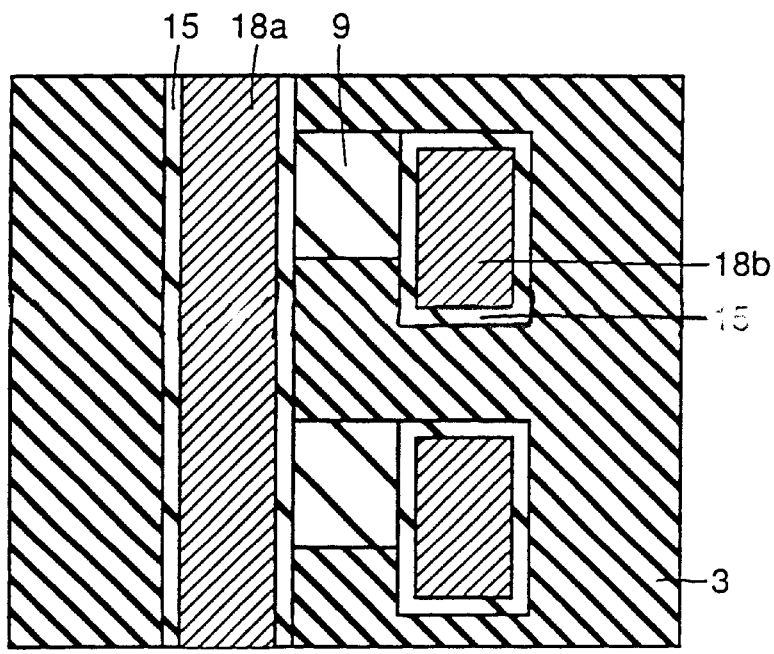
FIGS. 17 to 19 are plan views showing successive steps in the method of manufacturing a semiconductor device in accordance with a third embodiment of the present invention.
Figure 18:
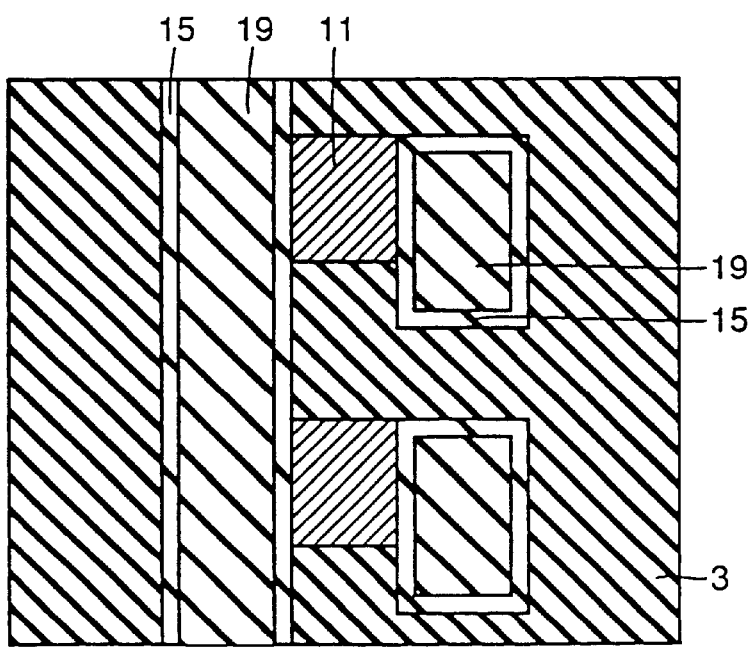
Figure 19:
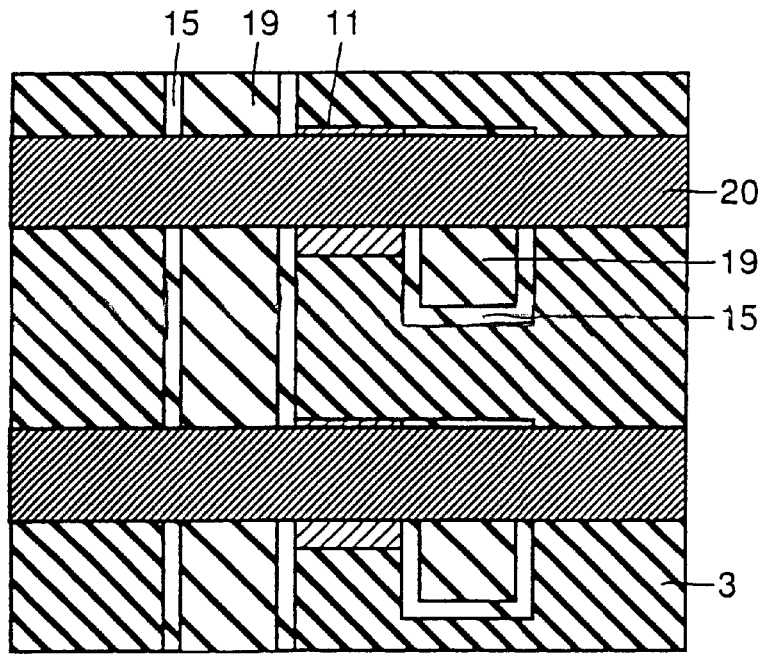
Figure 89:
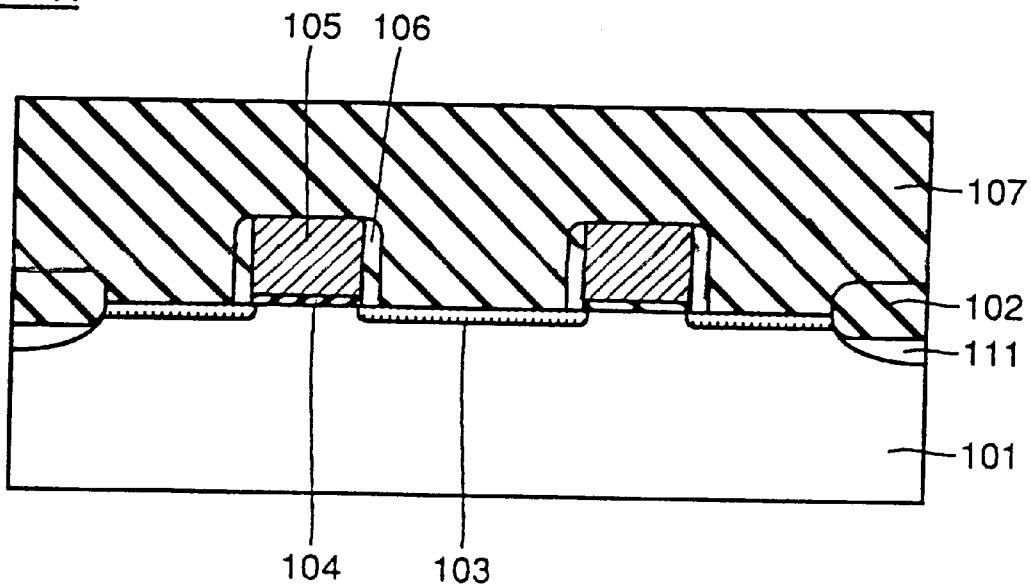
FIG. 89 is a cross section showing an example of a conventional semiconductor device.
Figure 90:
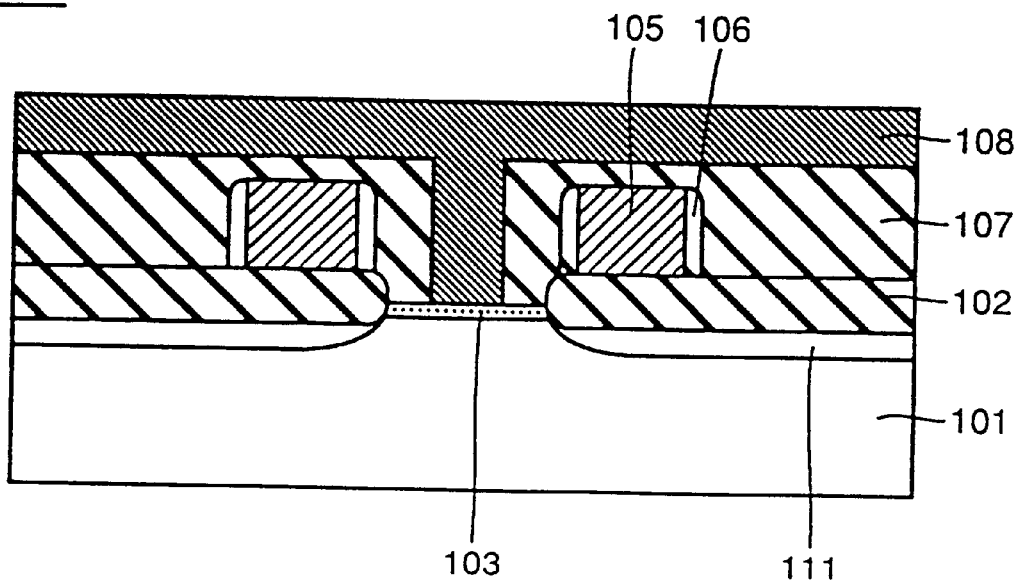
FIG. 90 is a second cross section showing an example of a conventional semiconductor device.
Figure 91:
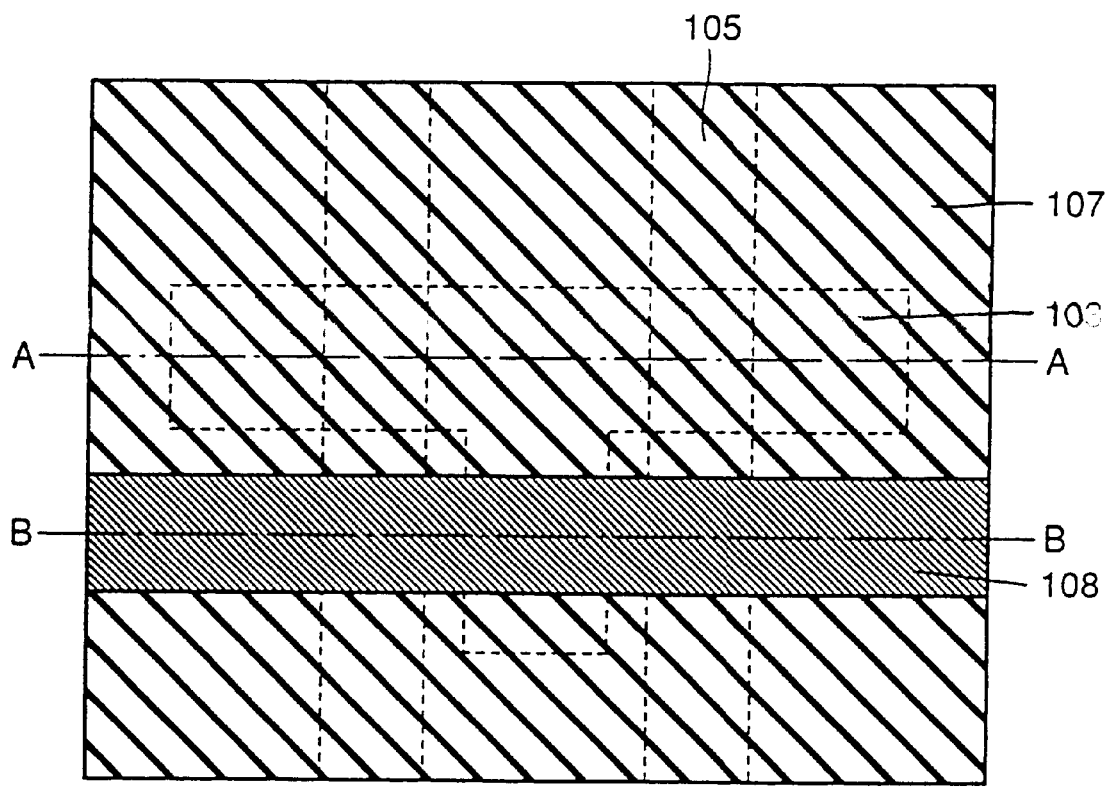
FIG. 91 is a plan view showing an example of a conventional semiconductor device.

FIG. 17 is a plan view of the step shown in FIG. 12. There can be seen a silicon oxide film 9 at the portion of the gate electrode. Of the source-drain electrodes 18a and 18b, one 18a constitutes the bit line, and the other 19b is connected to a capacitor (not shown). The electrode 18a is connected to a plurality of transistors. FIG. 18 is a plan view showing the step of FIG. 13 or 14. The silicon oxide film at the surface of gate electrode 11 is removed, and instead, a silicon oxide 19 is formed on the surfaces of source-drain electrodes 18a and 18b. FIG. 19 is a plan view of the step shown in FIG. 1 or 2. After this step, similar to the processes described with reference to FIGS. 15 and 16, a capacitor electrode (not shown) is connected to source-drain electrode 18b. The first interconnection 20 constitutes a word line. The word line extends in the direction of the gate length, contrary to the conventional generally used memory cells of a DRAM. Therefore, the bit lines and word lines cross orthogonally with each other, while the bit line exists lower than the word line and the bit line is not disconnected by the element isolating insulating film. In the present embodiment, as the bit line structure 18a is adapted to have multilayered structure in order to prevent short-circuit between other interconnections, it is not necessary to electrically connect the bit line 18a to the source-drain electrode 18a of the memory cell transistor, and the word line and the gate electrode 11 are in direct connection. Therefore, level difference in the vertical direction can be reduced, facilitating processing of interconnections or the like in the subsequent process steps, and it is not necessary either to extend part of the gate electrode of the element isolating region in order to connect the word line to the gate electrode. Different from the prior art shown in FIG. 89, it is not necessary to form a contact hole for connecting the bit line and the source-drain region in each memory cell. Therefore, degree of integration can be improved. Accordingly, the present invention is especially effective for an MISFET in which word lines and bit lines crossing each other are connected. Such a structure is applicable to all the following embodiments.

As for the method of forming the source-drain electrodes 18a and 18b, W, Al, Cu or the like may be formed by selective CVD method. Though an impurity is introduced by ion implantation to the source-drain regions and thereafter the source-drain electrodes are formed, it is possible to form the source-drain electrodes by a polycrystalline silicon or a metal silicide, and to dope the source-drain electrodes with an impurity by ion implantation, and the impurity may be diffused to the surface of the semiconductor substrate from the source-drain electrodes by thermal processing.

Further, the present embodiment is applicable not only to the DRAM but also to all the semiconductor devices in which interconnection connected to the gate electrode crosses the interconnection connected to the source-drain electrode. Though the first interconnection 20 crosses the direction of the gate orthogonally in the drawings, the angle of crossing is not limited to a right angle, and similar effects can be provided so long as the interconnection and the gate width direction is not parallel.

Fourth Embodiment

Another example of the method of manufacturing the semiconductor device described with reference to the first embodiment will be described as a fourth embodiment. In this embodiment, the manufacturing steps can be simplified.

Figure 20:
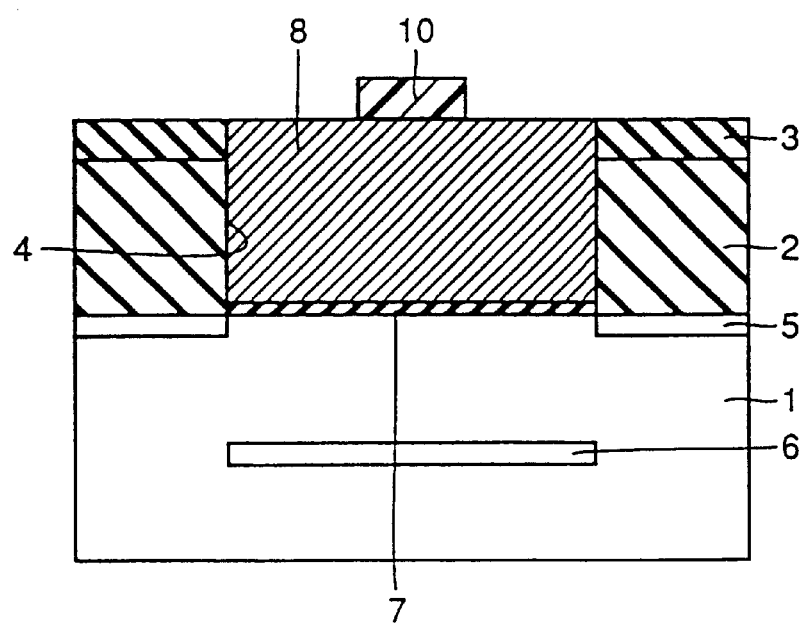
FIGS. 20 to 25 are cross sections and a plan view showing successive steps in the method of manufacturing a semiconductor device in accordance with a fourth embodiment of the present invention.
Figure 21:
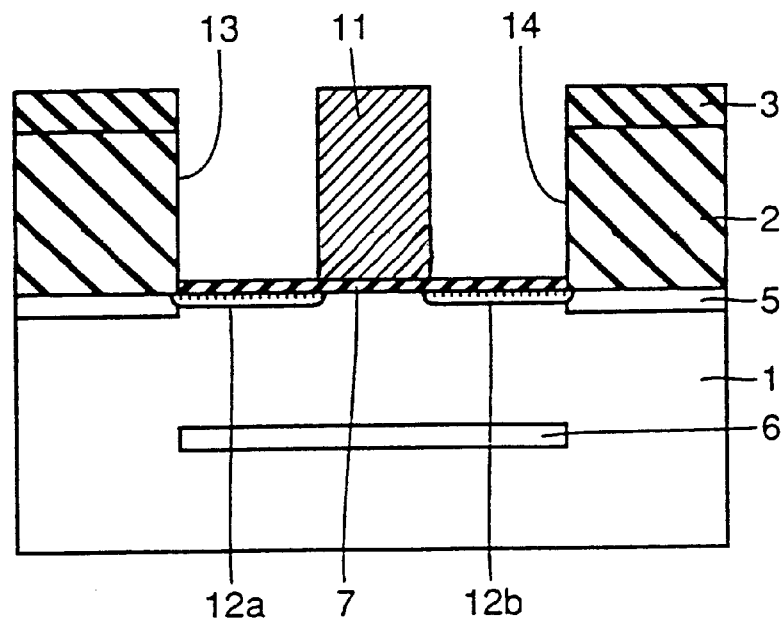
Figure 22:
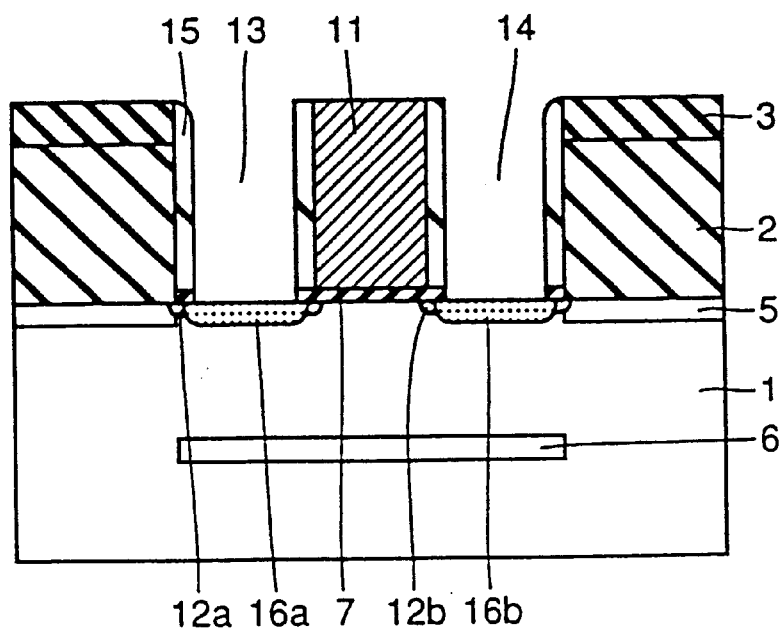
Figure 23:
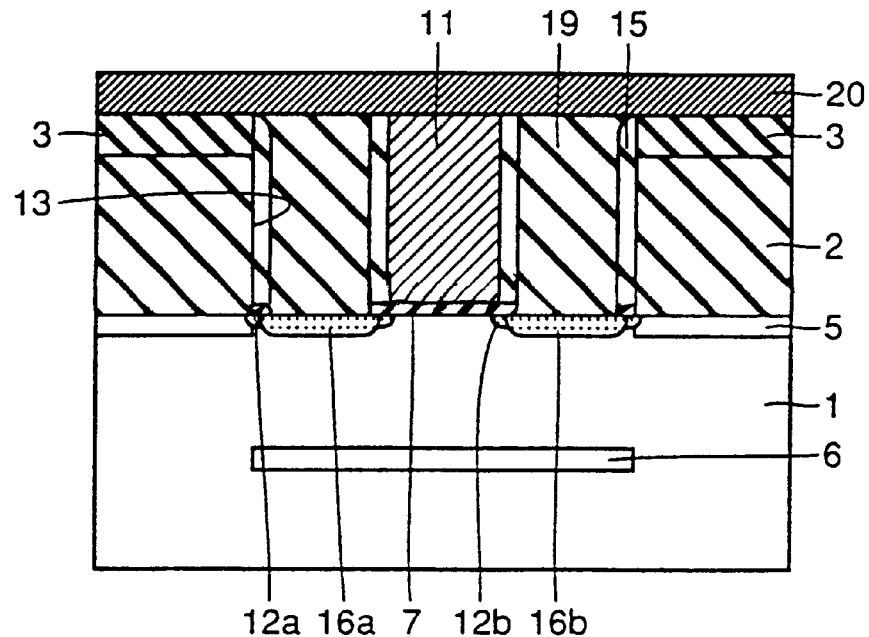
Figure 24:
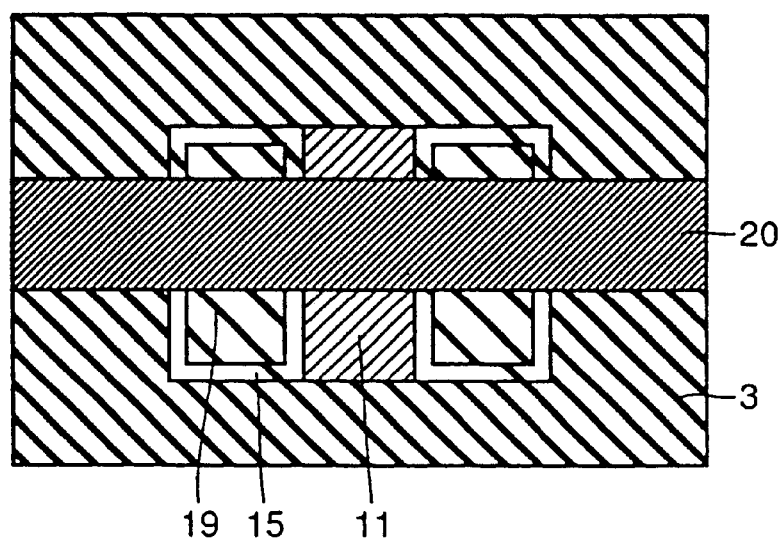
Figure 25:
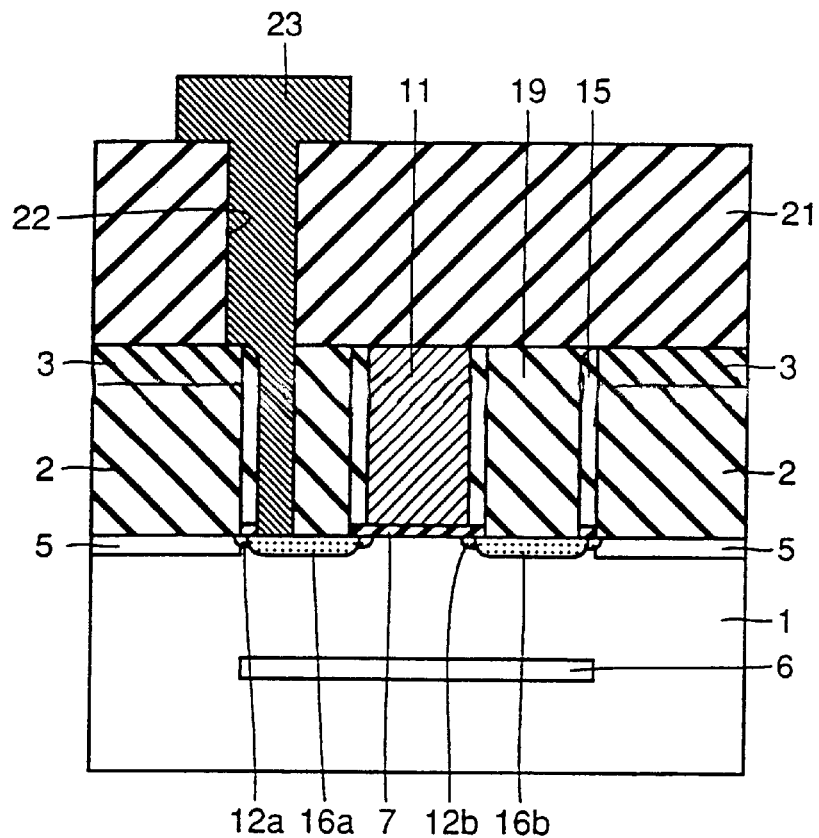

First, referring to FIG. 20, after the step shown in FIG. 6, photoresist 10 as an etching mask is formed by lithography. Referring to FIG. 21, the polysilicon film is etched, and a gate electrode 11 is formed. Thereafter, by ion implantation, n source-drain regions 12a, 12b are formed. Thereafter, as shown in FIG. 22, a silicon nitride film is formed to the thickness of 1000 Å anisotropic etching is performed, and sidewall insulating film 15 is formed. Thereafter, by ion implantation, n$^+$ source-drain regions 16a, 16b are formed. Here, only the n$^-$ source-drain regions 12a, 12b or n$^+$ source-drain regions Thereafter, referring to FIG. 23, a silicon oxide film is formed by the CVD method, and it is planarized by polishing or etch back, so that silicon oxide film 19 is formed on the source-drain regions 12a, 12b, 16a, 16b. Then, the first interconnection 20 is formed. FIG. 24 is a plan view showing this step thereafter, referring to FIG. 25, a silicon oxide film 21 is formed. Then, contact hole 22 is formed and a second interconnection 23 is formed. At this time, silicon oxide films 21 and 19 are selectively removed, leaving silicon nitride film 3 and sidewall insulating film 15. Therefore, the second interconnection 23 never contacts channel stop layer 5 beneath the silicon oxide film 2 and silicon nitride film 3 which are element isolating insulating films. Therefore, short-circuit between source-drain regions 12a, 12b, 16a, 16b and semiconductor substrate 1 caused by the second interconnection 23 can be prevented.

After the step shown in FIG. 22, gate electrode 11 and n$^+$ source-drain region 16a, 16b may be turned to silicide by using Ti, Co, Ni or the like by salicide method (self aligned silicide), in order to reduce sheet resistance.

In this embodiment, gate electrode 11 and first interconnection 20 cross each other, and at the crossing portions, these are in electrical contact. If these n$^-$ source-drain regions 12a and 12b or n$^+$ source-drain regions 16a and 16b are used as bit lines, similar interconnection as described in the second embodiment can be formed. In this example, an electrode formed of a polysilicon film filled in the source-drain regions is not provided. Therefore, a contact hole must be formed reaching the substrate. Therefore, as compared with the second embodiment, a deeper contact hole becomes necessary. Therefore, this embodiment suffers from a problem that etching for forming the contact hole and filling the contact hole by the interconnection layer subsequently become difficult, while it has an advantage that the process is simplified.

Further, the present embodiment is applicable to all the other embodiments, replacing the steps for forming the source-drain electrodes 18a, 18b of the present invention.

Fifth Embodiment

In the step shown in FIG. 15 described with reference to the second embodiment, a problem experienced when contact hole 22 is formed is that if the distance between contact hole 22 and the first interconnection 20 is too small as compared with accuracy in alignment for lithography, it becomes possible that the first interconnection 20 and second interconnection 23 formed thereon are short-circuited through contact hole 22. A method of manufacturing which can avoid such a problem will be described as a fifth embodiment.

Figure 26:
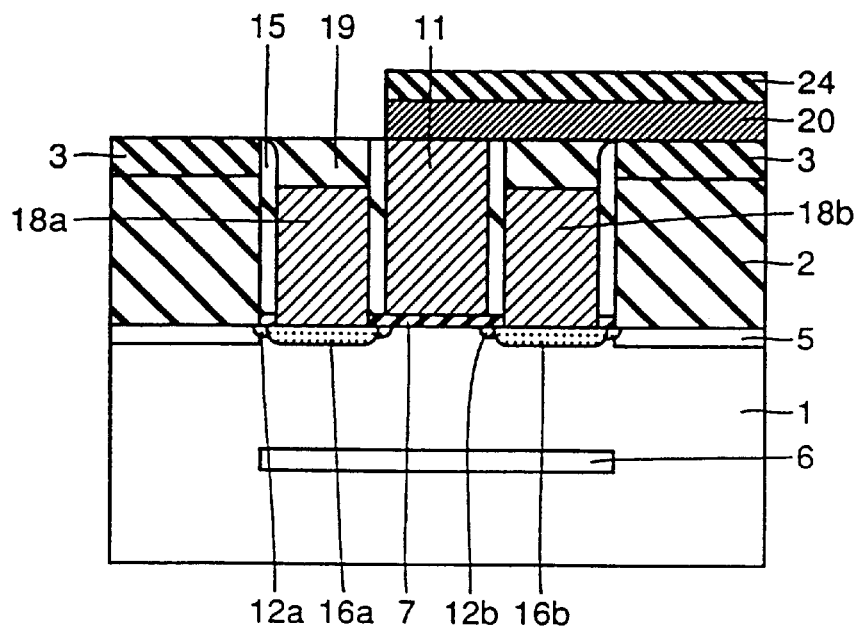
FIGS. 26 to 28 are cross sections showing successive steps in the method of manufacturing a semiconductor device in accordance with a fifth embodiment of the present invention.
Figure 27:
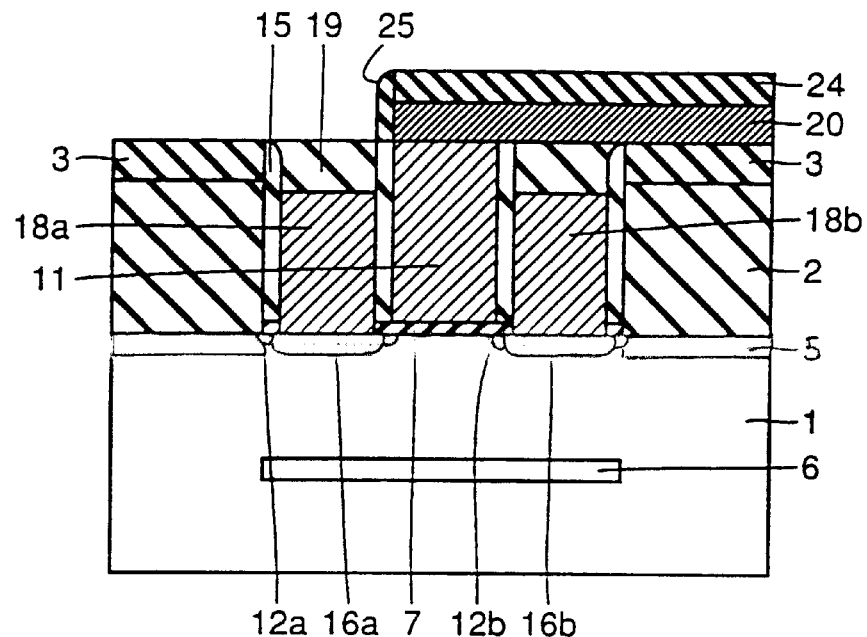
Figure 28:
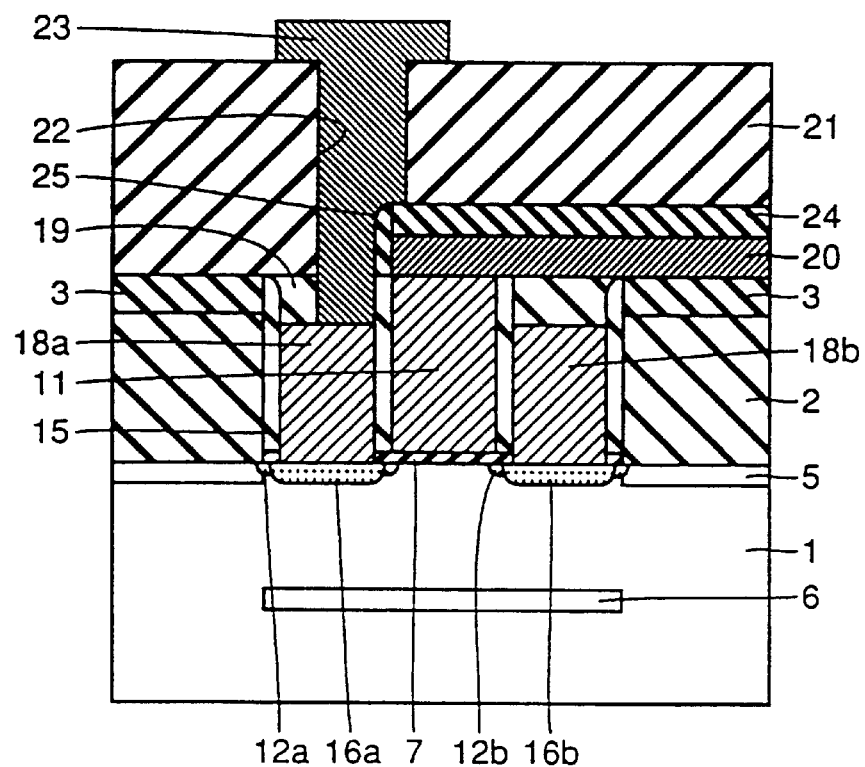
Figure 29:
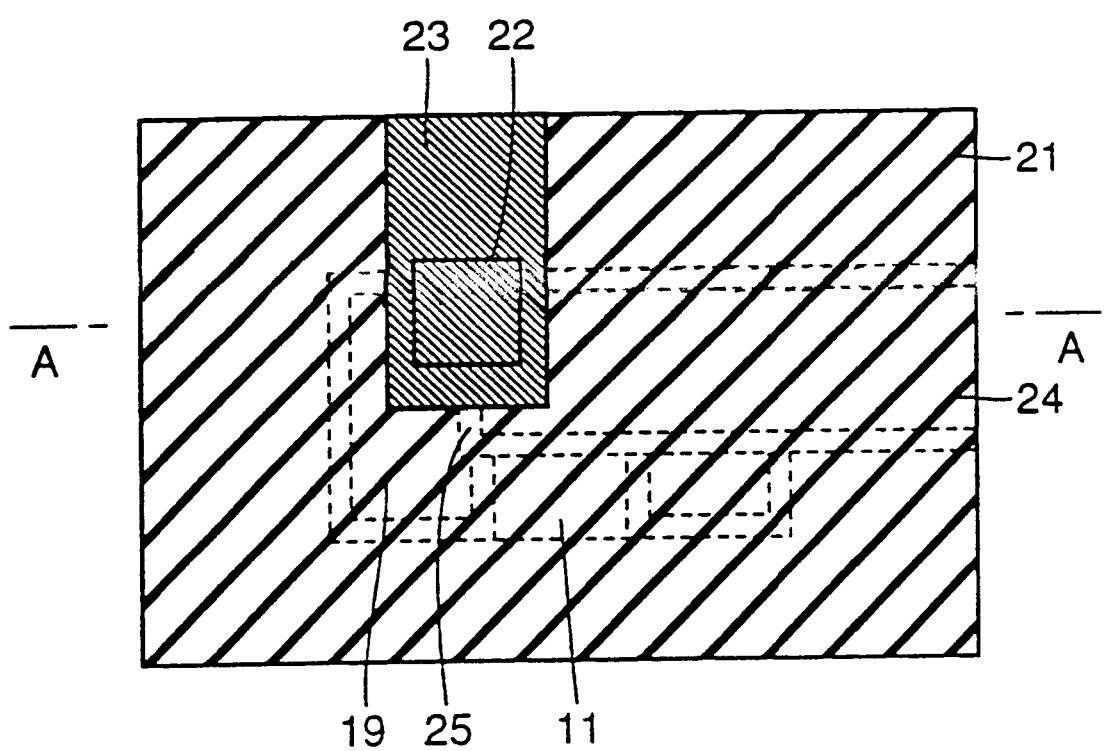
FIG. 29 is a plan view showing the step following the step of FIG. 28 in accordance with the fifth embodiment of the present invention.

Following the step shown in FIG. 13 or 14, TiSi$_2$ as the first interconnection 20 is formed to the thickness of 1000 Å. Then, as shown in FIG. 26, silicon nitride film 24 is formed to the thickness of 1000 Å thereon. Then, by lithography and etching, a prescribed region of the steps having the stacked structure is patterned. Then, referring to FIG. 27, a silicon nitride film is formed to the thickness of 500 Å, and a sidewall insulating film 25 is formed by anisotropic etch back. Thereafter, as shown in FIG. 28, silicon oxide film 21 is formed to the thickness of 10000 Å, and contact hole 22 is formed by lithography and etching. At this time, using silicon nitride film 24 and sidewall insulating film 25 as an etching mask, only the silicon oxide films 21 and 19 are etched selectively. Even when a contact hole is formed at the first interconnection 20, electrical connection never occurs between the second interconnection 23 and first interconnection 20 formed subsequently. FIG. 29 is a plan view of this step and FIG. 28 is a cross section taken along the line A—A of this figure.

Sixth Embodiment

Figure 30:
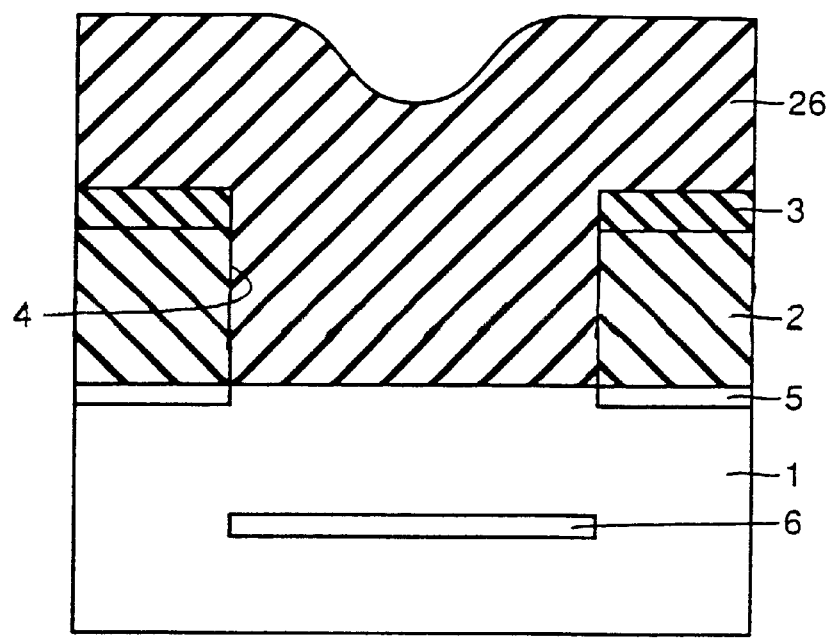
FIGS. 30 to 38 are cross sections showing successive steps in the method of manufacturing a semiconductor device in accordance with a sixth embodiment of the present invention.
Figure 31:
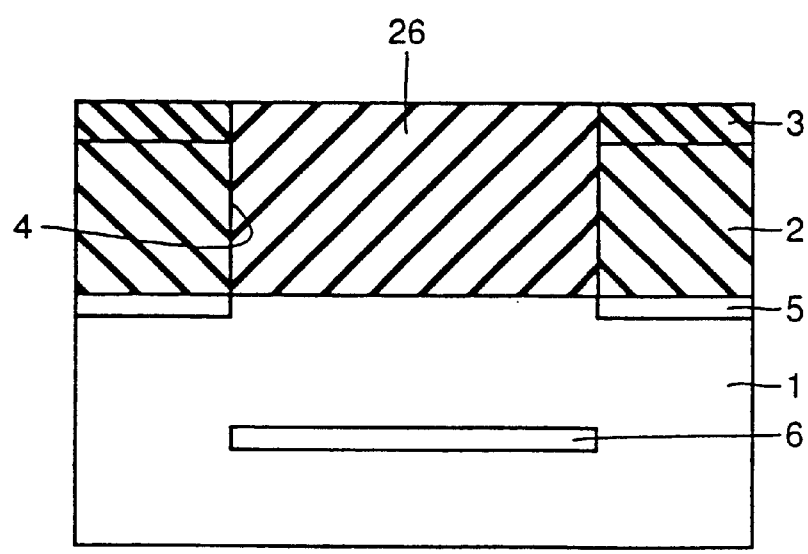
Figure 32:
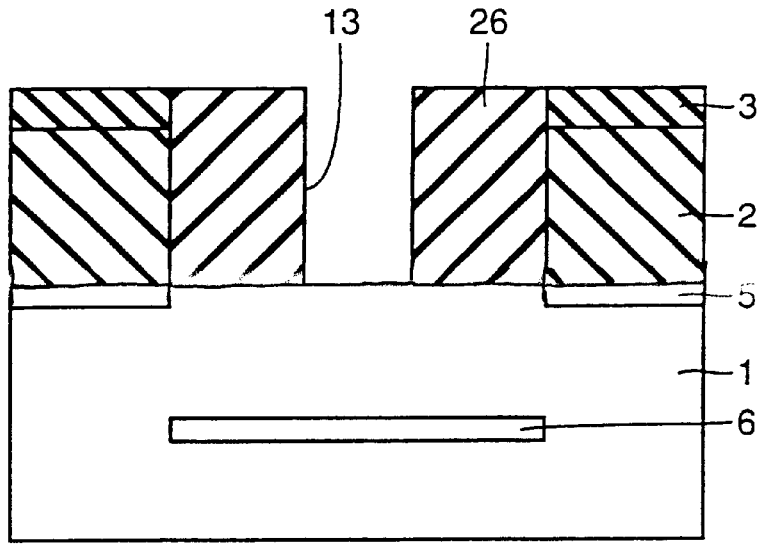

A still further method of manufacturing the semiconductor device in accordance with the first embodiment will be described. After the step shown in FIG. 4, a silicon oxide film 26 is formed by the CVD method to fill the first opening 4, as shown in FIG. 30. Then, referring to FIG. 31, silicon oxide film 26 is left only in the first opening 4 by polishing or etch back. Thereafter, referring to FIG. 32, by lithography and etching, a second opening 13 is formed. Then, referring to FIG. 33, by thermal oxidation or CVD method, silicon oxide film is deposited to the thickness of 50 to 100 Å, and a gate insulating film 7 is formed. Thereafter, a polysilicon film is formed by the CVD method, and by polishing or etch back, gate electrode 11 is formed in the second opening 13. At this time, the surface of the gate electrode 11 is etched back so that it is lowered by 1000 Å than the surface of the silicon nitride film 3. Then, referring to FIG. 34, silicon nitride film 27 is formed by the CVD method. By polishing or etch back, silicon nitride film 27 is left only at the step between the surface of gate electrode 11 and surface of silicon nitride film 3. Then, referring to FIG. 35, by using silicon nitride films 3 and 27 as a mask, silicon oxide film 26 is etched. Then, by implantation of arsenic ions, n$^-$ source-drain regions 12a, 12b are formed. Then, referring to FIG. 36, by the CVD method or by thermal oxidation, a silicon oxide film is formed to the thickness of 1000 Å, which is etched back to provide a sidewall insulating film 15. Thereafter, by ion implantation of arsenic, n$^+$ source-drain regions 16a, 16b are formed. Thereafter, referring to FIG. 37, a polysilicon film is formed by the CVD method, and by polishing or etch back, source-drain electrodes 18a, 18b are formed. Other than polysilicon film, metal silicide such as TiSi$_2$, WSi$_2$, MoSi$_2$, CoSi$_2$, NiSi$_2$, metal such as Al, Cu alloy or a metal nitride film such as TiN may be used. Thereafter, referring to FIG. 38, silicon oxide film 19 is formed by the CVD method. It is planarized by polishing or etch back, so that silicon oxide film 19 is left only on the source-drain electrode 18a, 18b. Thereafter, silicon nitride films 3, 27 are removed by hot phosphoric acid or by dry etching. Thereafter, through the similar steps as described in the second embodiment, interconnections to be connected to each of the electrodes are formed.

In the second embodiment, it is necessary to perform etching, using a thin gate insulating film 7 as a stopper, when gate electrode 11 is to be formed. Therefore, as gate insulating film 7 becomes thinner, it becomes necessary to improve etch selectivity for the gate electrode 11. However, in the manufacturing method of the present embodiment, such necessity is eliminated, and hence the gate insulating film can be made thinner.

Seventh Embodiment

Figure 39:
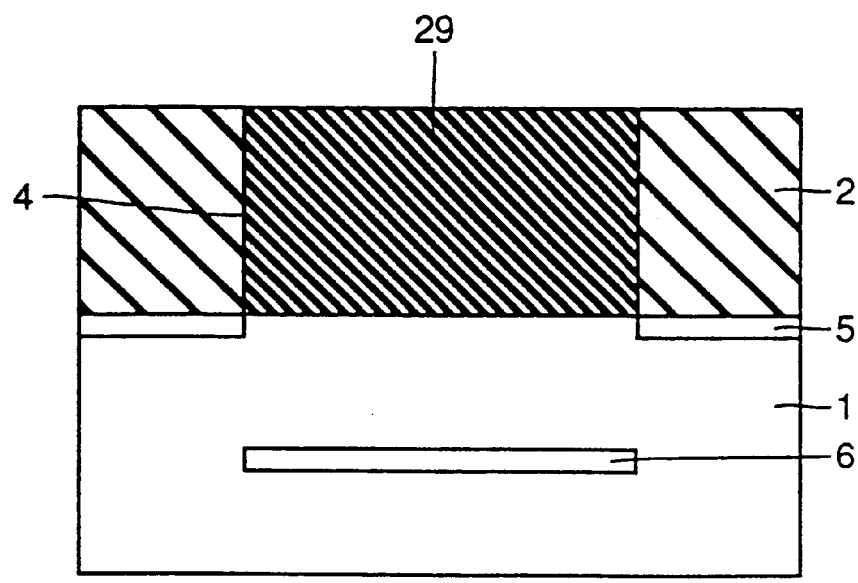
FIGS. 39 to 46 are cross sections showing successive steps in the method of manufacturing a semiconductor device in accordance with a seventh embodiment of the present invention.
Figure 40:
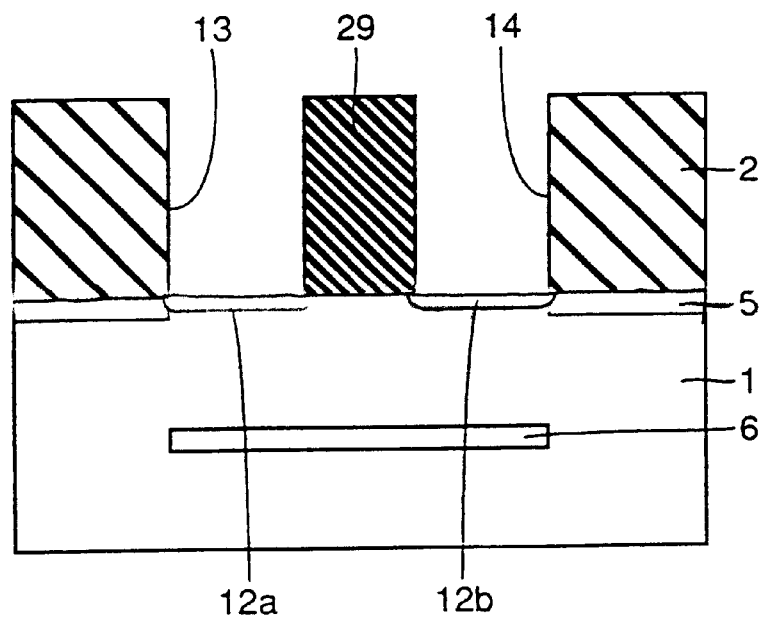
Figure 41:
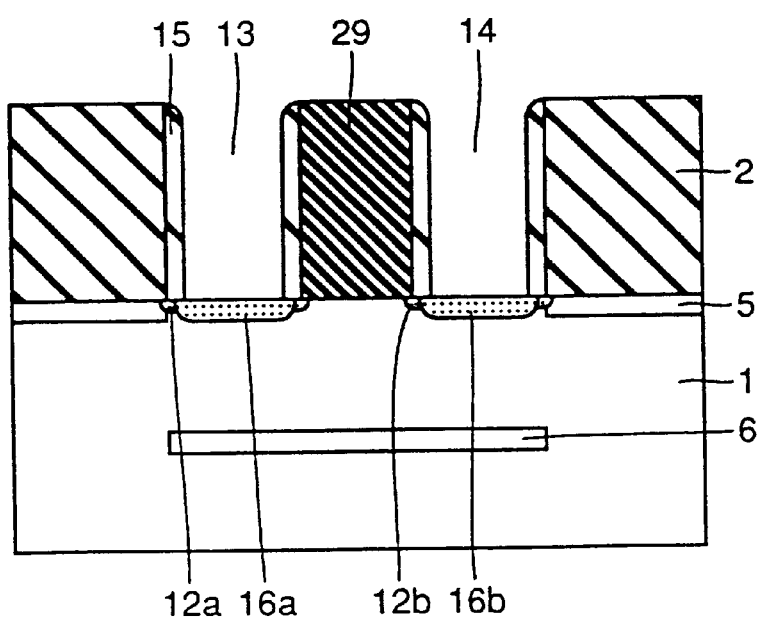
Figure 42:
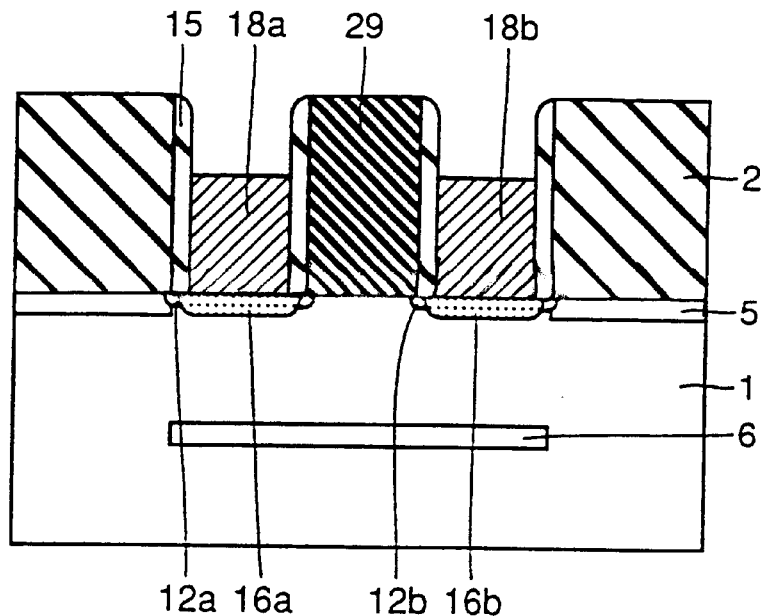
Figure 43:
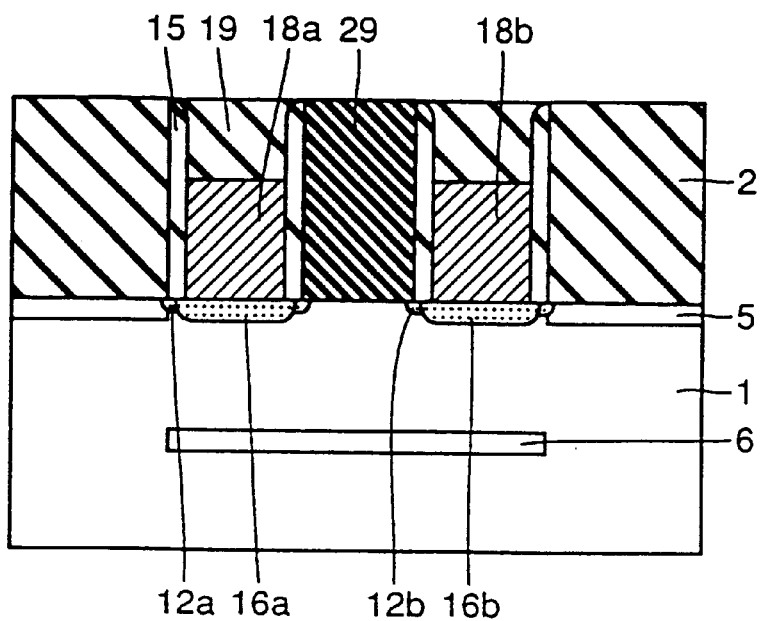
Figure 44:
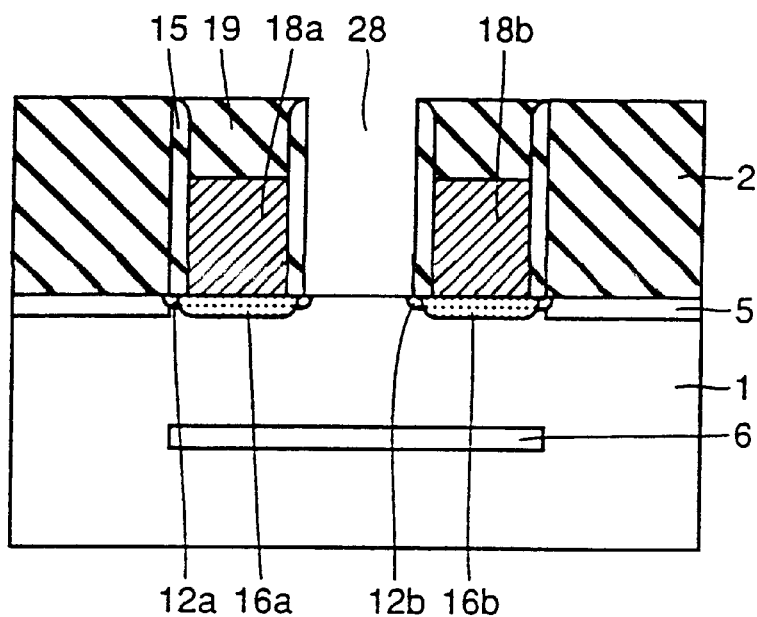
Figure 45:
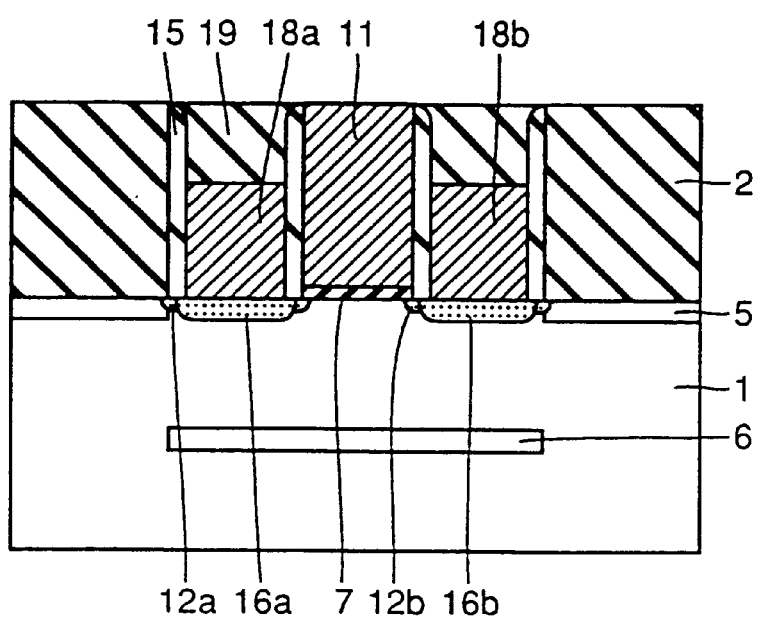

Another method of manufacturing the semiconductor device in accordance with the first embodiment will be described with reference to the figures. First, as shown in FIG. 39, silicon oxide film 2 is formed to 10000 Å by the CVD method. Then, first opening 4 is formed, and by ion implantation, channel stop layer 5 and impurity implanted layer 6 are formed. Thereafter, silicon nitride film 29 is formed by the CVD method. Then, it is planarized by polishing or etch back, so that silicon nitride film 29 is left only in the first opening 4. Then, as shown in FIG. 40, silicon nitride film 29 is removed leaving a prescribed region, by lithography and etching, and second opening 13 and third opening 14 are formed. Thereafter, by ion implantation, n⁻ source·drain regions 12a, 12b are formed. Thereafter, referring to FIG. 41, a silicon oxide film is formed to the thickness of 1000 Å by the CVD method, and by anisotropic etching, sidewall insulating film 15 is formed. Thereafter, by ion implantation, n⁺ source·drain regions 16a, 16b are formed. Thereafter, referring to FIG. 42, a polysilicon film is formed by the CVD method. Then, polysilicon film is filled by etching, so that source·drain electrodes 18a and 18b are formed. The upper surfaces of source·drain electrodes 18a and 18b are lower then the surface of silicon oxide film 2. Then, as shown in FIG. 43, the silicon oxide film 19 is formed by the CVD method, and it is planarized by polishing or etch back. Then, referring to FIG. 44, silicon nitride film 29 is selectively removed by dry etching or phosphoric acid. Then, referring to FIG. 45, a gate insulating film 7 of silicon oxide film is formed by thermal oxidation or by the CVD method. A polysilicon film is further formed by the CVD method, planarized by polishing or etch back and gate electrode 11 is formed.

Figure 46:
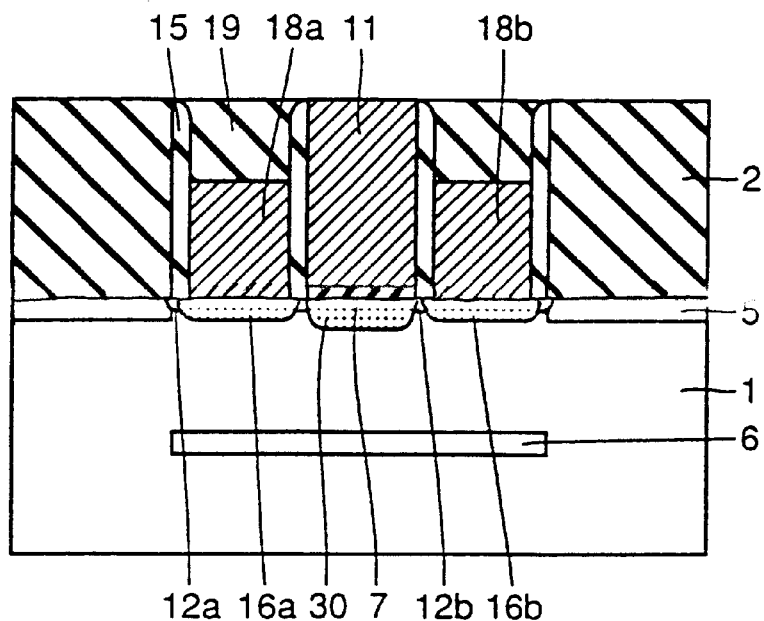

Through these steps, an impurity implanted diffusion layer 30 may be formed in self-aligned manner only in the channel region immediately below gate electrode 11 by ion implantation, for example, prior to formation of at least gate electrode 11, as shown in FIG. 46. The impurity implanted diffusion layer 30 determines the threshold value of the transistor and prevents punch through, that is, a current flow between the source·drain caused by connection between the depletion layer in the source region and depletion layer of the drain region. The impurity implanted diffusion layer 30 in this case is formed only below the gate electrode 11 and not below the source·drain regions 12a, 12b, and 16a, 16b. Therefore, increase in junction capacitance of source·drain regions 12a, 12b and 16a, 16b can be suppressed, and further, degradation of junction breakdown voltage can also be prevented. After implantation of the impurity, thermal processing for activation is performed. This thermal processing can be utilized for activating the impurity introduced to the source·drain regions 12a, 12b, 16a, 16b. Further, before implantation to the channel region, thermal processing for activating the impurity introduced to the source·drain regions 12a, 12b, 16a, 16b may be performed. Then, interconnection layers are formed in the similar manner as described with reference to the second embodiment.

In this embodiment, impurity implanted diffusion layer 30 may be formed as mentioned above. Therefore, there is such an advantage as described with reference to the step of FIG. 46, that leads to higher speed of operation of the device and reduced power consumption. With respect to the second embodiment, similar effects can be obtained by performing ion implantation following the step shown in FIG. 32 and performing impurity implanted diffusion layer 30 below the gate electrode 11. The difference between the present embodiment and the sixth embodiment is that the gate insulating film 7 and gate electrode 11 are formed after formation of source·drain electrodes 18a, 18b. More specifically, after the formation of gate insulating film 7, there is substantially only the step for forming the gate electrode 11. Therefore, there is an advantage that reliability of the gate insulating film 7 is not lowered by the damage caused during etching of silicon oxide film 26 shown in FIG. 35, etching for forming sidewall insulating film 15 shown in FIG. 36 and the damage during the step of ion implantation for forming source·drain regions 12a, 12b, 16a, 16b.

Further, it is possible to use a metal film or a metal nitride film as a gate electrode. Since thermal processing for activating the source and drain is performed prior to formation of the gate electrode, it is not necessary to perform thermal processing at a high temperature after the gate electrode is formed. Therefore, there is an additional advantage that even when a metal film or a metal nitride film which is easily oxidized by heat is used as the gate electrode, it is not oxidized.

Eighth Embodiment

Figure 47:
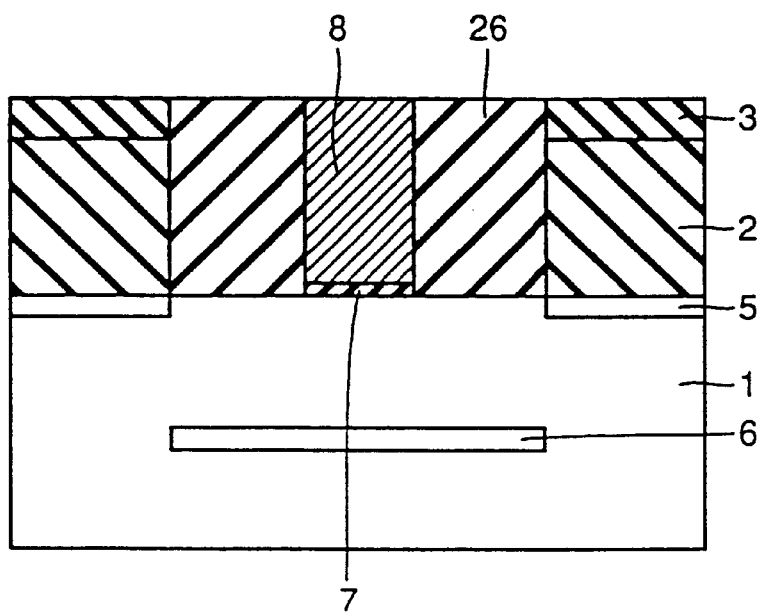
FIGS. 47 to 53 are cross sections showing successive steps in the method of manufacturing a semiconductor device in accordance with an eighth embodiment of the present invention.
Figure 48:
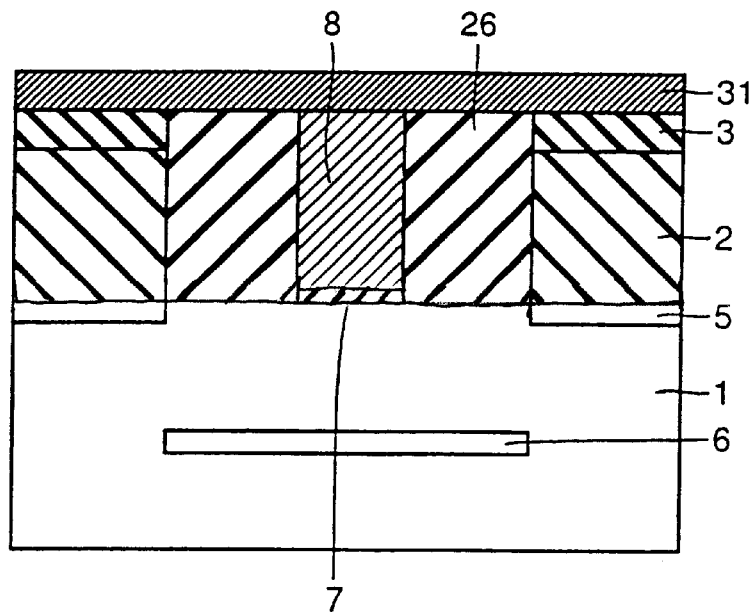
Figure 49:
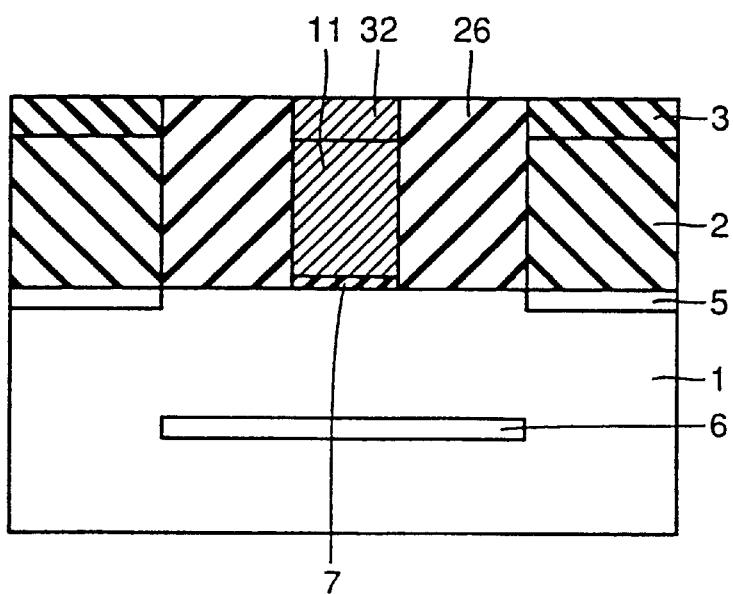

Still another method of manufacturing the semiconductor device in accordance-with the first embodiment will be described with reference to the figures. After the step shown in FIG. 32 of the sixth embodiment, polysilicon film 8 is formed by the CVD method as shown in FIG. 47, and it is planarized by polishing or etch back, and, referring to FIG. 48, metal film 31 is formed by sputtering or CVD method. As for the metal film, Ti, Co, Ni, Ta or the like may be used. Thereafter, referring to FIG. 49, lamp annealing is performed in an inert gas atmosphere such as nitrogen, Ar or the like or in vacuum at a temperature of 500 to 700° C. for one minute to cause reaction between metal film 31 and polysilicon film 8, so that metal silicide film 32 is formed. Thereafter, unreacted metal film on silicon oxide film 26 and on silicon nitride film 3 is removed by chemicals such as $H_2SO_4$, $H_2O_2$, HCl or the like. Metal silicide film 32 may be formed in self-aligned manner on the surface of gate electrode 11. If the metal film is Co, for example, CoSi or $Co_2Si$ is formed by thermal processing at 400 to 500° C. for one minute, and unreacted Co is removed by chemicals. Thereafter, thermal processing is performed at 800° C. for one minute, and $CoSi_2$ having lower resistance is formed.

Figure 50:
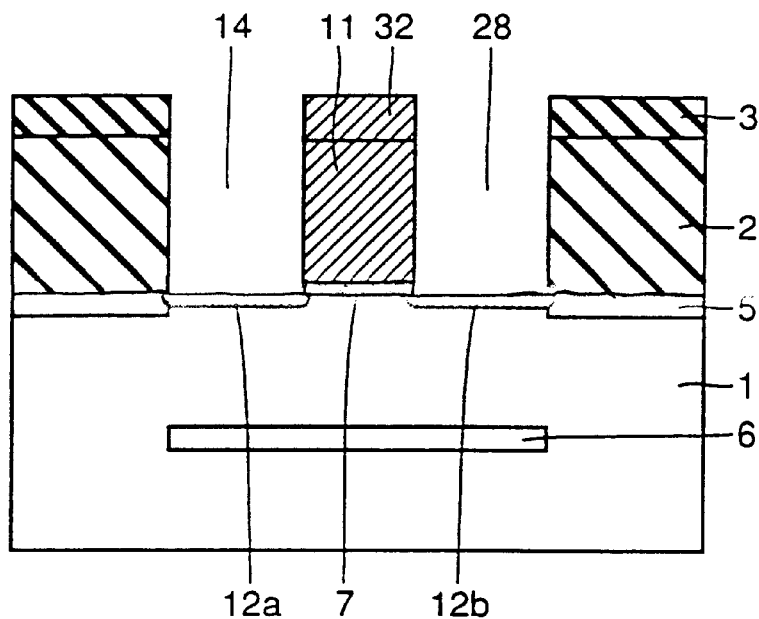
Figure 51:
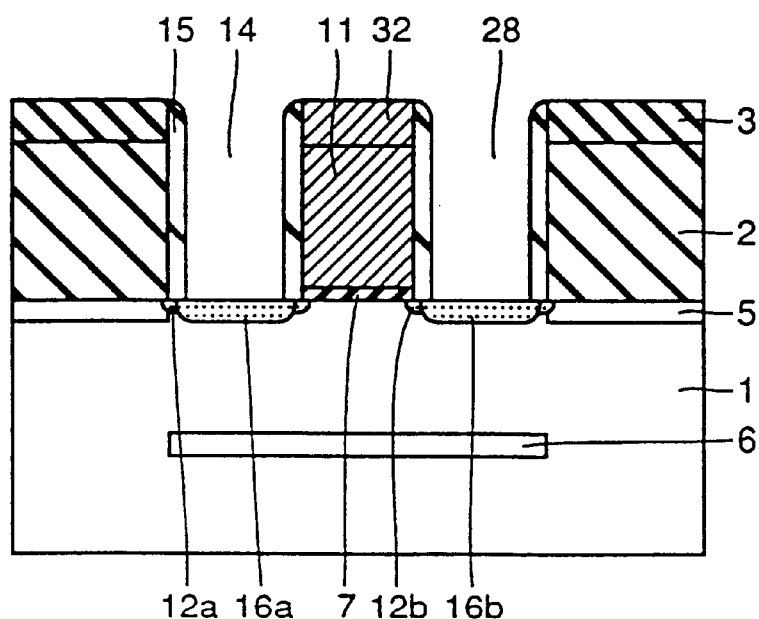
Figure 52:
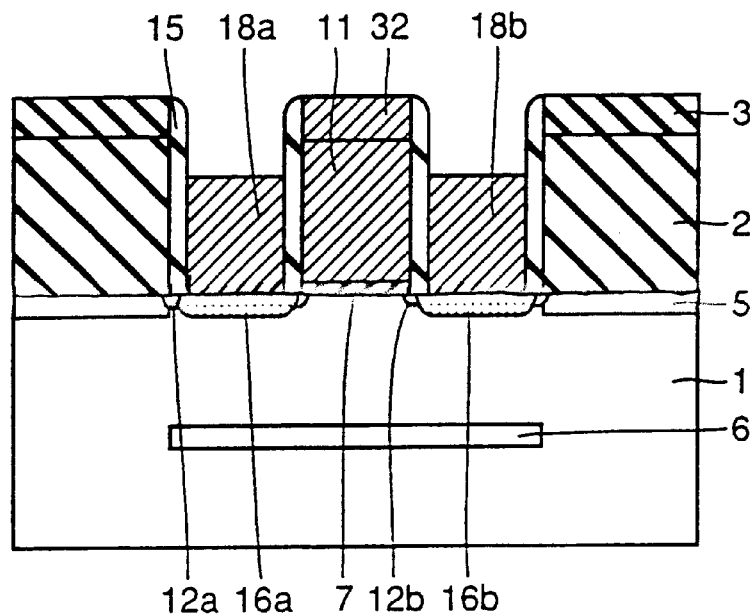
Figure 53:
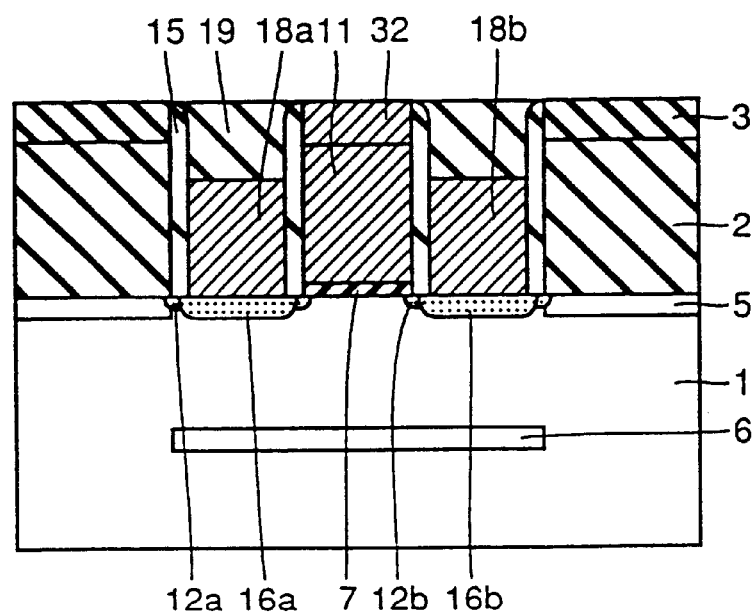

Then, referring to FIG. 50, by dry etching using $CHF_3$ gas, for example, silicon oxide film 26 is removed. Thereafter, by ion implantation, n⁻ source·drain regions 12a, 12b are formed. Then, referring to FIG. 51, a silicon oxide film is formed by the CVD method, and by anisotropic etching, sidewall insulating film 15 is formed. Thereafter, by ion implantation, n⁺ source·drain regions 16a, 16b are formed. Thereafter, referring to FIG. 52, a polysilicon film is formed, and by etch back, source·drain electrodes 18a, 18b are formed. At this point, polysilicon film is etched by $BCl_3$ or $Cl_2$. Since gate electrode 11 is protected by $CoSi_2$ which is not etched by chlorine, its shape is not changed. If $TiSi_2$ or TiN is used other than the polysilicon film, it can similarly be removed by chlorine. Then, as shown in FIG. 53, silicon oxide film 19 is formed by the CVD method, and planarized by polishing or etching. Thereafter, the first interconnection 20 is formed in the similar manner as described in the second embodiment. When the first interconnection 20 is formed by a conductive film mainly consisting of $TiSi_2$, TiN, Al or Al alloy and it is dry etched by chlorine, etching of gate electrode can be prevented. In the sixth embodiment, in order to remove silicon nitride film 27 formed on the gate electrode, it is necessary to make thicker the silicon oxide film 2 as element isolating insulating film by the thickness of silicon nitride film 27. Therefore, the aspect ratio at the time of etching of the second opening 13 for forming the gate electrode in the step shown in FIG. 32 and at the time of etching silicon oxide film 26 in the step shown in FIG. 35 can be made small.

Ninth Embodiment

It is possible to extend the polysilicon film serving as the source-drain electrodes and to use this extended polysilicon film as interconnection connected to the source-drain electrodes. In this case, the interconnection is directly formed on the semiconductor substrate, and there is p/n junction formed at the surface of the semiconductor substrate. Therefore, there arises a problem that parasitic capacitance of interconnections increases because of the junction capacitance. A method of manufacturing a semiconductor device which can solve this problem will be described with reference to the figures.

Figure 54:
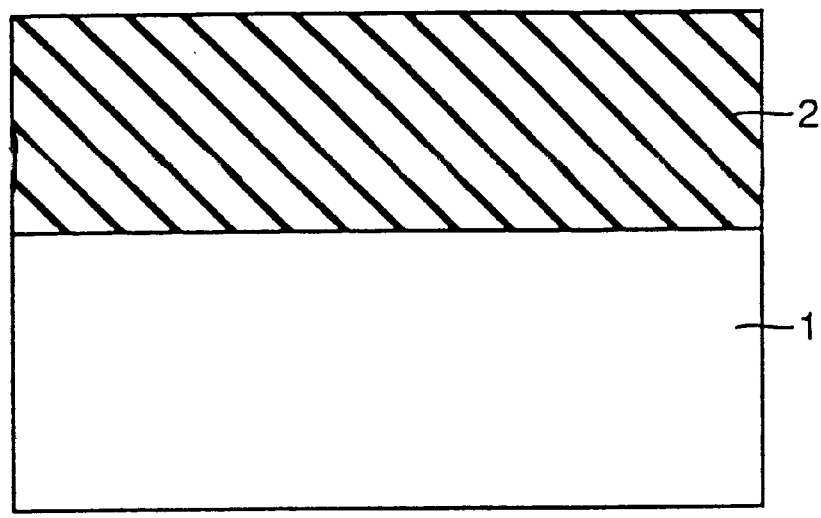
FIGS. 54 to 57 are cross sections showing successive steps in the method of manufacturing a semiconductor device in accordance with a ninth embodiment of the present invention.
Figure 55:
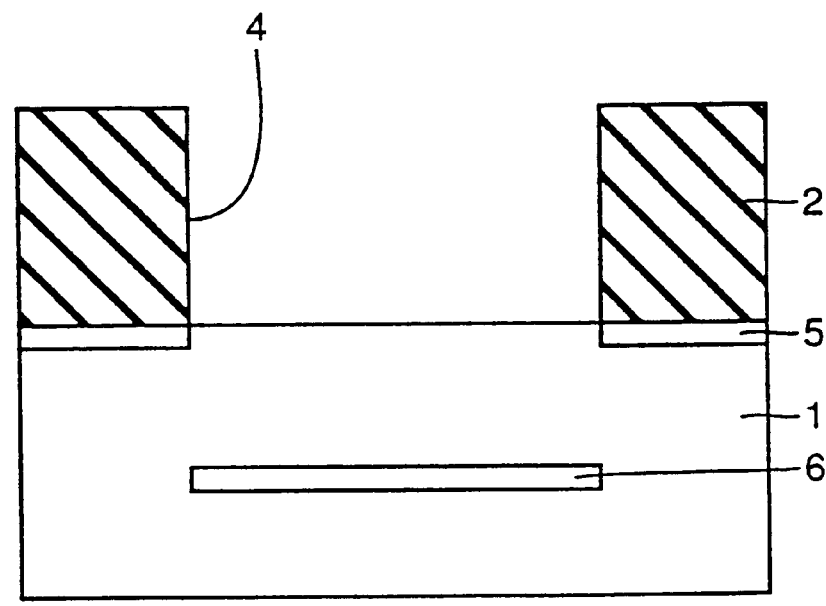
Figure 56:
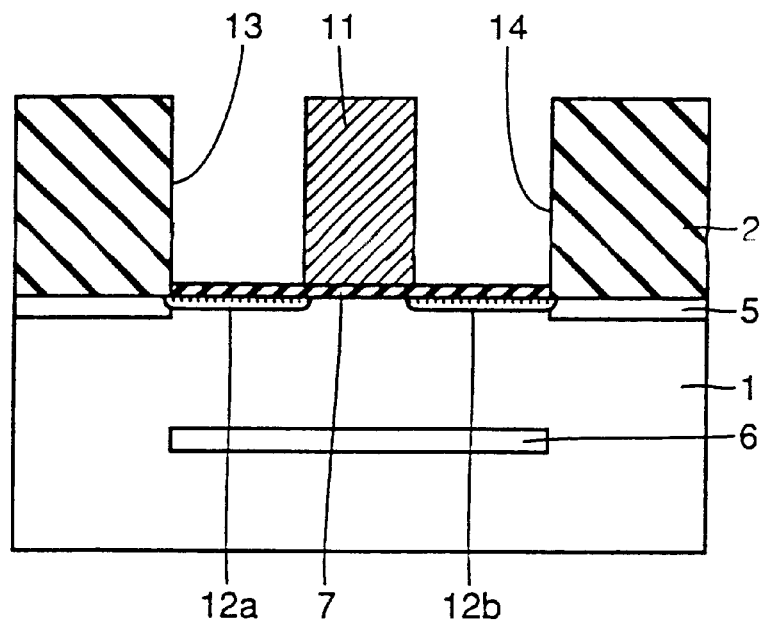
Figure 57:
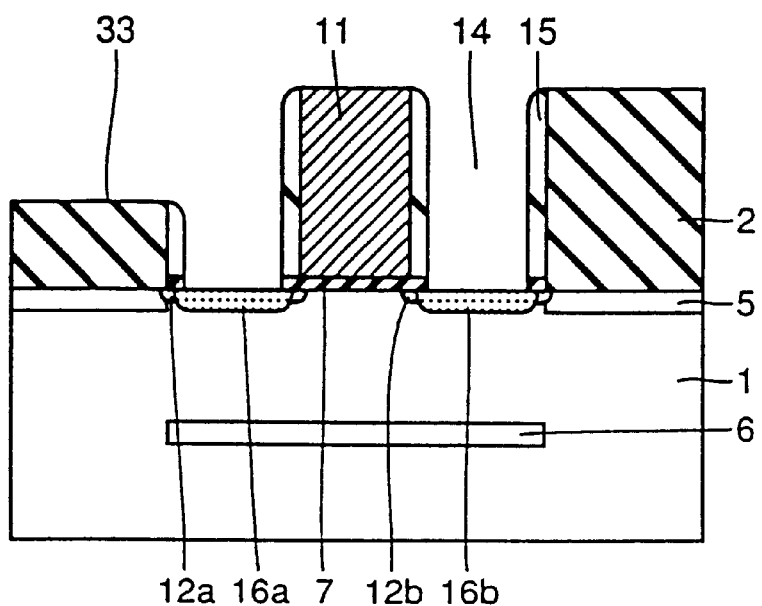
Figure 58:
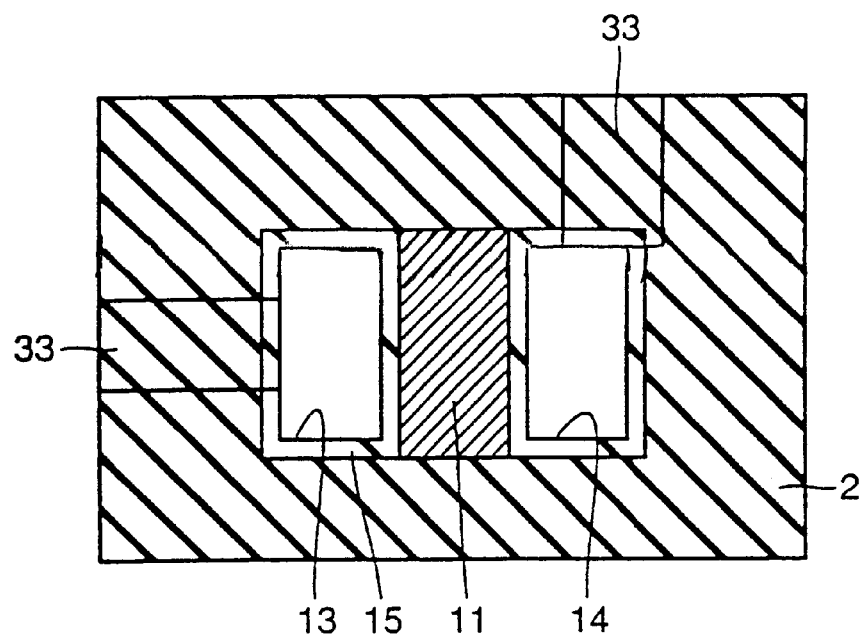
FIG. 58 is a plan view of the step shown in FIG. 57, in accordance with the ninth embodiment of the present invention.
Figure 59:
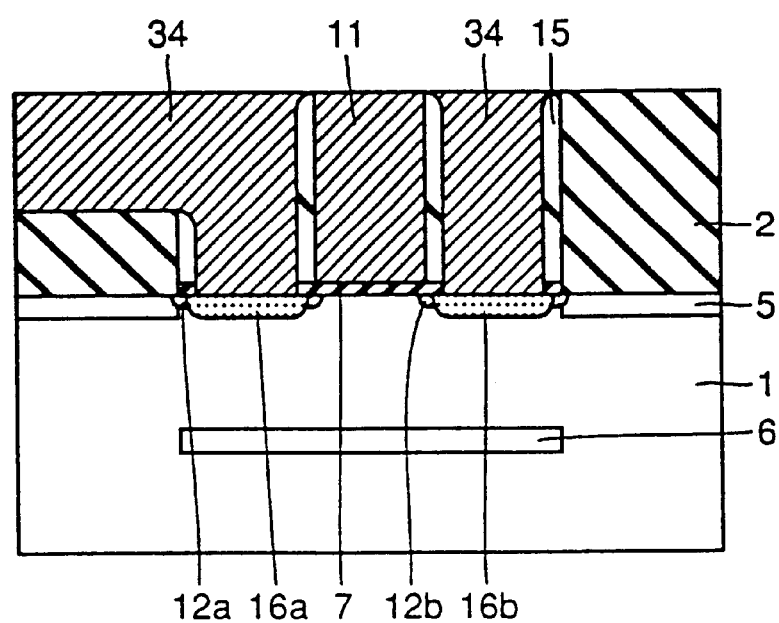
FIG. 59 is a cross section showing the step following the step of FIG. 57 in accordance with the ninth embodiment of the present invention.
Figure 60:
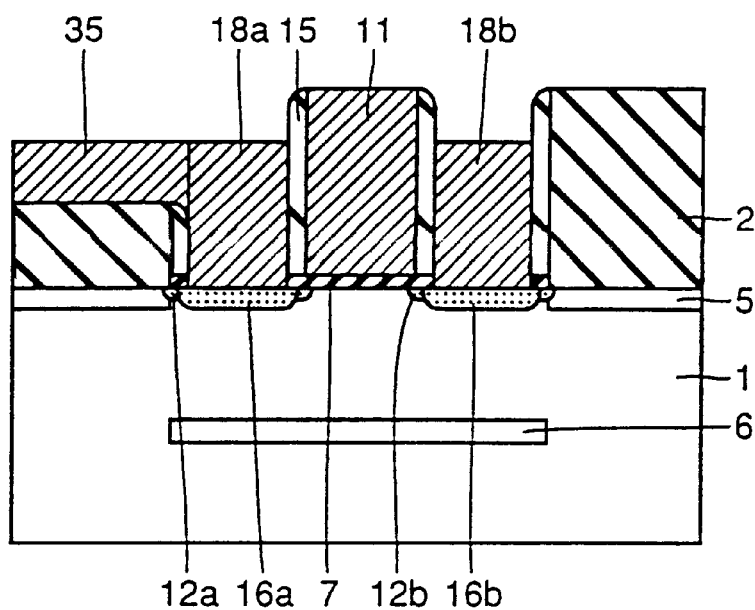
FIG. 60 is a cross section showing the step following the step of FIG. 59 in accordance with the ninth embodiment of the present invention.
Figure 61:
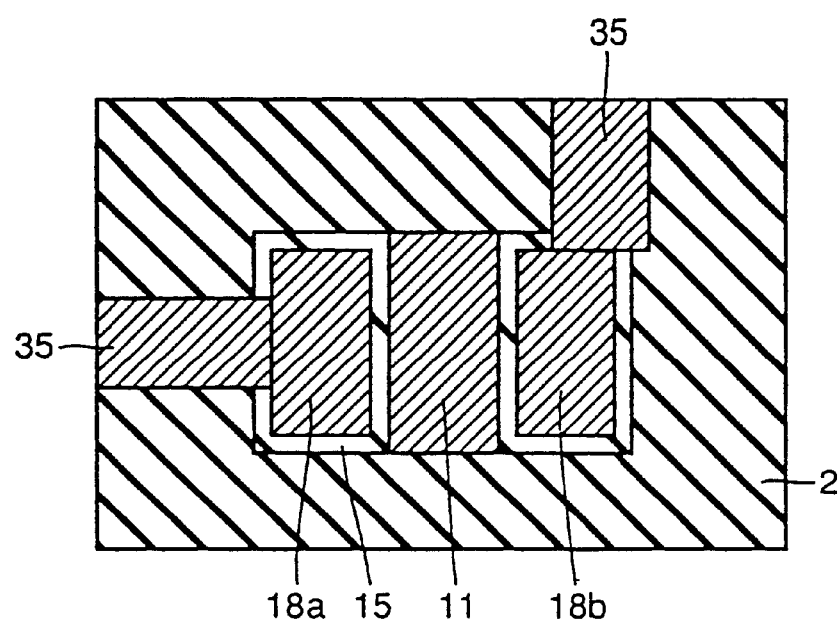
FIG. 61 is a plan view of the step of FIG. 60 in accordance with the ninth embodiment of the present invention.
Figure 62:
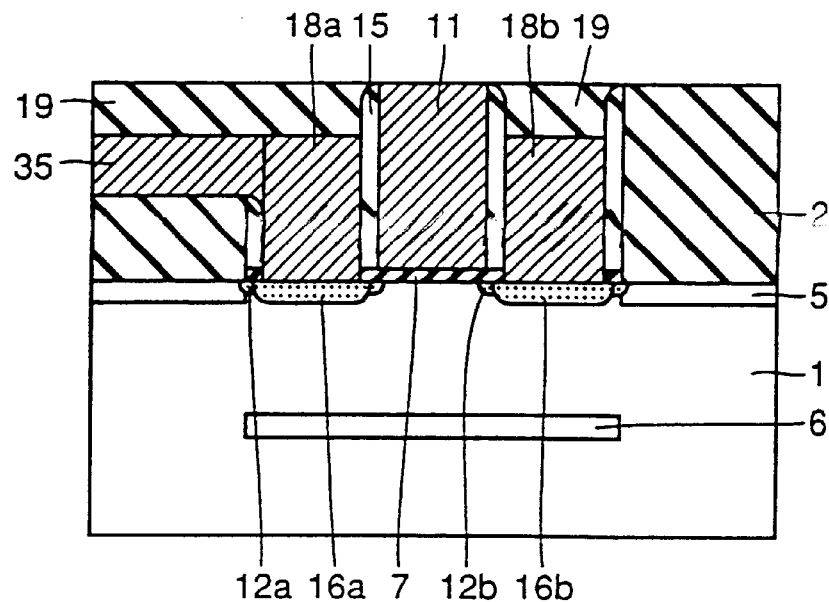
FIG. 62 is a cross section showing the step following the step of FIG. 60 in accordance with the ninth embodiment of the present invention.
Figure 63:
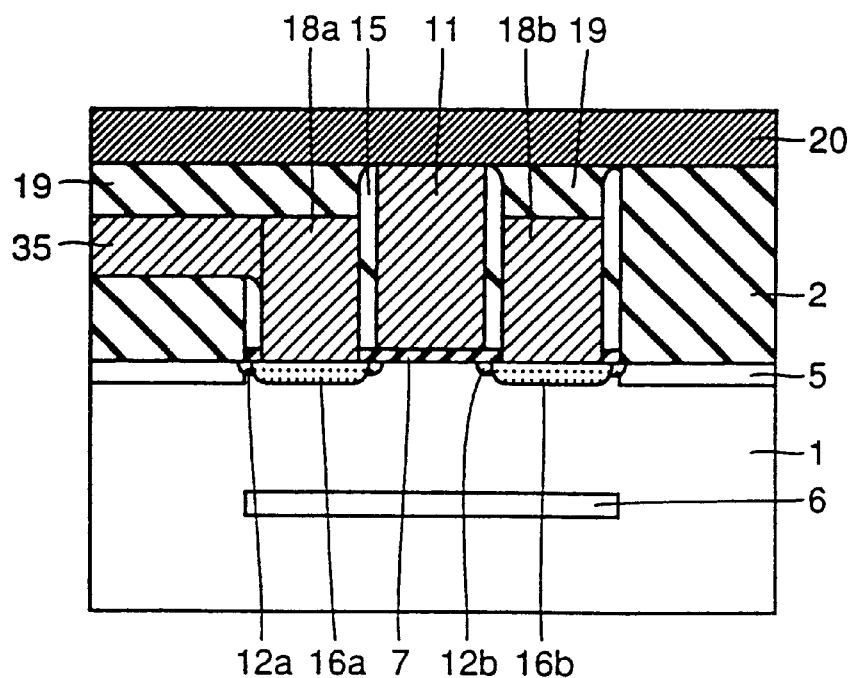
FIG. 63 is a cross section showing the step following the step of FIG. 62 in accordance with the ninth embodiment of the present invention.
Figure 64:
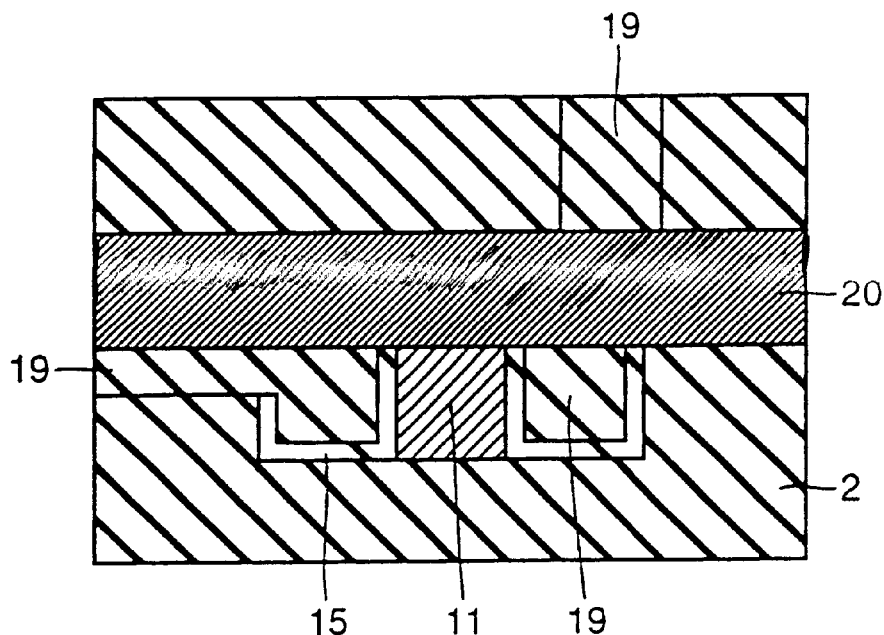
FIG. 64 is a plan view of the step shown in FIG. 63 in accordance with the ninth embodiment of the present invention.

First, referring to FIG. 54, silicon oxide film 2 is formed to the thickness of 10000 Å on semiconductor substrate 1. Then, as shown in FIG. 55, a first opening 4 is formed, and by ion implantation, channel stop layer 5 and impurity implanted layer 6 are formed. Then, referring to FIG. 56, gate insulating film 7 of silicon oxide film having the thickness of 50 Å is formed by thermal oxidation or CVD method. Then, a polysilicon film is formed by the CVD method and, by lithography and etching, gate electrode 11 is formed. Thereafter, by ion implantation, n$^+$ source-drain regions 12a, 12b are formed. Thereafter, as shown in FIG. 57, a silicon oxide film is formed to 1000 Å, and anisotropic etching is performed to form sidewall insulating film 15. Thereafter, by ion implantation, n$^+$ source-drain regions 16a, 16b are formed. Thereafter, by lithography and etching, a trench 33 having the depth of 6000 Å, for example, is formed at a portion of silicon oxide film 2 serving as the element isolating insulating film. FIG. 58 is a plan view showing this step. Then, referring to FIG. 59, a conductive film 34 consisting of a stack of TiN film having the thickness of 500 Å and a W film having the thickness of 6000 Å is formed by the CVD method. Thereafter, the film is planarized by etchback or polishing, so that the first opening 4 is filled except the trench 33 and gate electrode 11. Then, referring to FIG. 60, conductive film 34 is further etched selectively by 3000 Å, so as to reduce film thickness. If $H_2O_2$, for example, is used at this time, it is possible to etch the conductive film 34 only. FIG. 61 is a plan view showing this step. The conductive film formed in the trench constitutes an interconnection 35 which leads to source-drain electrodes. Since there is silicon oxide film 2 having the thickness of 4000 Å below the trench, increase in parasitic capacitance caused by junction capacitance of interconnection 35 formed in the trench can be suppressed. Then, referring to FIG. 62, silicon oxide film 19 is formed to 3000 Å by the CVD method, and planarized by etchback or polishing. Then, as shown in FIG. 63 or 64, a first interconnection of aluminum alloy is formed.

In the present embodiment, the conductive film formed in the trench provides an interconnection 35 connected to source-drain electrodes 18a, 18b, and since there is a silicon oxide film 2 between interconnection 35 and p/n junction at the substrate, the parasitic capacitance formed with the semiconductor substrate can be reduced as compared when silicon oxide film 2 is not provided.

Further, two interconnections 35 connected to source-drain electrodes 18a and 18b do not cross the first interconnection 20 connected to gate electrode 11 in the same plane near the electrode but these are electrically insulated from each other, and there is not a level difference.

Tenth Embodiment

In the method of manufacturing a semiconductor device described in the embodiments above, a silicon oxide film and a silicon nitride film are formed in advance as element isolating insulating films, and thereafter an opening for forming a transistor is formed. Now, it is possible that reliability of the transistor is degraded because of overetching in the step of dry etching of silicon oxide film or the silicon nitride film for forming the opening, in which step carbon or fluorine may possibly be introduced to the surface of the semiconductor at which the transistor is to be formed. In view of this problem, another method of manufacturing which can solve this problem will be described as tenth embodiment with reference to the figures, in which the order of forming the silicon oxide film and silicon nitride film as the element isolating insulating film and formation of the transistor forming region are reversed.

Figure 65:
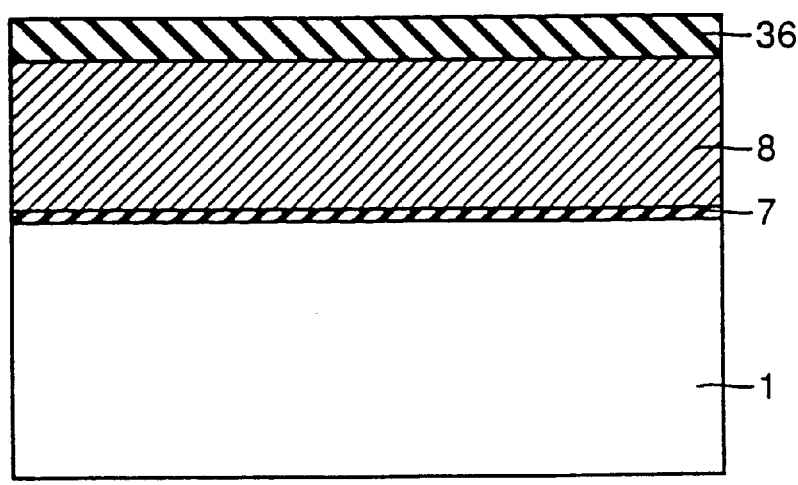
FIGS. 65 to 71 are cross sections showing successive steps in the method of manufacturing a semiconductor device in accordance with a tenth embodiment of the present invention.
Figure 66:
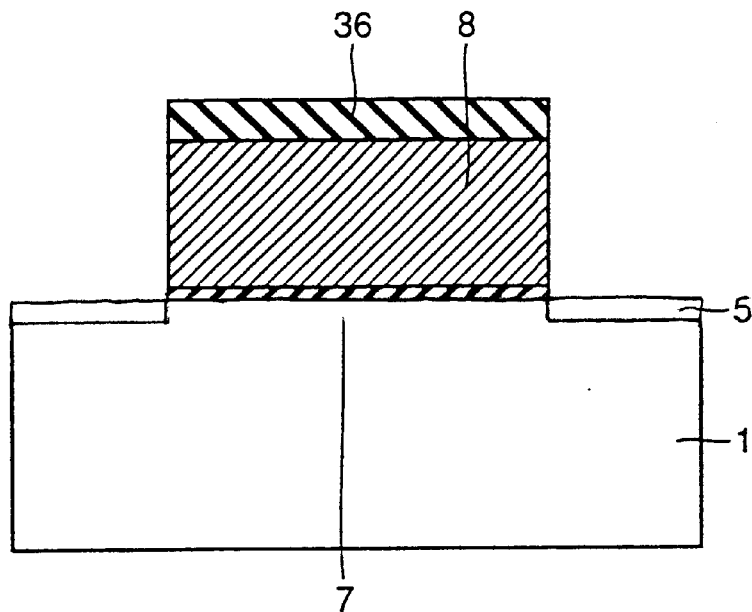
Figure 67:
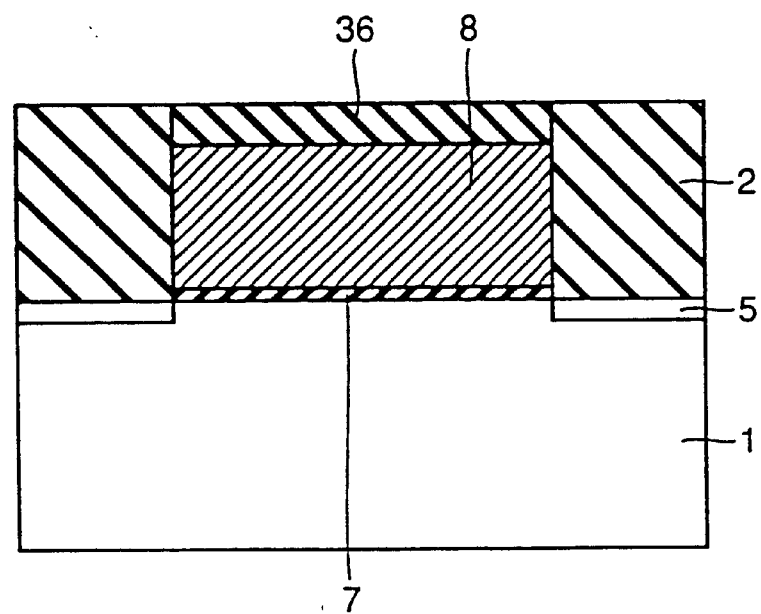
Figure 68:
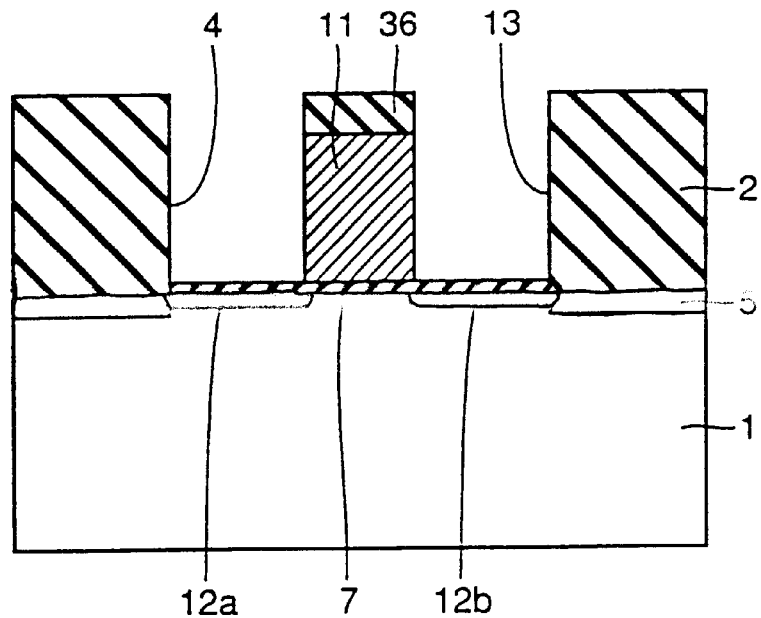
Figure 69:
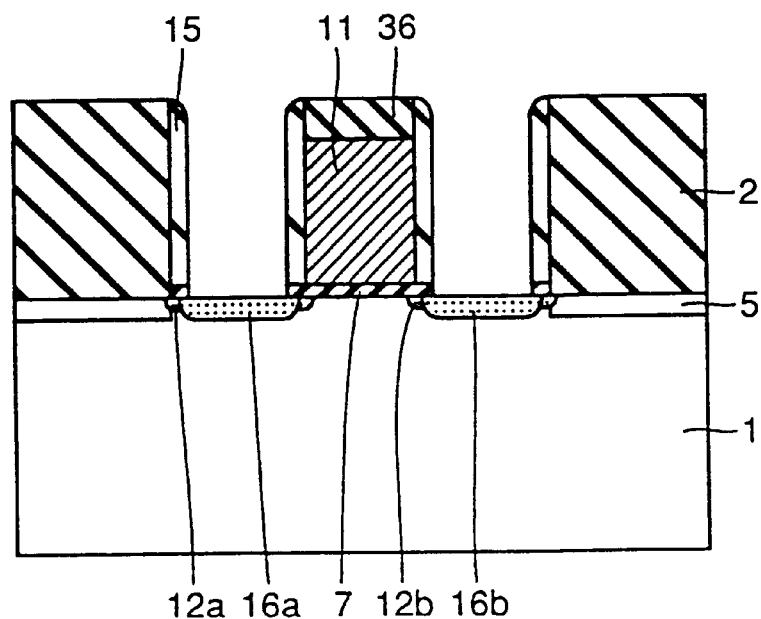
Figure 70:
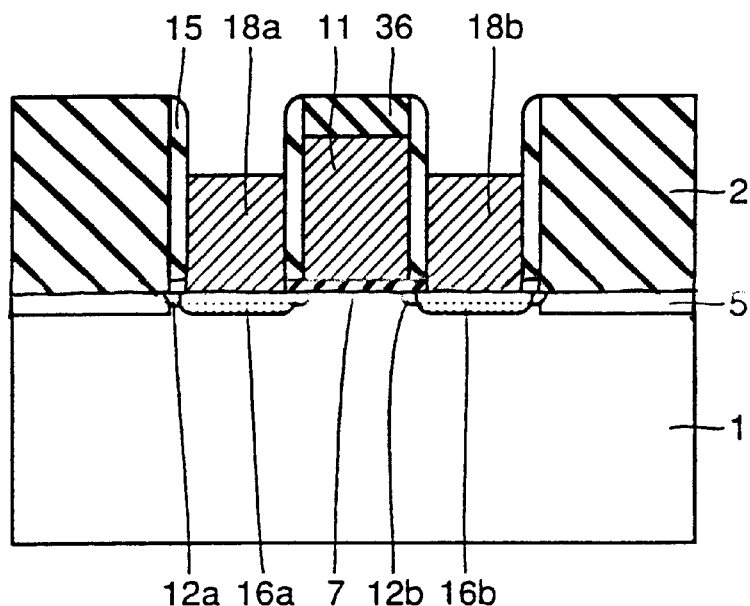
Figure 71:
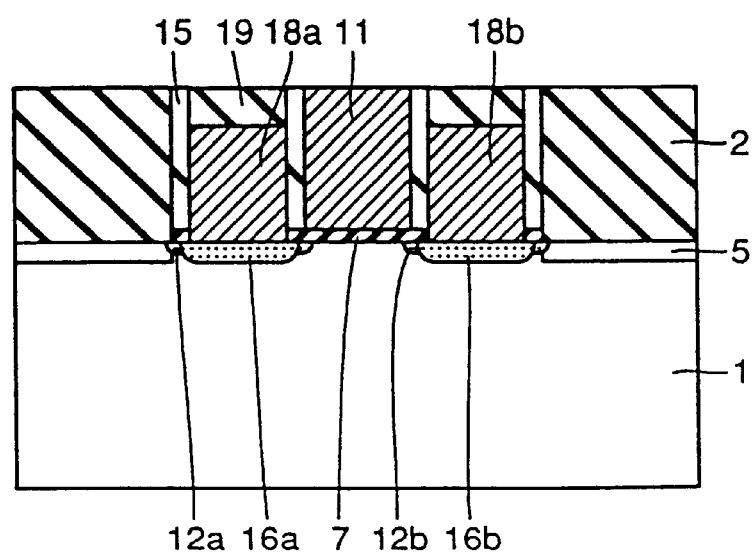

First, referring to FIG. 65, a silicon oxide film is formed by thermal oxidation or CVD method to the thickness of 100 Å as gate insulating film 7 on semiconductor substrate 1. Then, polysilicon film 8 is formed to 4000 Å by the CVD method. Thereafter, silicon nitride film 36 is formed to 1000 Å by the CVD method. Thereafter, referring to FIG. 66, silicon nitride film 36 and polysilicon film 8 are removed, leaving transistor forming region, by lithography and etching. Channel stop layer 5 is formed by ion implantation. Then, referring to FIG. 67, silicon oxide film 2 is formed by the CVD method. It is planarized by polishing or etchback, so that silicon oxide film 2 on silicon nitride film 36 is removed. Then, referring to FIG. 68, silicon nitride film 36 and polysilicon film 8 left on the transistor forming region are etched by lithography and etching, and gate electrode 11 is formed. Then, by ion implantation, n source-drain regions 12a, 12b are formed. Thereafter, as shown in FIG. 69, sidewall insulating film 15 and n source-drain regions 16a, 16b are formed in the similar manner as described with reference to FIG. 10. Then, as shown in FIG. 70, source-drain electrodes 18a, 18b are formed in the similar manner as described with reference to FIG. 12. Then, referring to FIG. 71, the silicon nitride film on gate electrode 11 is removed. Silicon oxide film 19 is formed by the CVD method. Thereafter, silicon oxide film 19 is etched so that the height thereof becomes flush with the surface of gate electrode 11 by polishing or etchback. Thereafter, interconnections are formed in the similar manner as described with reference to the second embodiment.

Eleventh Embodiment

In the above described embodiments, the first interconnection 20 is etched on gate electrode 11. If the material of gate electrode 11 is silicon or titanium silicide, a gas containing chlorine $Cl_2$, $BCl_3$ or $SiCl_4$ is used as dry etching gas for etching Al alloy thereon. At this time, silicon or titanium silicide is also etched by chlorine, and hence there is a possibility of overetching, that is, there is a possibility that gate electrode 11 is etched. This is because the etch rate of the gate electrode becomes higher than the etch rate of interconnections because of loading effect as the area of the region of gate electrode 11 is several times smaller than the area of the interconnections when the interconnection material is etched and gate electrode 11 is exposed.

A method of manufacturing a semiconductor device which can solve this problem will be described as the eleventh embodiment, with reference to the figures.

Figure 38:
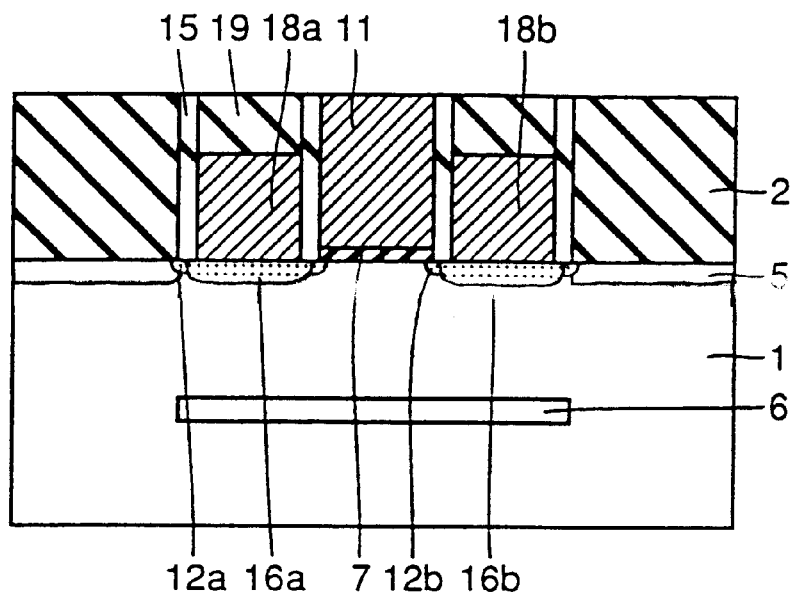
Figure 72:
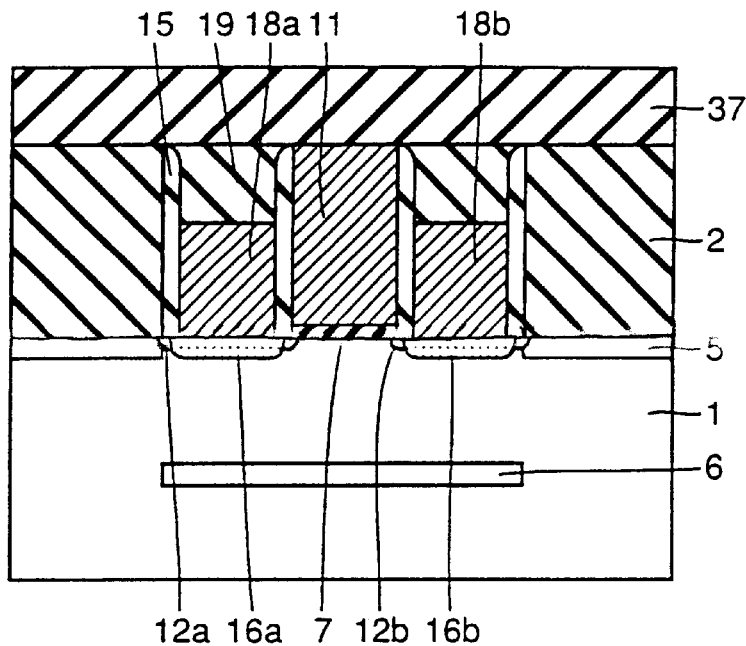
FIGS. 72 and 73 are cross sections showing successive steps in the method of manufacturing a semiconductor device in accordance with an eleventh embodiment of the present invention.

On a transistor of which gate electrode 11 has its surface exposed and its source-drain electrodes 18 covered by an insulating film as shown in FIG. 38, a silicon oxide film 37 is formed to the thickness of 2000 Å by the CVD method as shown in FIG. 72. In the step prior to the formation of silicon oxide film 19, silicon oxide film 37 may be formed and planarized by polishing, for example. As the LSIs come to be miniaturized, the width of the source-drain regions becomes narrower. If the width becomes 0.5 μm or smaller, it can be filled by silicon oxide film 37 having the thickness half the width of this region, and hence planarization becomes possible simply by film formation, which means that the step of planarization by polishing, for example, becomes unnecessary. This is also an advantage of the present invention in which element isolating insulating films with steep level difference is formed.

Figure 73:
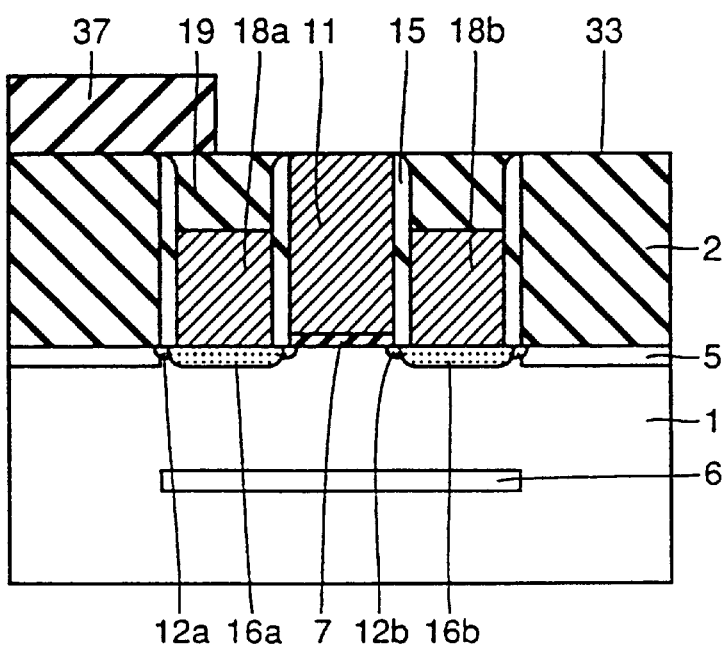
Figure 74:
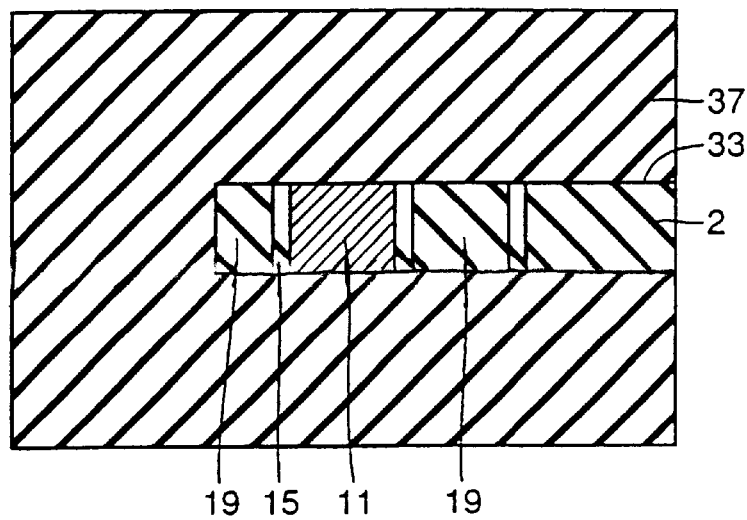
FIG. 74 is a plan view showing the step of FIG. 73 in accordance with the eleventh embodiment of the present invention.
Figure 75:
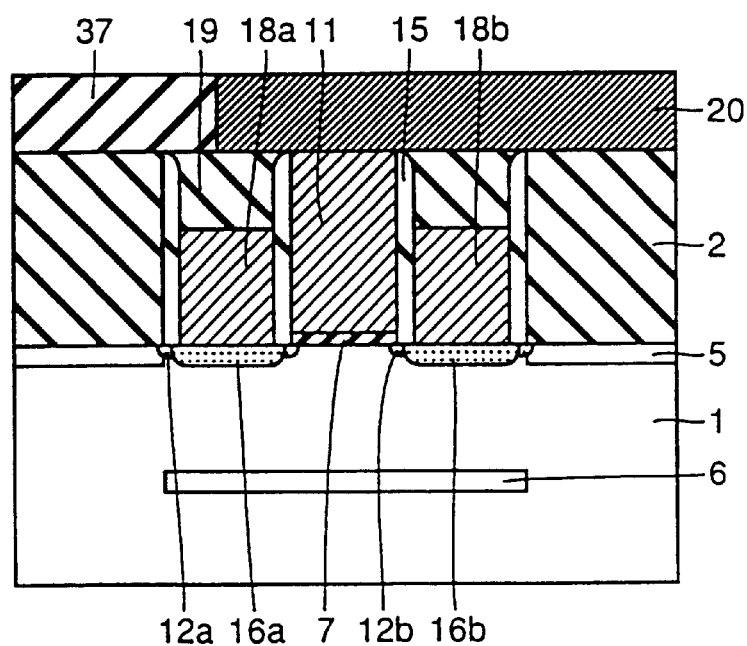
FIG. 75 is a cross section showing the step following the step of FIG. 73 in accordance with the eleventh embodiment of the present invention.

Then, as shown in FIG. 73, a trench 33 is formed in silicon oxide film 37 by lithography and etching. The depths of trench 33 is made the same as the film thickness of silicon oxide film 37. FIG. 74 is a plan view of this step. Then, referring to FIG. 75, a metal film such as an aluminum alloy is formed by the CVD method or by sputtering. Other than aluminum alloy, a metal silicide film such as $TiSi_2$ may be formed. Then, trench 33 is filled by the metal film by polishing or etchback, and the first interconnection 20 is formed.

By this method, the second interconnection 20 can be formed without etching gate electrode 11. Further, when trench 33 is etched, the etch rate is not abruptly increased because of the decrease in the etching area. Further, referring to FIG. 13, when the silicon oxide film and the silicon nitride film exist at the uppermost surfaces, loading effect can be prevented when etching is done under such a condition in that etch rates of these materials are approximately the same. For example, by using a mixed gas containing $CHF_3$, $CF_4$ and $H_2$ as an etching gas and by changing the ratio of mixture of the gas, etch rates of silicon oxide film and silicon nitride film can be adjusted so that the etch rates are the same. Referring to FIG. 73 or 74, by forming sidewall insulating film 15 and silicon oxide film 19 as silicon nitride films, optimizing dry etching conditions and selectively etching silicon oxide film 37, etching of sidewall insulating film 15 and the silicon nitride film by overetching can more effectively be prevented. Therefore, undesirable short-circuit defect between the first interconnection 20 and source-drain electrodes 18a, 18b can be prevented.

Twelfth Embodiment

Figure 76:
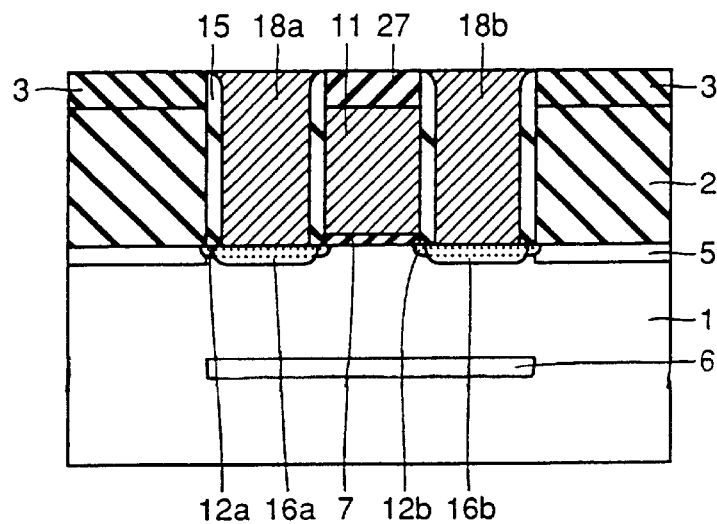
FIG. 76 is a cross section showing a semiconductor device in accordance with a twelfth embodiment of the present invention.

A structure of a semiconductor device in which the upper surface of the gate electrode is positioned higher than the upper surfaces of the source-drain electrodes has been described in the above embodiments. However, the semiconductor device of the present invention is not limited to this and the upper surfaces of source-drain electrodes 18a, 18b may be higher than the upper surface of gate electrode 11, as shown in FIG. 76. In such a structure also, similar effects as described in the first embodiment can be obtained.

Thirteenth Embodiment

Figure 77:
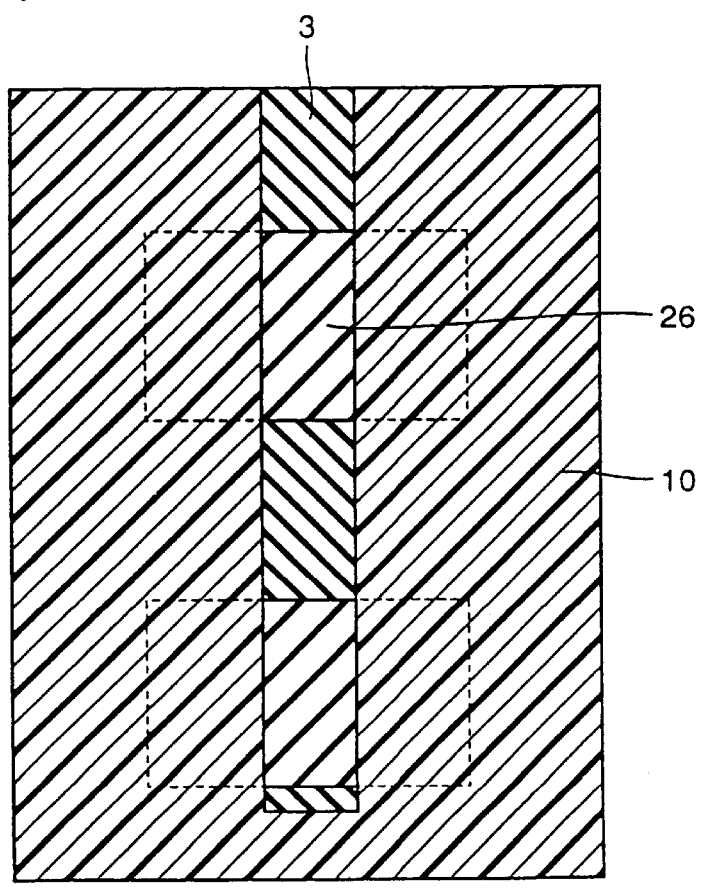
FIGS. 77 to 82 are plan views and cross sections showing successive steps in the method of manufacturing a semiconductor device in accordance with a thirteenth embodiment of the present invention.

An example of a method of manufacturing the semiconductor device described with reference to the twelfth embodiment will be described, as a thirteenth embodiment. After the step shown in FIG. 31 described with reference to the sixth embodiment, a photoresist mask 10 having a pattern of gate electrode and interconnection is formed, as shown in FIG. 77. Then, referring to FIG. 78, anisotropic etching is performed using photoresist mask 10 as a mask, and trench 33 and second opening 13 are formed. FIG. 79 is a cross section taken along the line A—A of FIG. 78, and FIG. 80 is a cross section taken along the line B—B.

Figure 78:
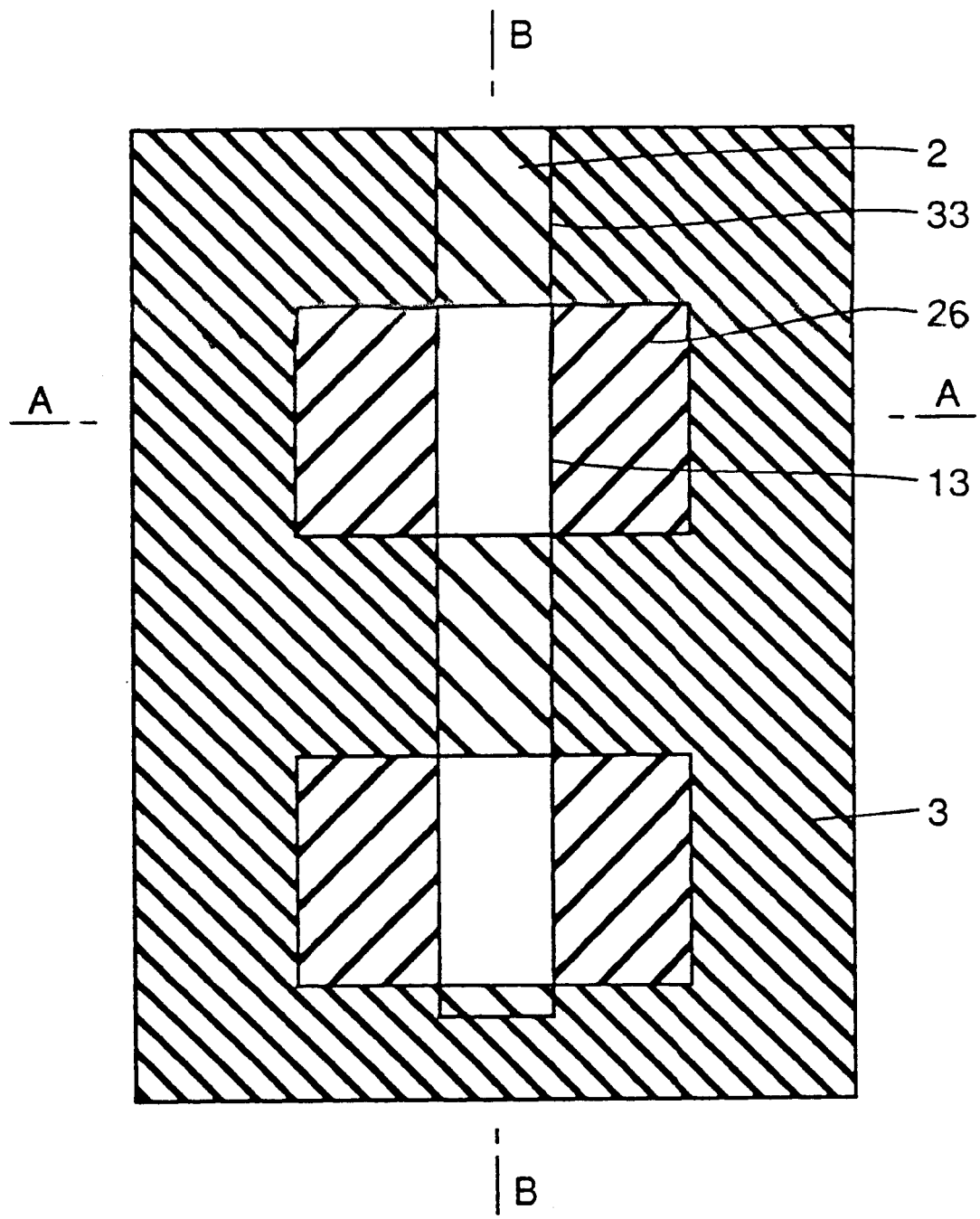
Figure 79:
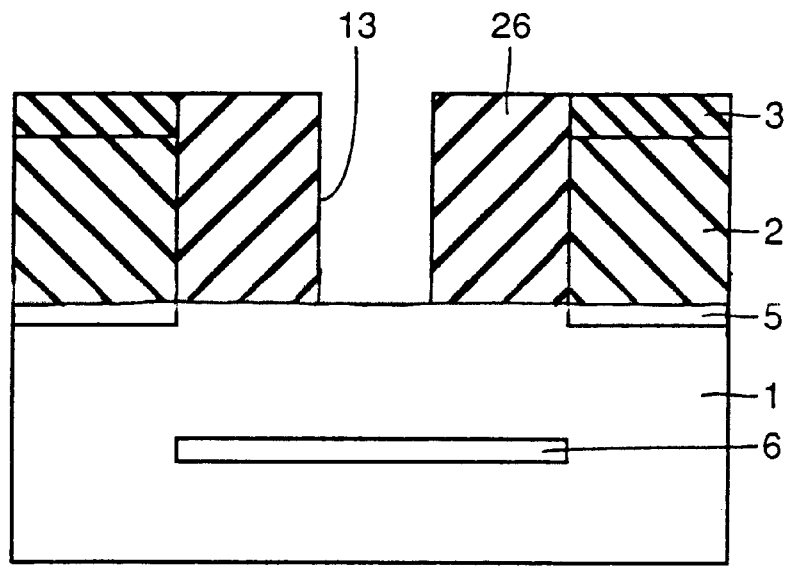
Figure 80:
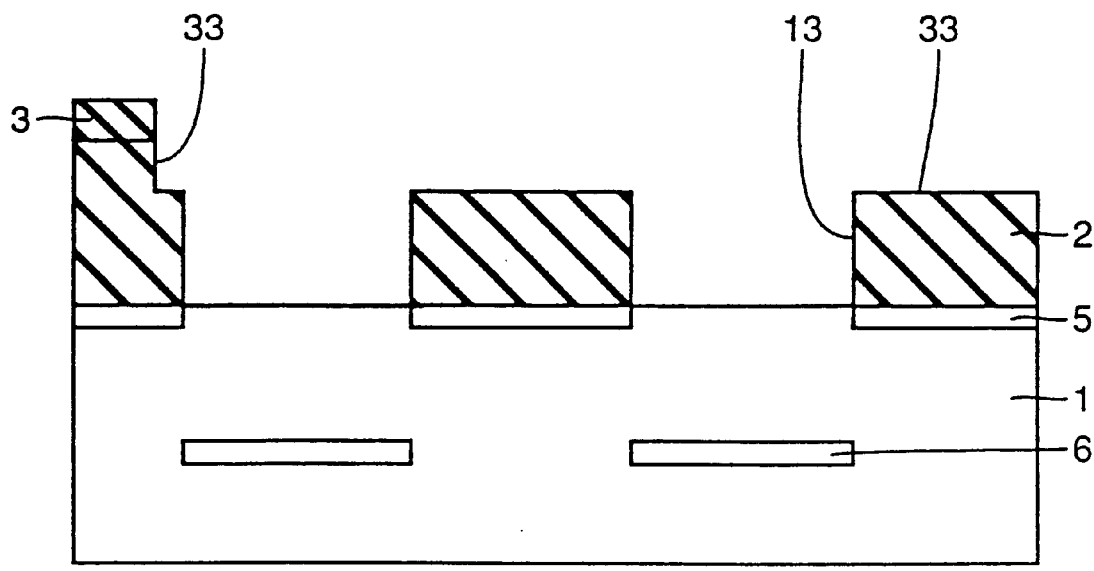

Referring to FIGS. 78 to 80, the thickness of silicon oxide film 2 is 4000 Å, the thickness of silicon nitride film 3 is 1500 Å, and the thickness of silicon oxide film 26 is 5500 Å. Etching is performed under such a condition that ratio of etching rates of silicon nitride film and silicon oxide film is 1:3. By the time the silicon oxide film is etched by 6000 Å, that region of silicon oxide film 26 having the thickness of 5500 Å filled in the first opening 4 which is not covered by the photoresist mask 10 is completely removed, and second opening 13 is formed. Of the stacked films consisting of silicon oxide film 2 and silicon oxide film 3, silicon nitride film 3 is etched by 1500 Å and silicon oxide film 2 is etched by 1500 Å from above at that region which is not covered by photoresist mask 10.

As for the etching gas, a mixed gas of $CF_4$ and $H_2$ or $CHF_3$ is used. By adjusting the ratio of mixture, etch selectivity of silicon oxide film and silicon nitride film can be adjusted.

Figure 33:
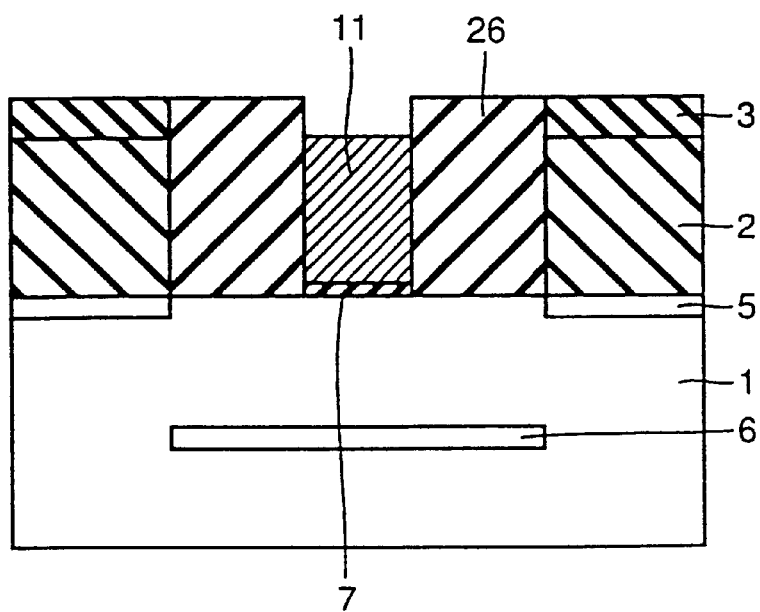
Figure 34:
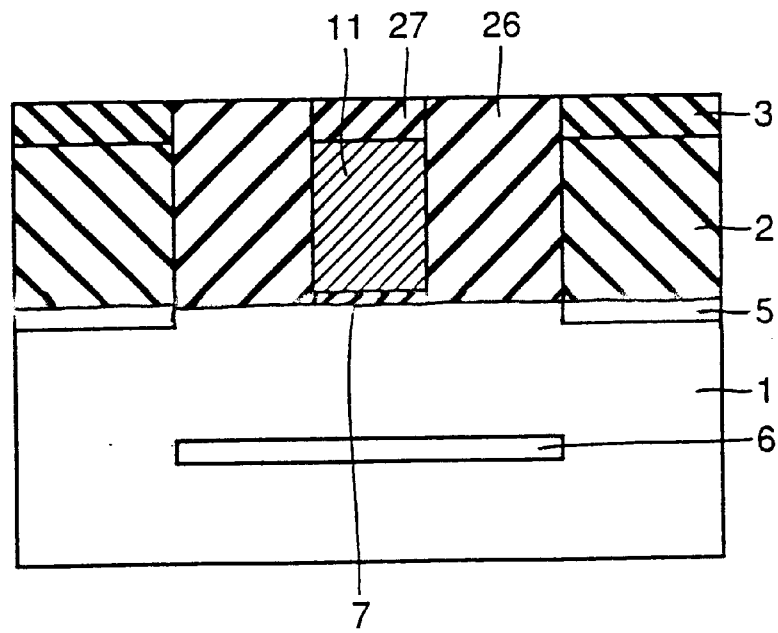
Figure 35:
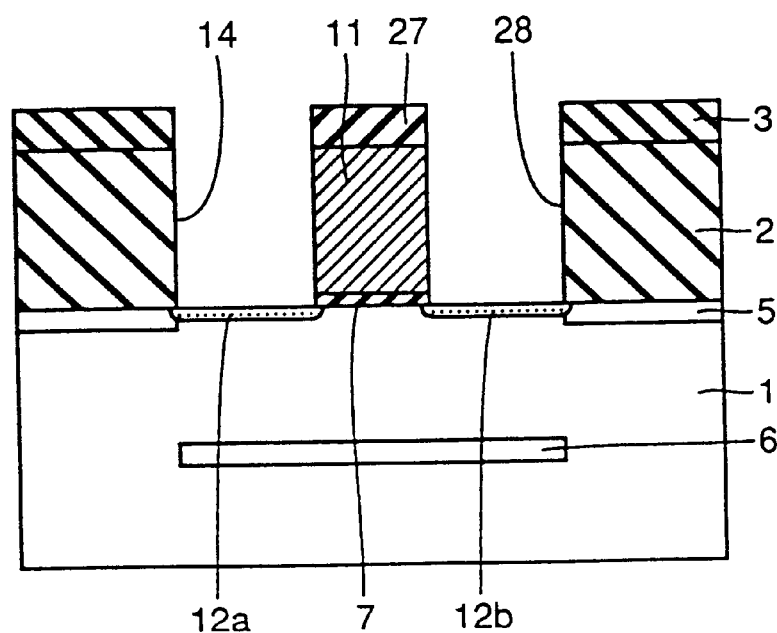
Figure 36:
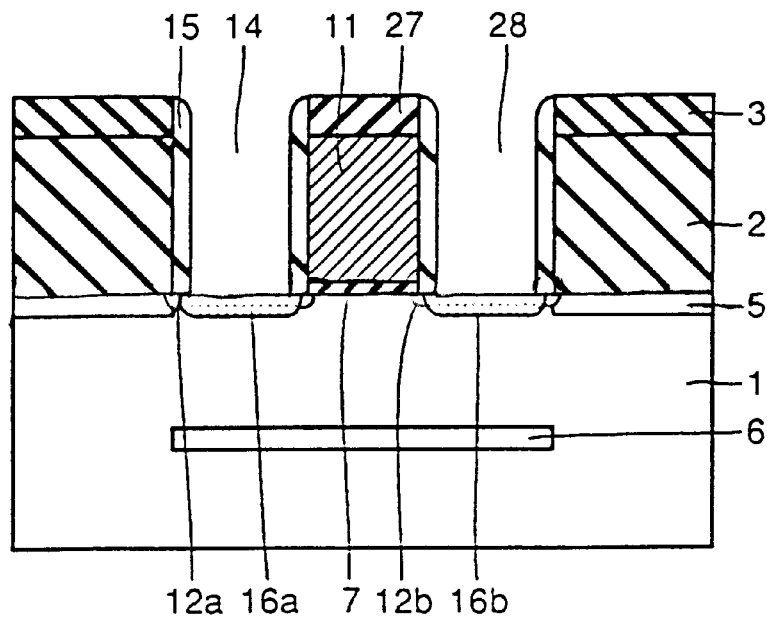
Figure 37:
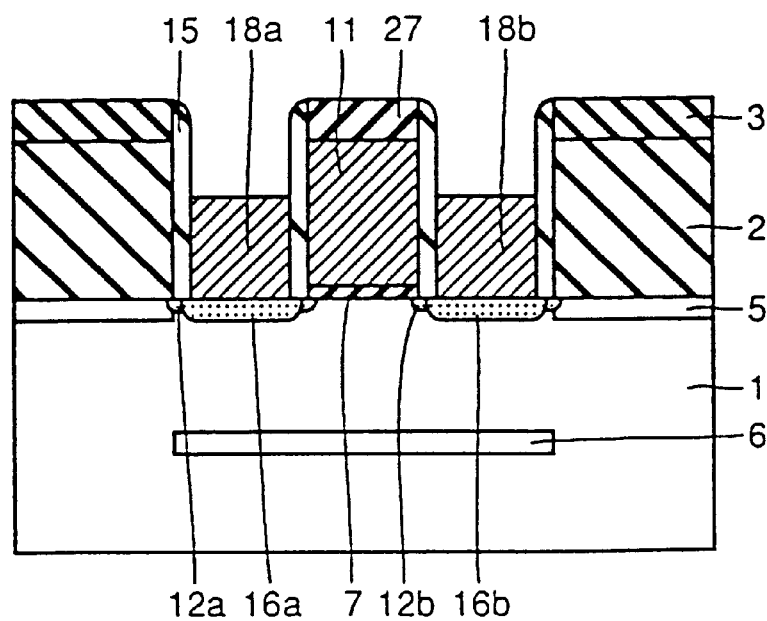
Figure 81:
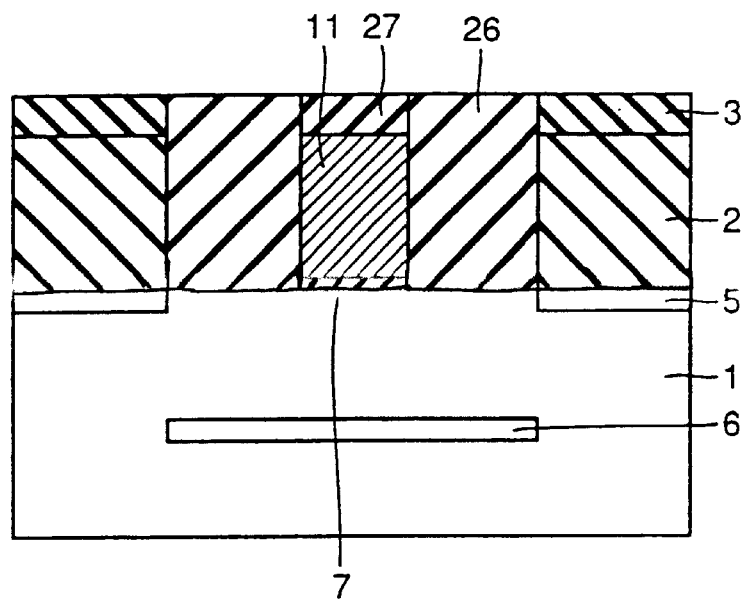
Figure 82:
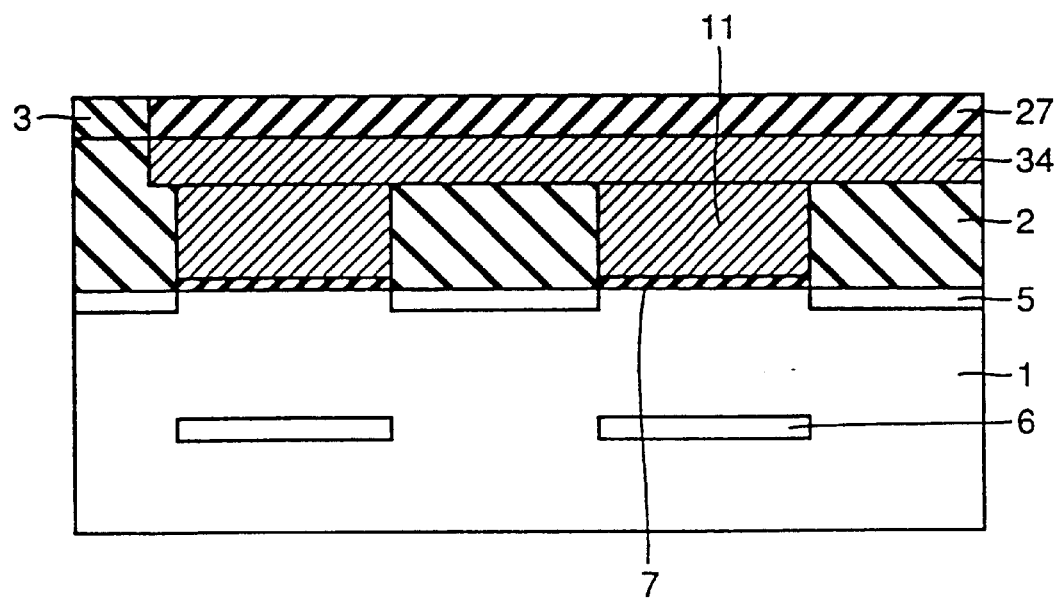
Figure 83:
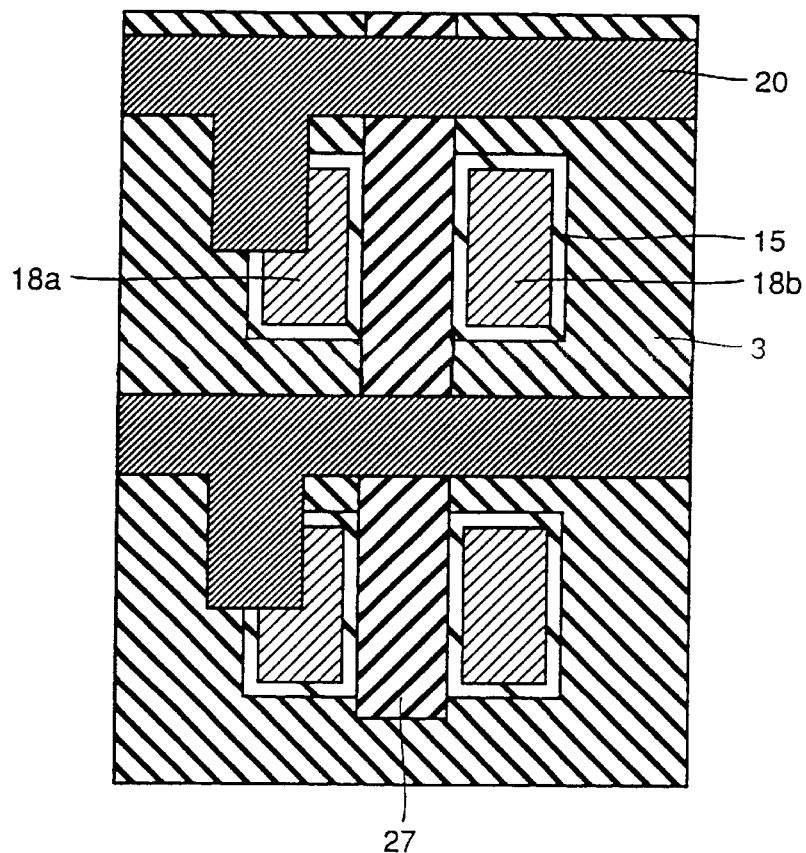
FIG. 83 is a plan view showing the step following the step of FIG. 81 or 82 in accordance with the thirteenth embodiment of the present invention.

Then, referring to FIG. 81, gate electrode 11 and silicon nitride film 27 are formed in the same manner as shown in FIGS. 33 and 34. FIG. 82 is a cross section taken along the line B—B of FIG. 78 corresponding to this step. As shown in FIG. 82, conductive film 34 filled in the trench is formed simultaneously with gate electrode 11. Then, referring to FIG. 76, source-drain electrodes 18a, 18b are formed in the same manner as shown in FIGS. 35 to 37. However, in this case, different from the step shown in FIG. 37, the surfaces of source-drain electrodes 18a, 18b are positioned approximately flush with the surface of silicon nitride film 3. More specifically, after the polysilicon film is formed, it is planarized by etchback or polishing, the polysilicon film on silicon nitride film 3 is removed, and the process for reducing film thickness of polysilicon film by subsequent etching is not performed. Thereafter, the first interconnection 20 is formed as shown in FIG. 83.

In this case, the first interconnection 20 is connected not to the gate electrode 11 but to source-drain electrodes 18a, 18b. Conductive film 34 as the interconnection connected to gate electrode 11 constitutes a word line, for example, and the first interconnection 20 constitutes the bit line. Different from the example in which gate electrode 11 is in contact with the first interconnection 20, the interconnection connected to the source or drain electrode must have such a pattern arrangement that is not in contact with the other electrode. In this manner, a semiconductor device with reduced level difference can be formed.

Though a method of forming partially applying the manufacturing method of the sixth embodiment has been described, the structure can be readily formed by partially using any of the manufacturing methods described in the second, seventh and tenth embodiments.

Fourteenth Embodiment

Figure 84:
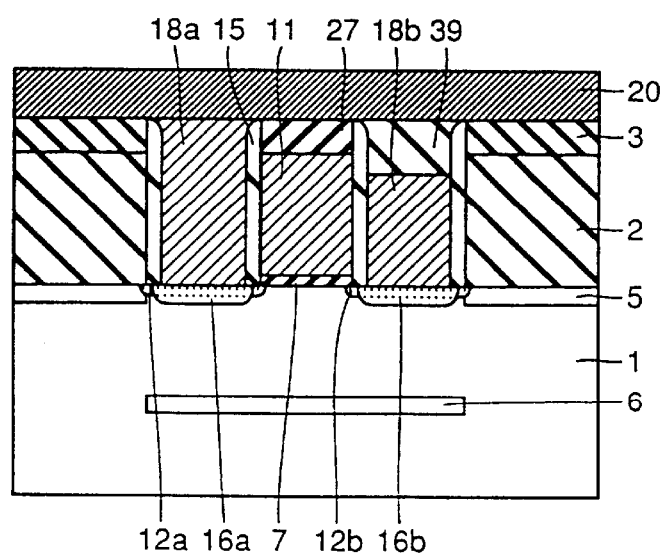
FIG. 84 is a cross section showing the semiconductor device in accordance with a fourteenth embodiment of the present invention.

The upper surfaces of the gate electrode and the source-drain electrodes may be positioned at mutually different positions. More specifically, the upper surface of one of the sourceedrain electrodes 18a, 18b may be higher than the upper surface of the other electrode, and the upper surface of gate electrode 11 may be positioned between the upper surfaces of source-drain electrodes 18a, 18b, as shown in FIG. 84.

In this structure also, similar effect as described in the first embodiment can be obtained.

Fifteenth Embodiment

Figure 85:
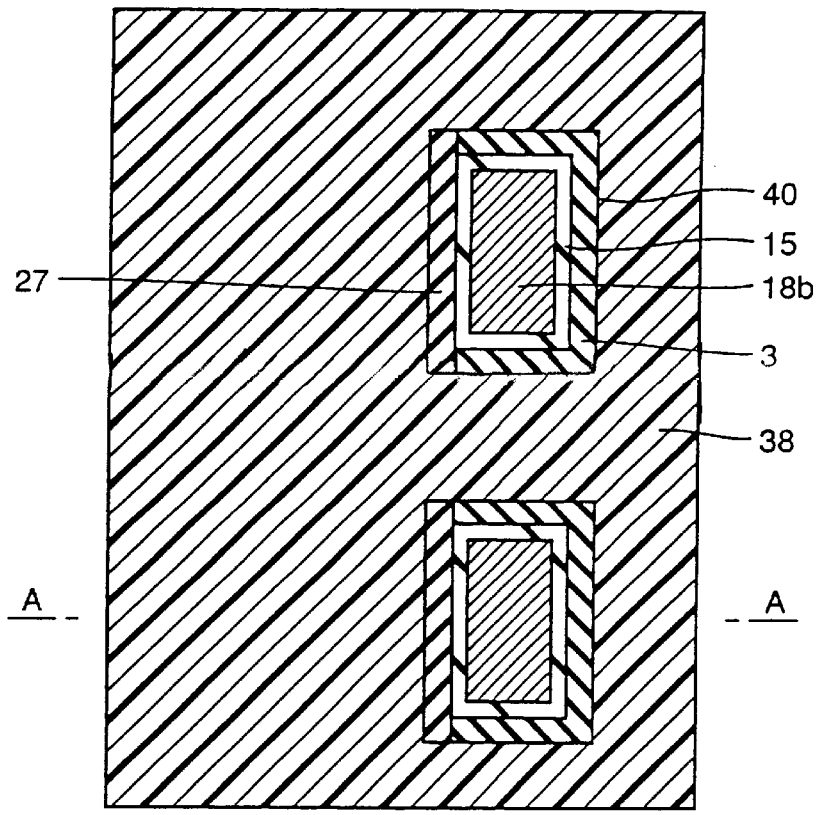
FIG. 85 is a plan view showing a step in a method of manufacturing a semiconductor device in accordance with a fifteenth embodiment of the present invention.
Figure 86:
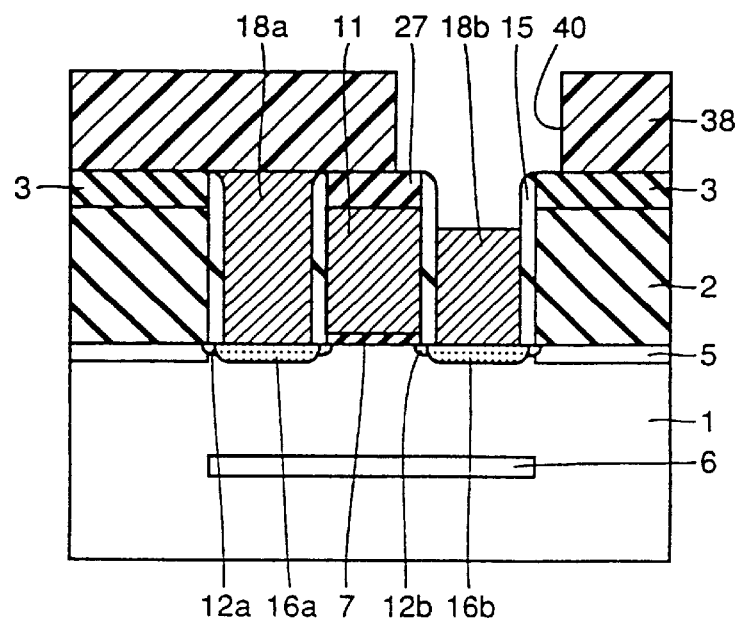
FIGS. 86 and 87 are cross sections showing successive steps following the step of FIG. 85 in the fifteenth embodiment of the present invention.
Figure 87:
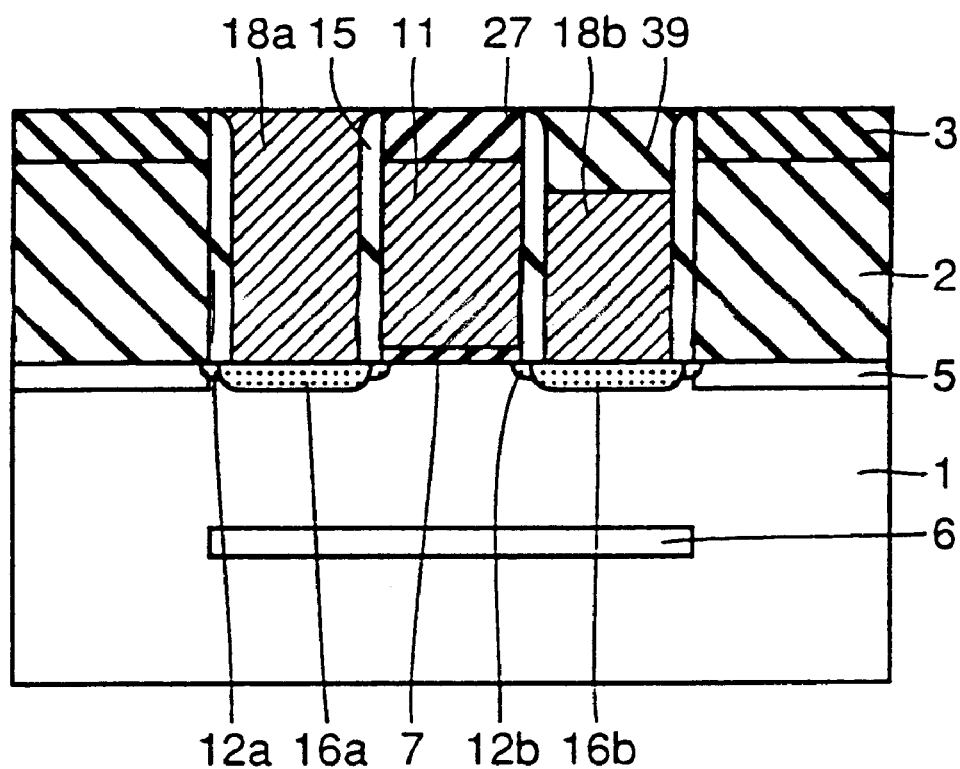
Figure 88:
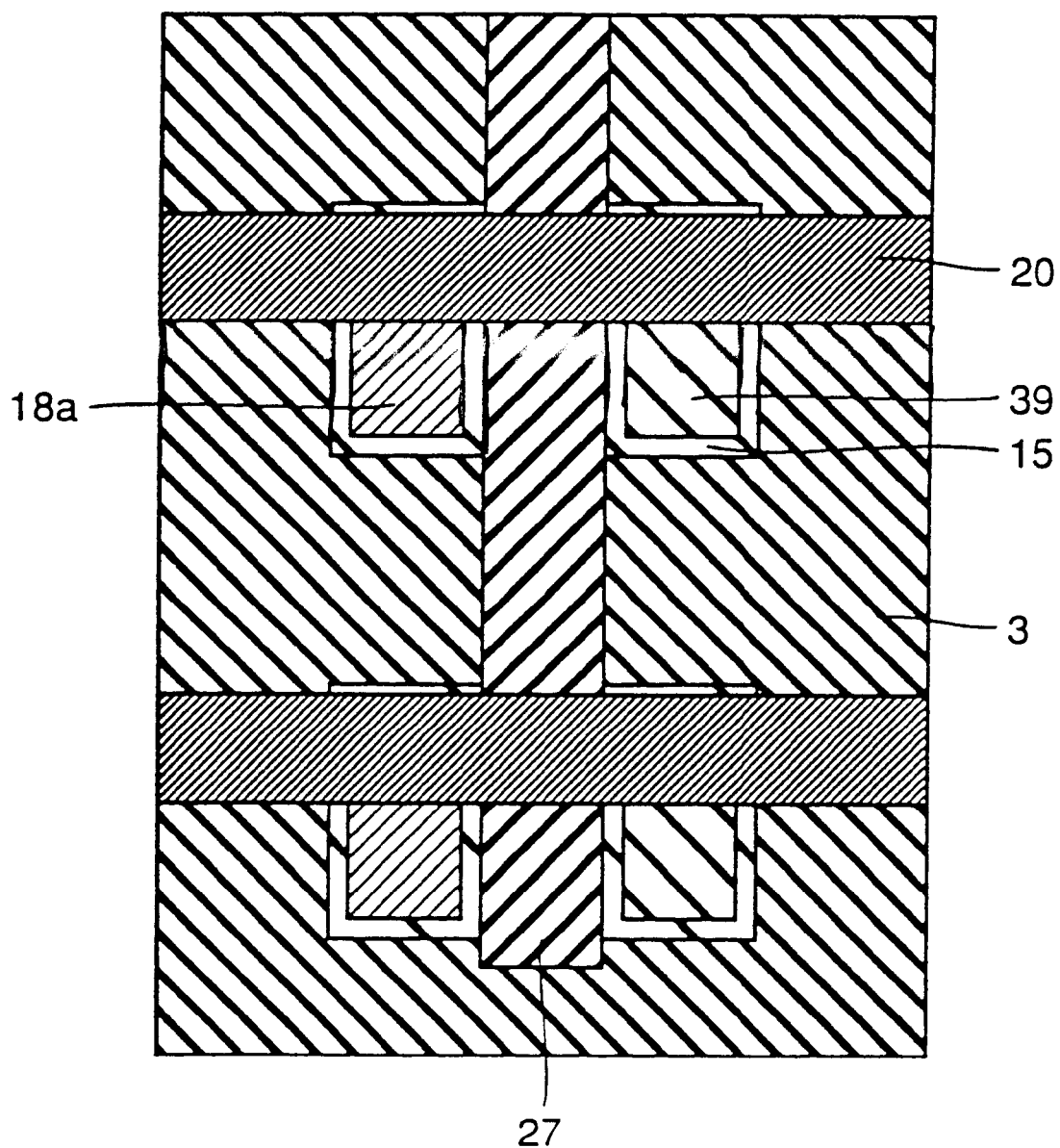
FIG. 88 is a plan view showing the step following the step of FIG. 87 in accordance with the fifteenth embodiment of the present invention.

An example of a method of manufacturing the semiconductor device shown in the fourteenth embodiment will be described with reference to the figures. Following the step shown in FIG. 76, photoresist mask 38 is formed as shown in FIG. 85. Photoresist mask 38 provides an opening 40 on one of the source-drain electrodes 18a, 18b. Thereafter, referring to FIG. 86, anisotropic etching is performed using photoresist mask 38 as a mask, so as to reduce film thickness of source-drain electrode 18b by 2000 Å. FIG. 86 is a cross section taken along the line A—A of FIG. 85 in this step. Then, referring to FIG. 87, a silicon oxide film is formed to the thickness of 3000 Å, and by etchback or polishing, silicon oxide film 39 is left only on the source-drain electrode 18b of which film thickness is reduced. Thereafter, the first interconnection 20 is formed. FIG. 88 is a plan view of this step.

In the twelfth and thirteenth embodiments, the interconnection which is in contact with one of the source-drain electrodes must have such a pattern arrangement that is not in contact with the other electrode. However, in this structure, silicon oxide film 39 is formed on the other electrode as shown in FIG. 88, and hence degree of integration in the horizontal direction can be improved.

Though the step following the step shown in FIG. 76 has been described, the semiconductor device can be formed easily up to this step by partially employing any of the manufacturing methods described with reference to the second, sixth, seventh and tenth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming a first insulating film on a semiconductor substrate;
   forming a first opening in said first insulating film to expose a surface of said semiconductor substrate;
   forming first to third electrodes insulated from each other by a sidewall insulating film in said first opening;
   positioning an upper surface of any of said first to third electrodes different from upper surfaces of the other electrodes;
   forming an interconnection layer connected to the upper surface of any of said first to third electrodes;
   forming a second insulating film below said first electrode;
   forming impurity diffusion layers of a prescribed conductivity type in said semiconductor substrate below said second and third electrodes;
   after forming said first opening, forming said second insulating film on said semiconductor substrate;
   forming a first conductive film on said second insulating film only in said first opening;
   etching said first conductive film to form a first electrode and second and third openings to expose the surface of said semiconductor substrate; and
   forming a second conductive film only in said second and third openings.

2. The method of manufacturing a semiconductor device according to claim 1, comprising the step of:
   positioning the upper surface of said first electrode higher than the upper surfaces of said second and third electrodes, and making approximately flush the upper surfaces of said second and third electrodes.

3. The method of manufacturing a semiconductor device according to claim 1, comprising the steps of:
   after forming said first opening, forming a third insulating film only in said first opening;
   forming a second opening to expose the surface of said semiconductor substrate at a prescribed region of said third insulating film;
   forming said second insulating film on the exposed surface of said semiconductor substrate;
   forming the first conductive film only in said second opening and forming said first electrode;
   after forming said first electrode, removing said third insulating film left in said first opening and forming third and fourth openings;
   forming the sidewall insulating film on a side surface of said first electrode;
   forming a second conductive film only in said third and fourth openings and forming the second and third electrodes; and
   after forming said second and third electrodes, forming a fourth insulating film on said second and third electrodes and connecting said interconnection layer to said first electrode.

4. A method of manufacturing a semiconductor device comprising the steps of:
   forming a first insulating film on a semiconductor substrate;
   forming a first opening in said first insulating film to expose a surface of said semiconductor substrate;
   forming first to third electrodes insulated from each other by a sidewall insulating film in said first opening;
   positioning an upper surface of any of said first to third electrodes different from upper surfaces of the other electrodes;
   forming an interconnection layer connected to the upper surface of any of said first to third electrodes;
   forming a second insulating film below said first electrode;
   forming impurity diffusion layers of a prescribed conductivity type in said semiconductor substrate below said second and third electrodes;
   positioning the upper surface of said first electrode higher than the upper surfaces of said second and third electrodes, and making approximately flush the upper surfaces of said second and third electrodes;
   after forming said first opening, forming a third insulating film only in said first opening;
   forming second and third openings to expose the surface of said semiconductor substrate at a prescribed region of said third insulating film;
   forming a first conductive film only in said second and third openings and forming the second and third electrodes;
   after forming said second and third electrodes, removing said third insulating film left in said first opening and forming a fourth opening;
   forming the sidewall insulating film on side surfaces of said second and third electrodes; and
   forming a second conductive film only in said fourth opening and forming the first electrode.

5. A method of manufacturing a semiconductor device comprising the step of:

forming a first insulating film on a semiconductor substrate;

forming a first opening in said first insulating film to expose a surface of said semiconductor substrate;

forming first to third electrodes insulated from each other by a sidewall insulating film in said first opening;

positioning an upper surface of any of said first to third electrodes different from upper surfaces of the other electrodes;

forming an interconnection layer connected to the upper surface of any of said first to third electrodes;

forming a second insulating film below said first electrode;

forming impurity diffusion layers of a prescribed conductivity type in said semiconductor substrate below said second and third electrodes; and positioning the upper surface of said first electrode lower than upper surfaces of said second and third electrodes and making approximately flush the upper surfaces of said second and third electrodes.

6. A method of manufacturing a semiconductor device, comprising the steps of:

forming a first insulating film on a semiconductor substrate;

forming a first opening in said first insulating film to expose a surface of said semiconductor substrate;

forming first to third electrodes insulated from each other by a sidewall insulating film in said first opening;

positioning an upper surface of any of said first to third electrodes different from upper surfaces of the other electrodes;

forming an interconnection layer connected to the upper surface of any of said first to third electrodes;

forming a second insulating film below said first electrode;

forming impurity diffusion layers of a prescribed conductivity type in said semiconductor substrate below said second and third electrodes; and positioning the upper surface of said first electrode between the upper surfaces of said second and third electrodes.

7. A method of manufacturing a semiconductor device, comprising the steps of:

forming a first conductive film on a semiconductor substrate;

removing said first conductive film, leaving a prescribed region, to form a stacked structure;

forming a first insulating film on said semiconductor substrate filling a space around said stacked structure;

removing a prescribed region of said stacked structure and forming first and second openings and a first electrode;

forming second and third electrodes having sidewall insulating films in said first and second openings;

positioning upper surface of any of said first to third electrodes at a position different from upper surfaces of the remaining electrodes; and forming an interconnection layer connected to an upper surface of any of said first to third electrodes.

8. The method of manufacturing a semiconductor device according to claim 7, further comprising the steps of:

forming a second insulating film below said first electrode; and forming impurity diffusion layers of a prescribed conductivity type in said semiconductor substrate below said second and third electrodes.

* * * * *